(12) United States Patent
Do et al.

(10) Patent No.: US 10,541,243 B2
(45) Date of Patent: Jan. 21, 2020

(54) SEMICONDUCTOR DEVICE INCLUDING A GATE ELECTRODE AND A CONDUCTIVE STRUCTURE

(71) Applicant: SAMSUNG ELECTRONICS CO., LTD., Suwon-si, Gyeonggi-Do (KR)

(72) Inventors: Jung-Ho Do, Yongin-si (KR); Seungyoung Lee, Seoul (KR); Jonghoon Jung, Seongnam-si (KR); Jinyoung Lim, Seoul (KR); Giyoung Yang, Seoul (KR); Sanghoon Baek, Seoul (KR); Taejoong Song, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 244 days.

(21) Appl. No.: 15/355,159

(22) Filed: Nov. 18, 2016

(65) Prior Publication Data
US 2017/0148727 A1    May 25, 2017

(30) Foreign Application Priority Data

| Nov. 19, 2015 | (KR) | 10-2015-0162668 |
| Nov. 19, 2015 | (KR) | 10-2015-0162675 |
| Apr. 20, 2016 | (KR) | 10-2016-0048379 |
| Jul. 8, 2016 | (KR) | 10-2016-0086996 |

(51) Int. Cl.
*H01L 27/11* (2006.01)
*H01L 23/522* (2006.01)
*H01L 23/485* (2006.01)

(52) U.S. Cl.
CPC ...... *H01L 27/1104* (2013.01); *H01L 23/5226* (2013.01); *H01L 23/485* (2013.01)

(58) Field of Classification Search
CPC .............. H01L 23/528; H01L 23/5226; H01L 23/53209; H01L 27/1104; H01L 27/11; H01L 21/76807; H01L 21/7605; H01L 21/76897; H01L 29/66515; H01L 29/665;
(Continued)

(56) References Cited

U.S. PATENT DOCUMENTS

| 6,168,985 | B1 * | 1/2001 | Asano ............... H01L 27/10814 257/E21.646 |
| 6,594,813 | B1 * | 7/2003 | Gandhi ............. H01L 21/76895 257/E21.59 |
| 7,287,237 | B2 | 10/2007 | Morton |

(Continued)

FOREIGN PATENT DOCUMENTS

| JP | 2008532132 | 8/2008 |
| KR | 1020140114424 | 9/2014 |
| KR | 1020150016564 | 2/2015 |

*Primary Examiner* — Mohsen Ahmadi
*Assistant Examiner* — Scott E Bauman
(74) *Attorney, Agent, or Firm* — F. Chau & Associates, LLC

(57) ABSTRACT

A semiconductor device including: a conductor disposed on a substrate; a first contact disposed on the conductor; a second contact having a first portion disposed on the first contact and a second portion protruded away from the first portion in a direction parallel to the substrate, wherein the first and second contacts are disposed in an insulating layer; a via disposed on the insulating layer and the second portion of the second contact; and a metal line disposed on the via.

15 Claims, 56 Drawing Sheets

(58) Field of Classification Search
CPC .. H01L 21/76895; H01L 23/485; H01L 28/00
See application file for complete search history.

(56) References Cited

U.S. PATENT DOCUMENTS

| | | | |
|---|---|---|---|
| 7,800,136 | B2 | 9/2010 | Shiga |
| 7,816,717 | B2 | 10/2010 | Ozaki |
| 8,324,607 | B2 | 12/2012 | Rolbiecki et al. |
| 8,541,880 | B2 | 9/2013 | Penzes |
| 8,667,443 | B2 | 3/2014 | Smayling et al. |
| 8,759,914 | B1 | 6/2014 | Rawat et al. |
| 8,863,063 | B2 | 10/2014 | Becker et al. |
| 8,987,816 | B2 | 3/2015 | Stephens et al. |
| 9,035,679 | B2 | 5/2015 | Yuan et al. |
| 9,070,552 | B1 | 6/2015 | Shah et al. |
| 9,105,466 | B2 | 8/2015 | Lu et al. |
| 9,202,751 | B2 | 12/2015 | Wei et al. |
| 2001/0038147 | A1* | 11/2001 | Higashi ............. H01L 21/288 257/750 |
| 2003/0190805 | A1* | 10/2003 | Inoue ............. H01L 21/31051 438/689 |
| 2006/0226485 | A1* | 10/2006 | Arakawa ............. H01L 27/0251 257/347 |
| 2007/0007617 | A1* | 1/2007 | Nakamura ............. H01L 27/11 257/503 |
| 2012/0032281 | A1* | 2/2012 | Haneda ............. H01L 21/28088 257/411 |
| 2012/0098073 | A1* | 4/2012 | Yu ............. H01L 21/76802 257/413 |
| 2013/0161722 | A1* | 6/2013 | Son ............. H01L 29/78 257/321 |
| 2014/0332871 | A1* | 11/2014 | Kim ............. H01L 23/5256 257/296 |
| 2015/0008524 | A1 | 1/2015 | Hung et al. |
| 2015/0137307 | A1 | 5/2015 | Stuber |
| 2015/0249081 | A1 | 9/2015 | Chun |
| 2015/0333008 | A1 | 11/2015 | Gupta et al. |
| 2016/0133626 | A1 | 5/2016 | Smayling et al. |
| 2016/0141291 | A1* | 5/2016 | Woo ............. H01L 27/1104 257/401 |

* cited by examiner

FIG. 20A
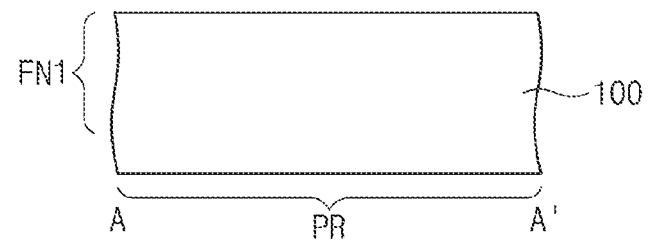
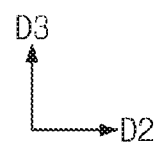
FIG. 20B
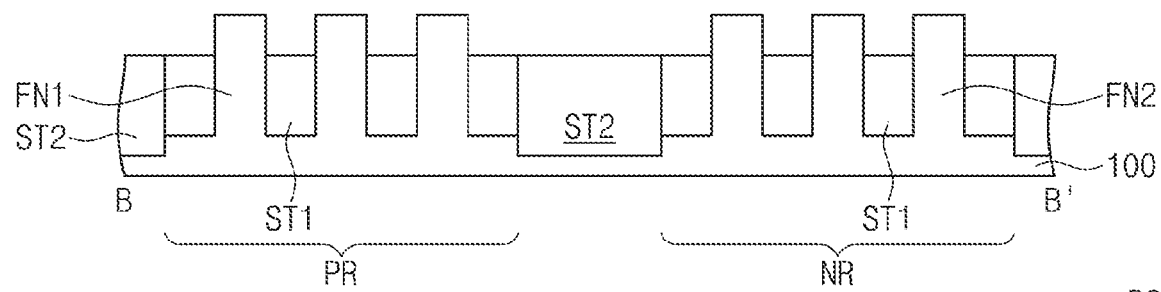
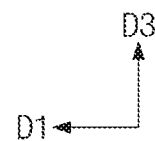

SEMICONDUCTOR DEVICE INCLUDING A GATE ELECTRODE AND A CONDUCTIVE STRUCTURE

CROSS-REFERENCE TO RELATED APPLICATIONS

This U.S. non-provisional patent application claims priority under 35 U.S.C. § 119 to Korean Patent Application Nos. 10-2015-0162668, 10-2015-0162675, 10-2016-0048379 and 10-2016-0086996, filed on Nov. 19, 2015, Nov. 19, 2015, Apr. 20, 2016 and Jul. 8, 2016, respectively, in the Korean Intellectual Property Office, the disclosures of which are incorporated by reference herein in their entireties.

TECHNICAL FIELD

The present inventive concept relates to semiconductor devices and methods of fabricating the same, and more particularly, to semiconductor devices including field effect transistors and methods of fabricating the same.

Discussion of Related Art

Due to their small-sizes, multifunctional, and/or low-cost characteristics, semiconductor devices are ubiquitous in the electronic industry. Semiconductor devices may be a memory device for storing data, a logic device for processing data, or a hybrid device including both of memory and logic elements. To meet increased demand for electronic devices with fast speed and/or low power consumption, semiconductor devices with high reliability, high performance, and/or multiple functions are desired. To satisfy these technical requirements, the complexity and/or integration density of semiconductor devices are being increased.

SUMMARY

According to an exemplary embodiment of the present inventive concept, there is provided a semiconductor device including: a conductor disposed on a substrate; a first contact disposed on the conductor; a second contact having a first portion disposed on the first contact and a second portion protruded away from the first portion in a direction parallel to the substrate, wherein the first and second contacts are disposed in an insulating layer; a via disposed on the insulating layer and the second portion of the second contact; and a metal line disposed on the via.

According to an exemplary embodiment of the present inventive concept, there is provided a semiconductor device including: a dummy conductor disposed on a substrate; a first contact disposed on the dummy conductor; a trench silicide disposed on the substrate and spaced apart from the dummy conductor; a second contact disposed on the trench silicide; and a third contact directly disposed on the first and second contacts and connecting the first and second contacts to each other.

According to an exemplary embodiment of the present inventive concept, there is provided a semiconductor device including: a first conductor disposed on a substrate; a first contact disposed on the first conductor; a second contact disposed on the substrate and spaced apart from the first conductor and the first contact; and a third contact directly disposed on the first and second contacts and connecting the first and second contacts to each other.

According to an exemplary embodiment of the present inventive concept, there is provided a semiconductor device including: a first trench silicide disposed on a substrate; a first contact disposed on an upper surface of the first trench silicide, wherein the upper surface of the first trench silicide is wider than a lower surface of the first contact; a second trench silicide disposed on the substrate; a second contact disposed on the second trench silicide; and a third contact directly disposed on the first and second contacts and connecting the first and second contacts to each other.

According to an exemplary embodiment of the present inventive concept, there is provided a semiconductor device including: a first contact disposed on a substrate and extending lengthwise in a first direction; a second contact disposed on the substrate and extending lengthwise in the first direction; a conductor disposed between the first and second contacts and extending lengthwise in the first direction; and a third contact disposed on the first and second contacts and extending lengthwise in a second direction crossing the first direction, wherein a first portion of the third contact protrudes beyond an edge of the first contact such that the first contact is disposed between the first portion and the conductor in the second direction.

According to an exemplary embodiment of the present inventive concept, there is provided a semiconductor device including: a first conductor disposed on a substrate; a first contact disposed on the first conductor; a second conductor disposed on the substrate and spaced apart from the first conductor; a second contact disposed on the second conductor; and a third contact directly disposed on the first and second contacts and connecting the first and second contacts to each other.

BRIEF DESCRIPTION OF THE DRAWINGS

FIGS. 20A, 22A, 24A, 26A, 28A, 30A, and 32A are sectional views taken along lines A-A' of FIGS. 19, 21, 23, 25, 27, 29, and 31, respectively, according to exemplary embodiments of the preset inventive concept.

FIGS. 20B, 22B, 24B, 26B, 28B, 30B, and 32B are sectional views taken along lines B-B' of FIGS. 19, 21, 23, 25, 27, 29, and 31, respectively, according to exemplary embodiments of the preset inventive concept.

DETAILED DESCRIPTION OF THE EMBODIMENTS

Figure 1:
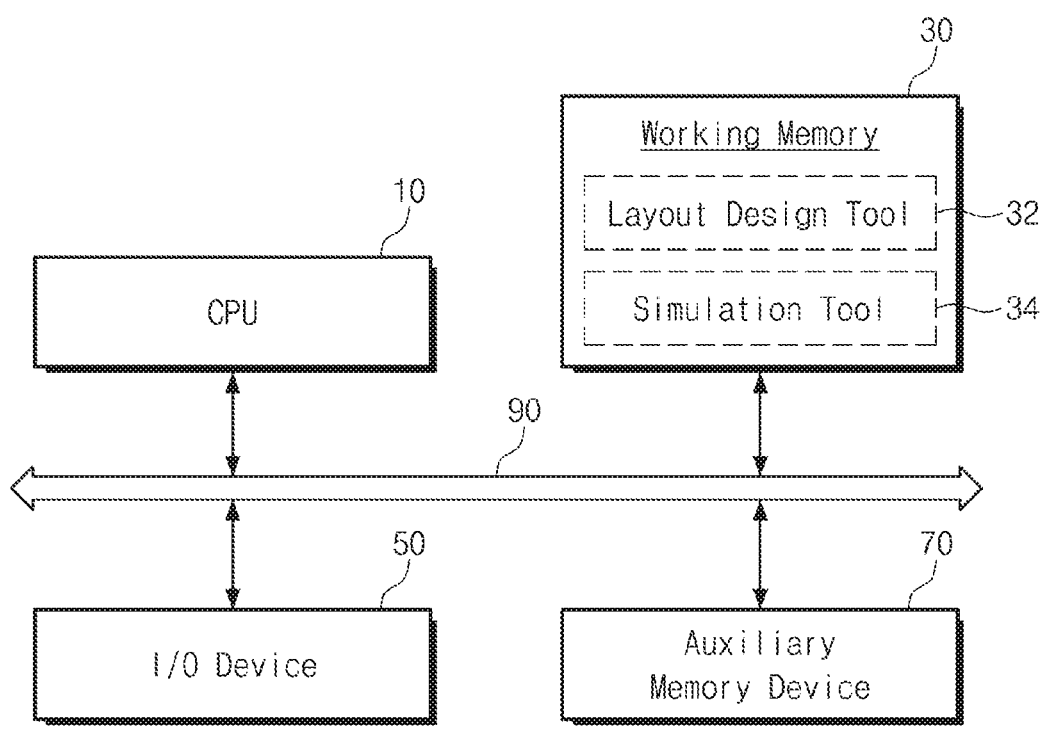
FIG. 1 is a block diagram illustrating a computer system for performing a semiconductor design process, according to exemplary embodiments of the present inventive concept.

FIG. 1 is a block diagram illustrating a computer system for performing a semiconductor design process, according to exemplary embodiments of the present inventive concept. Referring to FIG. 1, a computer system may include a central processing unit (CPU) 10, a working memory 30, an input-output device 50, and an auxiliary memory device 70. In exemplary embodiments of the present inventive concept, the computer system may be a customized system for performing a layout design process according to exemplary embodiments of the present inventive concept. Furthermore, the computer system may include a computing system configured to execute various design and check simulation programs.

The CPU 10 may be configured to run a variety of software, such as application programs, operating systems, and device drivers. For example, the CPU 10 may be configured to run an operating system loaded on the working memory 30. Furthermore, the CPU 10 may be configured to run various application programs on the operating system. For example, the CPU 10 may be configured to run a layout design tool 32 loaded on the working memory 30.

The operating system or application programs may be loaded on the working memory 30. For example, when the computer system starts a booting operation, an operating system (OS) image stored in the auxiliary memory device 70 may be loaded on the working memory 30 according to a booting sequence. In the computer system, input/output operations may be managed by the operating system. Certain application programs, which may be selected by a user or be provided for basic services, may be loaded on the working memory 30. According to exemplary embodiments of the present inventive concept, the layout design tool 32 prepared for a layout design process may be loaded on the working memory 30, from the auxiliary memory device 70.

The layout design tool 32 may provide a function for changing biasing data for specific layout patterns. For example, the layout design tool 32 may be configured to allow the specific layout patterns to have shapes and positions different from those defined by a design rule. The layout design tool 32 may be configured to perform a design rule check (DRC) under the changed condition of the biasing data. The working memory 30 may be a volatile memory device (e.g., a static random access memory (SRAM) or dynamic random access memory (DRAM) device) or a nonvolatile memory device (e.g., a phase change random access memory (PRAM), magnetoresistive random access memory (MRAM), resistive random access memory (ReRAM), ferroelectric (FRAM), or NOR FLASH memory device).

In addition, a simulation tool 34 may be loaded on the working memory 30 to perform an optical proximity correction (OPC) operation on the designed layout data.

The input-output device 50 may be configured to control user input and output operations of user interface devices. For example, the input-output device 50 may include a keyboard or a monitor, allowing a designer to input relevant information. By using the input-output device 50, the designer may receive information on several regions or data paths, to which adjusted operating characteristics can be applied, of a semiconductor device. The input-output device 50 may be configured to display a progress status or a process result of the simulation tool 34.

The auxiliary memory device 70 may be a storage medium for the computer system. The auxiliary memory device 70 may be configured to store application programs, an OS image, and various data. The auxiliary memory device 70 may be provided in the form of memory cards (e.g., a multimedia card (MMC), an embedded multimedia card (eMMC), secure digital (SD), MicroSD, and so forth) or a hard disk drive (HDD). The auxiliary memory device 70 may include a NAND FLASH memory device with a large memory capacity. The auxiliary memory device 70 may include nonvolatile memory devices (e.g., PRAM, MRAM, ReRAM, or FRAM) or NOR FLASH memory devices.

A system interconnector 90 may serve as a system bus for realizing a network in the computer system. The CPU 10, the working memory 30, the input-output device 50, and the auxiliary memory device 70 may be electrically connected to each other through the system interconnector 90, and thus, data may be exchanged therebetween. However, the system interconnector 90 may not be limited to the afore-described configuration. For example, the system interconnector 90 may include an additional element for increasing efficiency in data communication.

Figure 2:
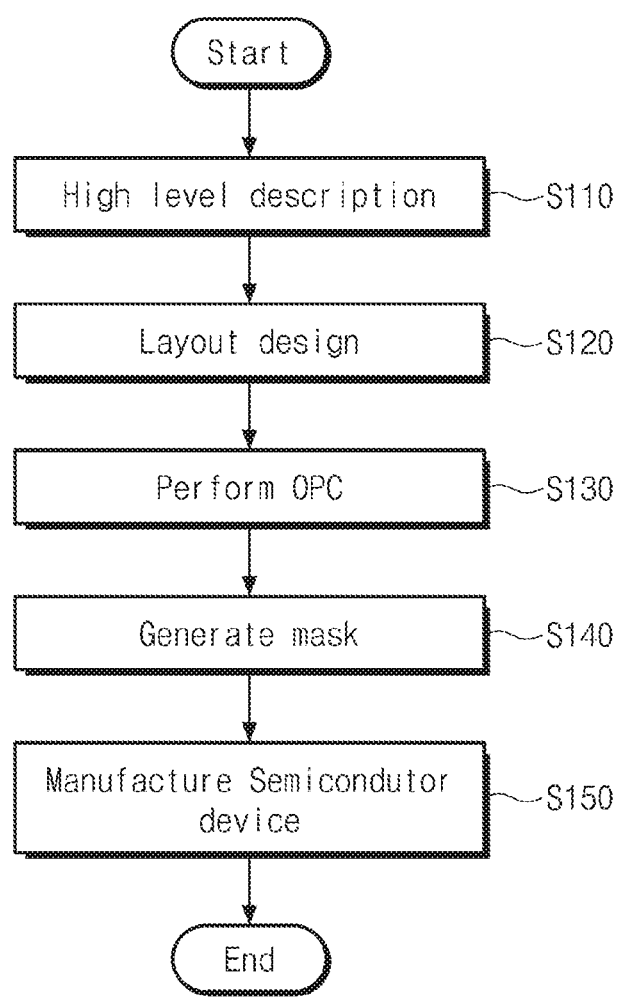
FIG. 2 is a flow chart illustrating a method of designing and fabricating a semiconductor device, according to exemplary embodiments of the present inventive concept.

FIG. 2 is a flow chart illustrating a method of designing and fabricating a semiconductor device, according to exemplary embodiments of the present inventive concept.

Referring to FIG. 2, a high-level design process for a semiconductor integrated circuit may be performed using the computer system described with reference to FIG. 1 (in S110). For example, in the high-level design process, an integrated circuit to be designed may be described in terms of a high-level computer language (e.g., C language). Circuits designed by the high-level design process may be more concretely described by a register transfer level (RTL) coding or a simulation. Furthermore, codes generated by the RTL coding may be converted into a netlist, and the results may be combined with each other to wholly describe a semiconductor device. The combined schematic circuit may be verified by a simulation tool. In exemplary embodiments of the present inventive concept, an adjusting step may be further performed, in consideration of a result of the verification step.

A layout design process may be performed to realize a logically complete form of the semiconductor integrated circuit on a silicon wafer (in S120). For example, the layout design process may be performed, based on the schematic circuit prepared in the high-level design process or the corresponding netlist. The layout design process may include a routing step of placing and connecting various standard cells that are provided from a cell library, based on a predetermined design rule. A diffusion prevention pattern may be introduced at a boundary of at least one of the standard cells and may be configured to have technical features suitable for electric characteristics of the corresponding standard cell. Such a redesigned standard cell may be provided in the cell library.

The cell library may contain information on operation, speed, and power consumption of a plurality of cells. In exemplary embodiments of the present inventive concept, a cell library for representing a layout of a circuit in a gate level may be defined in or by the layout design tool. Here, the layout may be prepared to define or describe shapes, positions, or dimensions of patterns constituting transistors and metal interconnection lines, which will be actually formed on a silicon wafer. For example, to actually form an inverter circuit on a silicon wafer, it may be necessary to prepare or draw a layout for patterns (e.g., p-channel metal oxide semiconductor (PMOS), n-channel metal oxide semiconductor (NMOS), N-WELL, gate electrodes, and metal interconnection lines thereon). For this reason, at least one of the inverters defined in the cell library may be selected.

A routing step of connecting the selected cells to each other may also be performed. For example, the routing step may be performed on the selected and disposed standard cells to connect them to upper interconnection lines. These steps may be automatically or manually performed in the layout design tool. In exemplary embodiments of the present inventive concept, a step of placing the standard cells and establishing routing structures thereto may be automatically performed by a Place & Routing tool.

After the routing step, a verification step may be performed on the layout to check whether there is a portion violating the design rule. In exemplary embodiments of the present inventive concept, the verification step may include evaluating verification items, such as a design rule check (DRC), an electrical rule check (ERC), and a layout vs. schematic (LVS). The evaluating of the DRC item may be performed to evaluate whether the layout meets the design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step may be performed (in S130). The OPC step may be performed to correct optical proximity effects, which may occur when a photolithography process is performed on a silicon wafer using a photomask manufactured based on the layout. The optical proximity effect may be an unintended optical effect (such as refraction or diffraction) which may occur in the exposing process using the photomask manufactured based on the layout. In the OPC step, the layout may be modified to have a reduced difference in shape between designed patterns and actually-formed patterns, which may be caused by the optical proximity effects. As a result of the optical proximity correction step, the designed shapes and positions of the layout patterns may be slightly changed.

A photomask may be manufactured, based on the layout modified by the OPC step (in S140). For example, the photomask may be manufactured by patterning a chromium layer provided on a glass substrate, using the layout pattern data.

The photomask manufactured may be used to manufacture a semiconductor device (in S150). In the actual fabricating process, the exposing and etching steps may be repeatedly performed, and thus, patterns defined in the layout design process may be sequentially formed on a semiconductor substrate.

Figure 3:
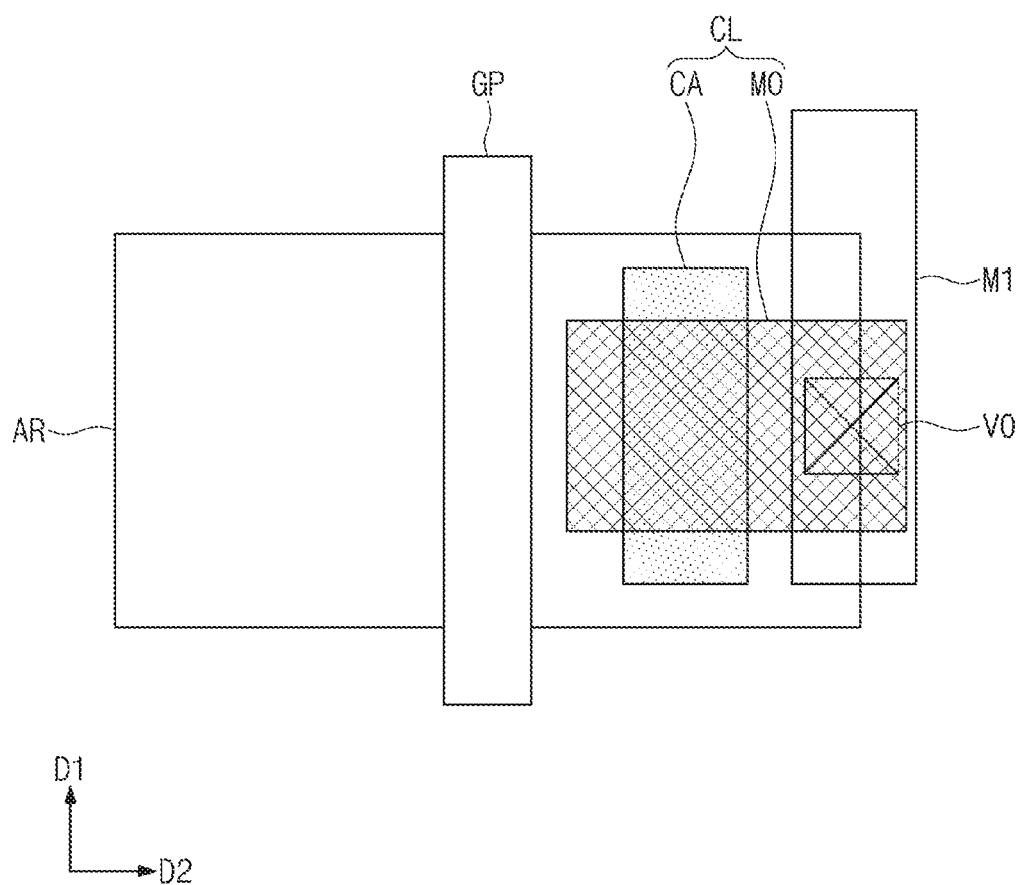
FIG. 3 is a layout diagram illustrating a portion of a standard cell layout according to exemplary embodiments of the present inventive concept.

FIG. 3 is a layout diagram illustrating a portion of a standard cell layout according to exemplary embodiments of the present inventive concept.

Referring to FIG. 3, a standard cell layout may include a layout for an active region AR (hereinafter, also referred to as an active region AR), a layout for a gate electrode GE (hereinafter, also referred to as a gate pattern GP), a layout for a conductive structure CP (hereinafter, also referred to as a conductive pattern CL), a layout for a via (hereinafter, also referred to as via pattern V0), and a layout for an interconnection line ML (hereinafter, also referred to as a conductive line M1).

The active region AR may be a PMOSFET region or an NMOSFET region. The gate pattern GP may cross the active region AR and extend in a first direction D1. A portion of the active region AR, which is not overlapped with the gate pattern GP, may serve as a source/drain region SD.

The conductive pattern CL may include a connection pattern M0 and an active contact pattern CA. The active contact pattern CA may be disposed on the active region AR. The active contact pattern CA may be spaced apart from the gate pattern GP in a second direction D2 crossing the first direction D1. The connection pattern M0 and the active contact pattern CA may be partially overlapped with each other. The connection pattern M0 may extend in the second direction D2.

The via pattern V0 and the conductive line M1 may be disposed on the connection pattern M0. The via pattern V0 may be overlapped with the connection pattern M0 but may be spaced apart from the active contact pattern CA in the second direction D2. The conductive line M1 may be overlapped with the via pattern V0 and may extend in the first direction D1.

Figure 4:
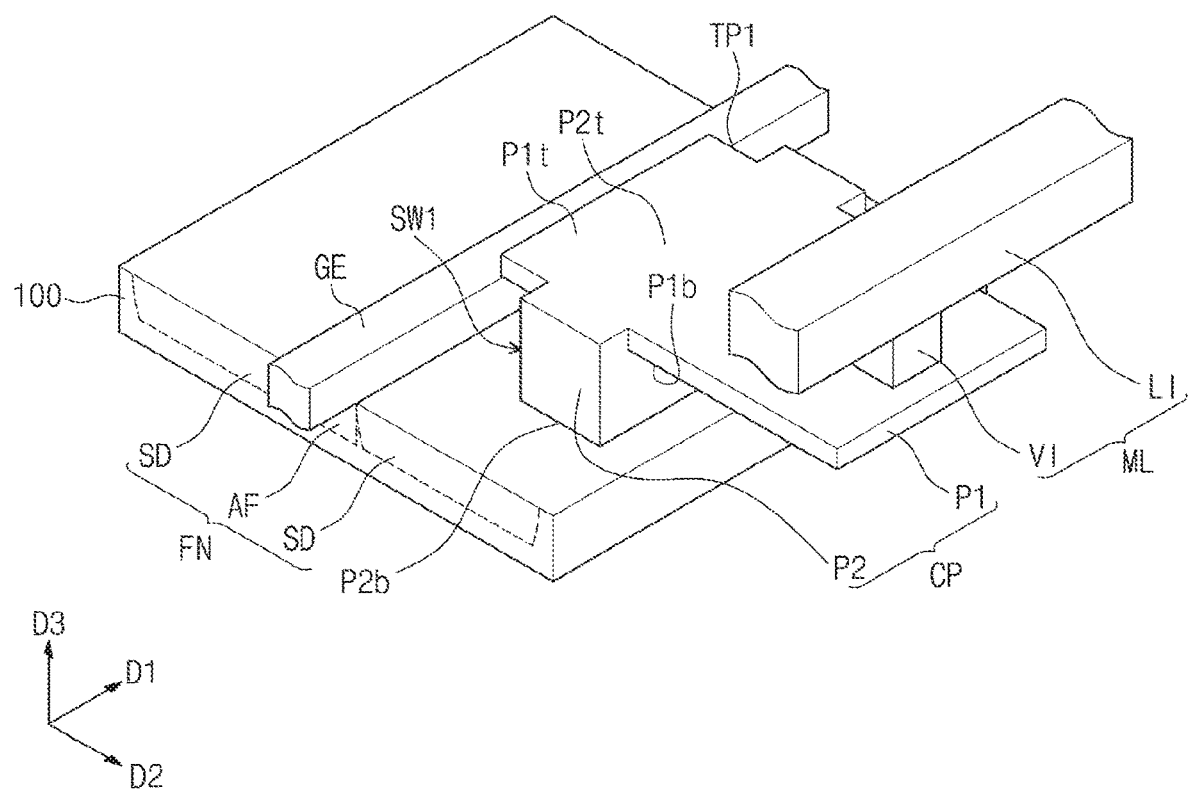
FIG. 4 is a perspective view illustrating a semiconductor device that is formed based on the layout of FIG. 3 according to exemplary embodiments of the preset inventive concept.

FIG. 4 is a perspective view illustrating a semiconductor device according to exemplary embodiments of the present inventive concept. For example, FIG. 4 is a perspective view illustrating a semiconductor device that is formed based on the layout of FIG. 3.

Referring to FIG. 4, a substrate 100 with an active pattern FN may be provided. The active pattern FN may be formed in accordance with the active region AR described with reference to FIG. 3. The active pattern FN may include a pair of source/drain regions SD and a channel region AF between the source/drain regions SD.

A gate electrode GE may be disposed on the channel region AF to cross the active pattern FN. The gate electrode GE may extend in a first direction D1 parallel to a top surface of the substrate 100. The gate electrode GE may be a pattern that is formed in accordance with the gate pattern GP described with reference to FIG. 3. A gate insulating pattern may be interposed between the channel region AF and the gate electrode GE. The gate electrode GE may include doped semiconductor materials, conductive metal nitrides (e.g., titanium nitride or tantalum nitride), or metals (e.g., aluminum or tungsten).

A conductive structure CP may be provided on at least one of the source/drain regions SD. The conductive structure CP may include a first portion P1 and a second portion P2. The conductive structure CP may be a pattern that is formed in accordance with the conductive pattern CL previously described with reference to FIG. 3. For example, the first portion P1 may be a pattern that is formed in accordance with the connection pattern M0 described with reference to FIG. 3, and the second portion P2 may be a pattern that is formed in accordance with the active contact pattern CA previously described with reference to FIG. 3.

The second portion P2 may be electrically connected to the source/drain region SD. For example, the second portion P2 may serve as a contact plug that is in direct contact with the source/drain region SD. The second portion P2 may be spaced apart from the gate electrode GE in a second direction D2 crossing the first direction D1. The second portion P2 may extend in the first direction D1.

The first portion P1 may extend from the second portion P2 in the second direction D2. Furthermore, the first portion P1 may include a first end portion TP1 protruding from at least one sidewall (e.g., a first sidewall SW1) of the second portion P2. The first sidewall SW1 may be a sidewall that extends in the first direction D1 and faces the gate electrode GE. In other words, the first portion P1 may have a shape passing through a top portion of the second portion P2.

A top surface P1t of the first portion P1 may be substantially coplanar with a top surface P2t of the second portion P2. A bottom surface P1b of the first portion P1 may be positioned at a level higher than that of a bottom surface P2b of the second portion P2. In other words, the bottom surface P1b of the first portion is higher than the bottom surface P2b of the second portion P2 with respect to an upper surface of the substrate 100. In addition, the bottom surface P1b of the first portion P1 may be positioned at a level higher than that of the top surface of the gate electrode GE.

The first portion P1 and the second portion P2 may be connected to each other to constitute the conductive structure CP, which is provided in the form of a single body. The conductive structure CP may include conductive metal nitrides (e.g., titanium nitride or tantalum nitride) or metals (e.g., aluminum or tungsten).

An interconnection line ML may be provided on the conductive structure CP. The interconnection line ML may include a line portion LI extending in the first direction D1 and a contact portion VI vertically connecting the line portion LI to the conductive structure CP. The line portion LI may be a pattern that is formed in accordance with the conductive line M1 previously described with reference to FIG. 3, and the contact portion VI may be a pattern that is formed in accordance with the via pattern V0 previously described with reference to FIG. 3. The interconnection line ML may include conductive metal nitrides (e.g., titanium nitride or tantalum nitride) or metals (e.g., aluminum or tungsten).

When viewed in a plan view, the line portion LI may be spaced apart from the second portion P2 in the second direction D2. However, the line portion LI may be electrically connected to the second portion P2 through the contact portion VI and the first portion P1. In other words, the line portion LI may be electrically connected to the source/drain region SD. As a result, when the line portion LI is horizontally spaced apart from the second portion P2, the line portion LI and the second portion P2 may be electrically connected to each other through the first portion P1. This may allow electrical signals to be input to or output from the source/drain region SD through the interconnection line ML.

Referring back to FIG. 3, the connection pattern M0 of the conductive pattern CL may be used to increase a degree of freedom in placing the conductive line M1 in a layout design process. As a result, the routing step described with reference to FIG. 2 can be easily performed on a standard cell layout.

Figure 5:
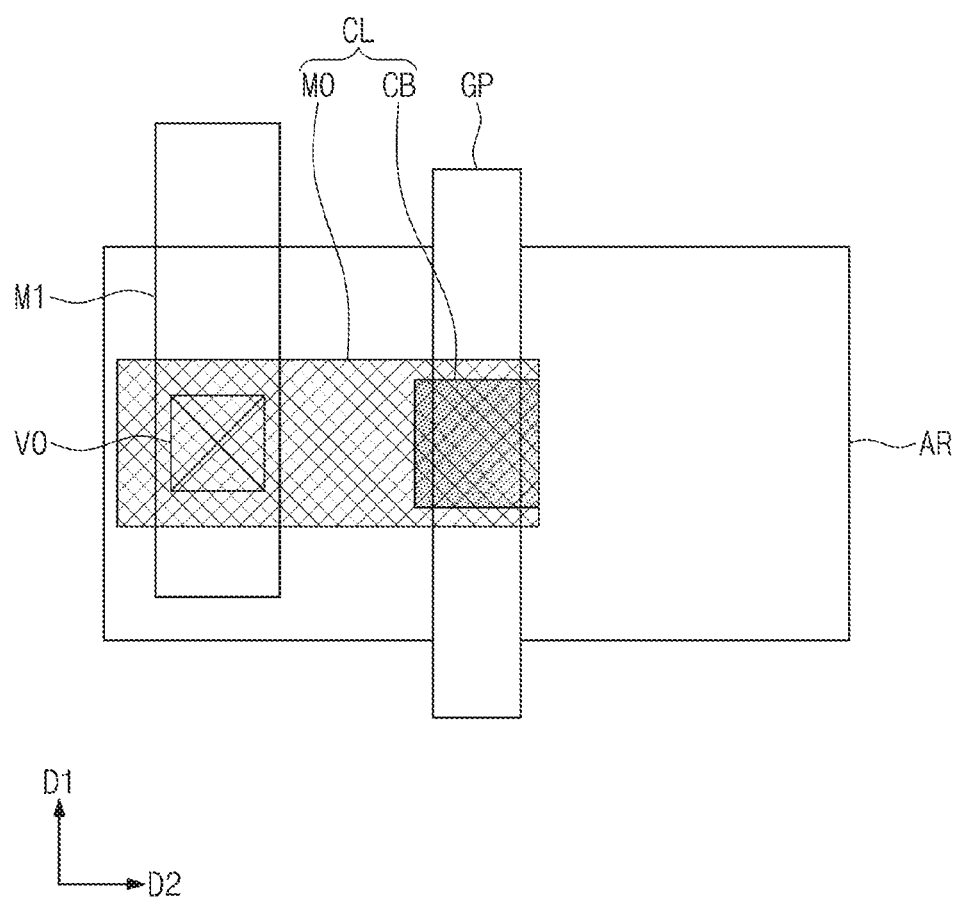
FIG. 5 is a layout diagram illustrating a portion of a standard cell layout according to exemplary embodiments of the present inventive concept.

FIG. 5 is a layout diagram illustrating a portion of a standard cell layout according to exemplary embodiments of the present inventive concept. In the following description of the present embodiment, an element previously described with reference to FIG. 3 may not be described in much further detail for the sake of brevity.

Referring to FIG. 5, a standard cell layout may include an active region AR, a gate pattern GP, a conductive pattern CL, a via pattern V0, and a conductive line M1. The conductive pattern CL may include a connection pattern M0 and a gate contact pattern CB. The gate contact pattern CB may be disposed on the gate pattern GP. The gate contact pattern CB may be overlapped with the connection pattern M0. The connection pattern M0 may have a longitudinal axis that is parallel to a second direction D2.

The via pattern V0 and the conductive line M1 may be disposed on the connection pattern M0. The via pattern V0 may be overlapped with the connection pattern M0 but may be spaced apart from the gate contact pattern CB in the second direction D2. The conductive line M1 may be overlapped with the via pattern V0 and may extend in a first direction D1.

Figure 6:
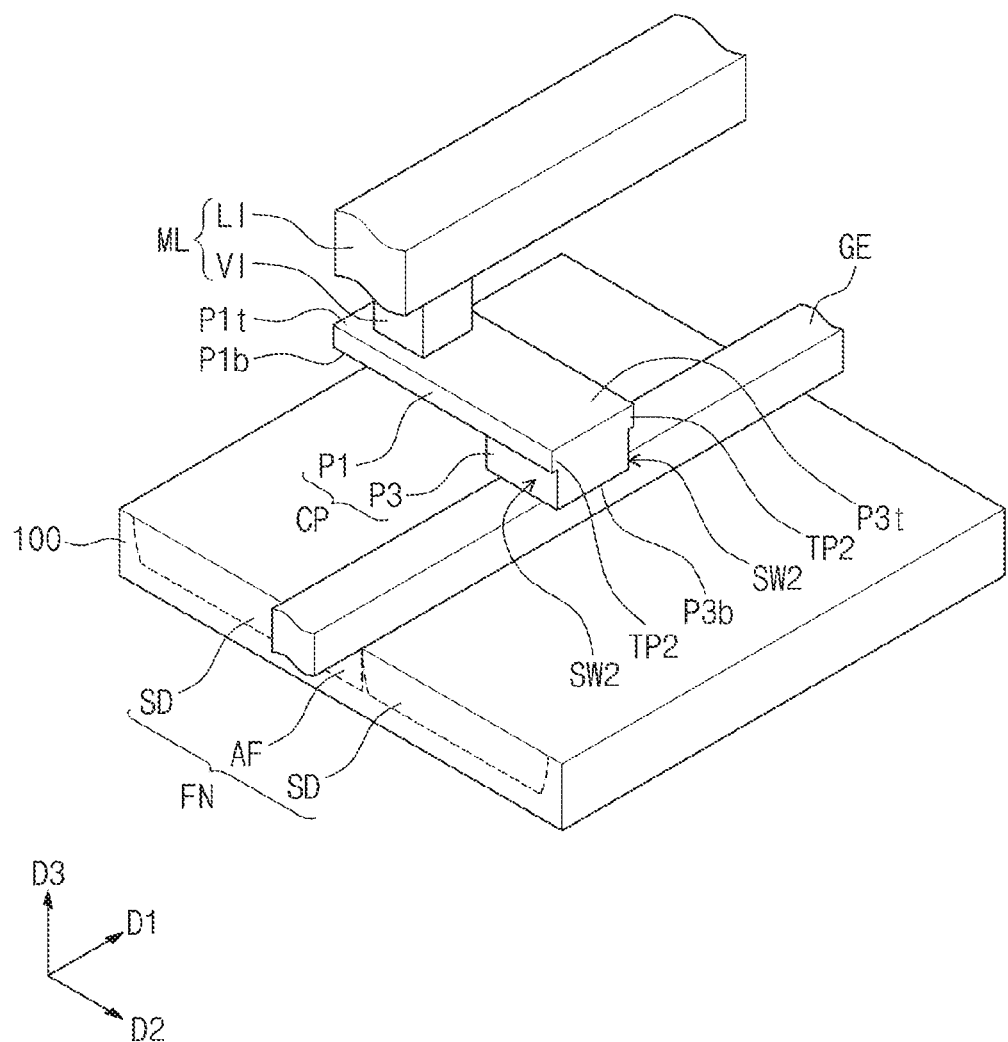
FIG. 6 is a perspective view illustrating a semiconductor device that is formed based on the layout of FIG. 5 according to exemplary embodiments of the preset inventive concept.

FIG. 6 is a perspective view illustrating a semiconductor device according to exemplary embodiments of the present inventive concept. For example, FIG. 6 is a perspective view illustrating a semiconductor device that is formed based on the layout of FIG. 5. In the following description of the present embodiment, an element previously described with reference to FIG. 4 may not be described in much further detail for the sake of brevity.

Referring to FIG. 6, a conductive structure CP may be disposed on a gate electrode GE. The conductive structure CP may include a first portion P1 and a third portion P3. The third portion P3, not the second portion P2, may be provided in the conductive structure CP, unlike the conductive structure CP previously described with reference to FIG. 4. The first portion P1 may be a pattern that is formed in accordance with the connection pattern M0 previously described with reference to FIG. 5, and the third portion P3 may be a pattern that is formed in accordance with the gate contact pattern CB previously described with reference to FIG. 5.

The third portion P3 may be electrically connected to the gate electrode GE. For example, the third portion P3 may serve as a contact plug that is in direct contact with the source/drain regions SD. The third portion P3 may be vertically spaced apart from the source/drain regions SD.

The first portion P1 may be extended from the third portion P3 in a direction opposite to the second direction D2. Furthermore, the first portion P1 may include second end portions TP2 protruding from both sidewalls (e.g., second sidewalls SW2) of the third portion P3. In other words, the first portion P1 may have a line width greater than that of the third portion P3.

A top surface P1*t* of the first portion P1 may be substantially coplanar with a top surface P3*t* of the third portion P3. A bottom surface P1*b* of the first portion P1 may be higher than a bottom surface P3*b* of the third portion P3. For example, the bottom surface P1*b* of the first portion P1 is higher than the bottom surface P3*b* of the third portion P3 with respect to an upper surface of the substrate 100. Since the bottom surface P3*b* of the third portion P3 is positioned at substantially the same level as the top surface of the gate electrode GE, the bottom surface P1*b* of the first portion P1 may be higher than the top surface of the gate electrode GE.

An interconnection line ML may be provided on the conductive structure CP. When viewed in a plan view, a line portion LI of the interconnection line ML may be spaced apart from the third portion P3 in the second direction D2. However, the line portion LI may be electrically connected to the third portion P3 via a contact portion VI and the first portion P1. For example, the line portion LI may be electrically connected to the gate electrode GE. As a result, when the line portion LI is horizontally spaced apart from the third portion P3, the line portion LI and the third portion P3 may be electrically connected to each other through the first portion P1. This may allow electrical signals to be input or output to or from the gate electrode GE through the interconnection line ML.

Figure 7:
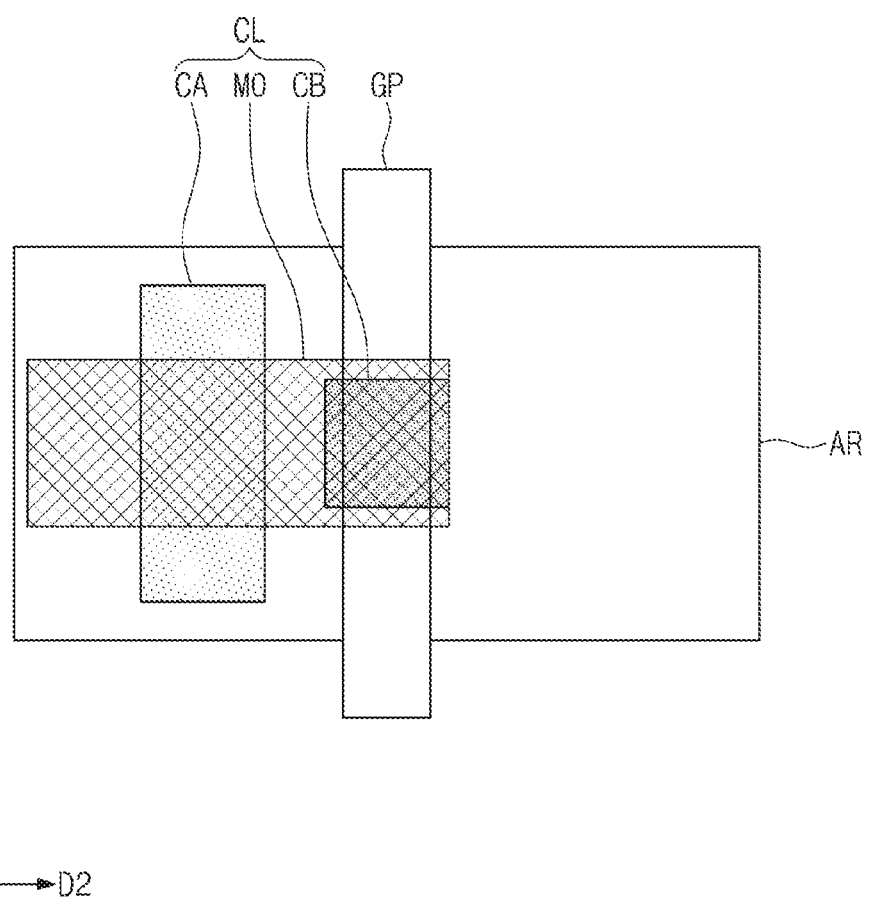
FIG. 7 is a layout diagram illustrating a portion of a standard cell layout according to exemplary embodiments of the present inventive concept.

FIG. 7 is a layout diagram illustrating a portion of a standard cell layout according to exemplary embodiments of the present inventive concept. In the following description of the present embodiment, an element previously described with reference to FIGS. 3 and 5 may not be described in much further detail for the sake of brevity.

Referring to FIG. 7, a standard cell layout may include an active region AR, a gate pattern GP, a conductive pattern CL, a via pattern V0, and a conductive line M1. The conductive pattern CL may include a connection pattern M0, an active contact pattern CA and a gate contact pattern CB.

The active contact pattern CA may be disposed on the active region AR, and the gate contact pattern CB may be disposed on the gate pattern GP. The active contact pattern CA and the connection pattern M0 may be partially overlapped with each other, and the gate contact pattern CB may be overlapped with the connection pattern M0.

To reduce complexity in the drawings and to provide better understanding of exemplary embodiments of the inventive concept, the via pattern V0 and the conductive line M1 are not shown in FIG. 7; however, they may be freely disposed on the connection pattern M0, as previously described with reference to FIGS. 3 and 5, for example.

Figure 8:
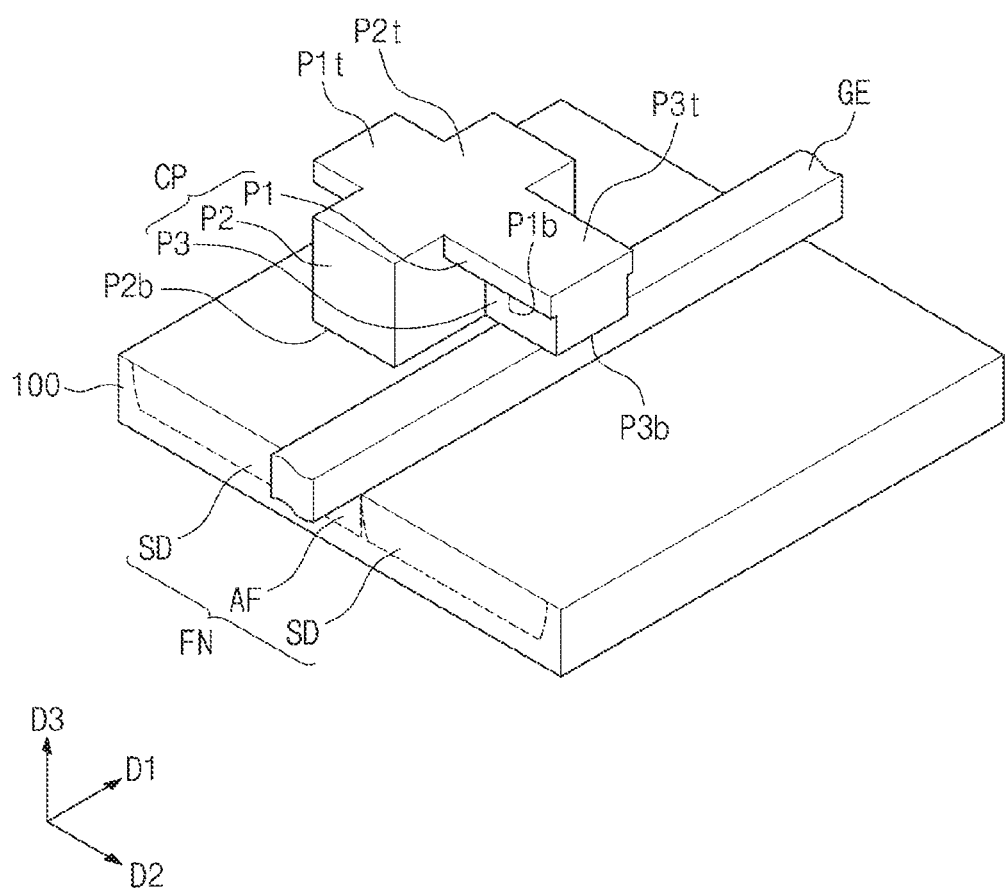
FIG. 8 is a perspective view illustrating a semiconductor device that is formed based on the layout of FIG. 7 according to exemplary embodiments of the preset inventive concept.

FIG. 8 is a perspective view illustrating a semiconductor device according to exemplar embodiments of the present inventive concept. For example, FIG. 8 is a perspective view illustrating a semiconductor device that is formed based on the layout of FIG. 7. In the following description of the present embodiment, an element previously described with reference to FIGS. 4 and 6 may not be described in much further detail for the sake of brevity.

Referring to FIG. 8, a conductive structure CP may be disposed on a substrate 100. The conductive structure CP may include a first portion P1, a second portion P2, and a third portion P3. The second portion P2 may be disposed on and electrically connected to the source/drain region SD, and the third portion P3 may be disposed on and electrically connected to the gate electrode GE. The first portion P1 may extend in a second direction D2 and may connect the second portion P2 and the third portion P3 to each other.

A top surface P1*t* of the first portion P1, a top surface P2*t* of the second portion P2, and a top surface P3*t* of the third portion P3 may be substantially coplanar with each other. A bottom surface P1*b* of the first portion P1, a bottom surface P2*b* of the second portion P2, and a bottom surface P3*b* of the third portion P3 may be positioned at different heights with respect to an upper surface of the substrate 100. For example, the bottom surface P1*b* of the first portion P1 may be higher than the bottom surface P3*b* of the third portion P3, and the bottom surface P3*b* of the third portion P3 may be higher than the bottom surface P2*b* of the second portion P2.

An interconnection line ML, as previously described with reference to FIGS. 3 and 5, may be provided on the conductive structure CP.

Figure 9:
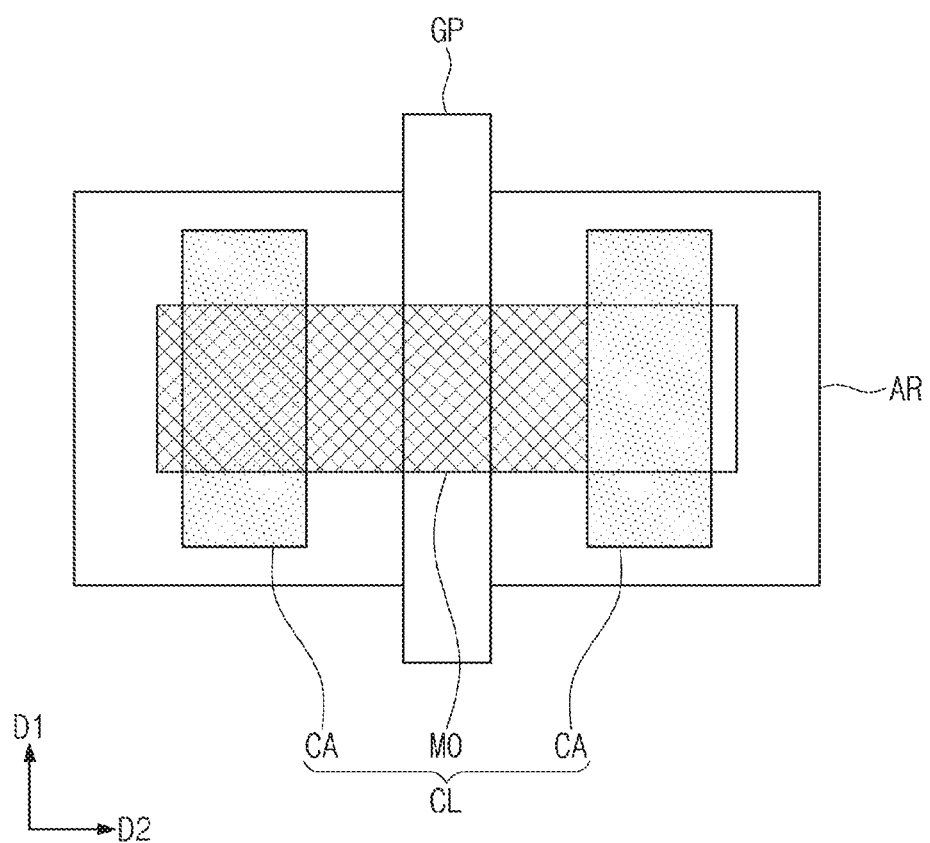
FIG. 9 is a layout diagram illustrating a portion of a standard cell layout according to exemplary embodiments of the present inventive concept.

FIG. 9 is a layout diagram illustrating a portion of a standard cell layout according to exemplary embodiments of the present inventive concept. In the following description of the present embodiment, an element previously described with reference to FIG. 3 may not be described in much further detail for the sake of brevity.

Referring to FIG. 9, a standard cell layout may include an active region AR, a gate pattern GP, a conductive pattern CL, a via pattern V0, and a conductive line M1. The conductive pattern CL may include a connection pattern M0 and a pair of active contact patterns CA.

The active contact patterns CA may be respectively disposed on opposite portions of the active region AR that are positioned at both sides of the gate pattern GP. Each of the active contact patterns CA may be overlapped with the connection pattern M0. The connection pattern M0 may cross the gate pattern GP and extend in a second direction D2.

To reduce complexity in the drawings and to provide better understanding of exemplary embodiments of the present inventive concept, the via pattern V0 and the conductive line M1 are not shown in FIG. 9; however, they may be freely disposed on the connection pattern M0, as previously described with reference to FIG. 3, for example.

Figure 10:
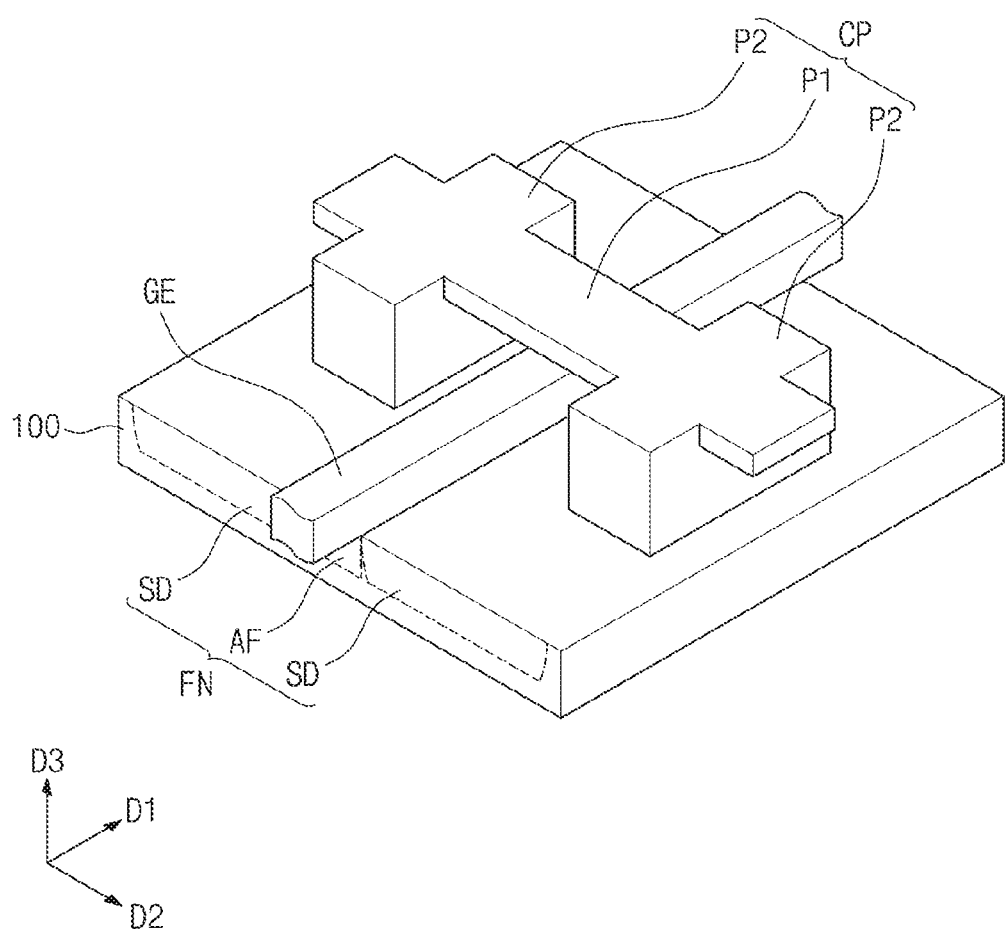
FIG. 10 is a perspective view illustrating a semiconductor device that is formed based on the layout of FIG. 9 according to exemplary embodiments of the preset inventive concept.

FIG. 10 is a perspective view illustrating a semiconductor device according to exemplary embodiments of the present inventive concept. For example, FIG. 10 is a perspective view illustrating a semiconductor device that is formed based on the layout of FIG. 9. In the following description of the present embodiment, an element previously described with reference to FIG. 4 may not be described in much further detail for the sake of brevity.

Referring to FIG. 10, a conductive structure CP may be disposed on a substrate 100. The conductive structure CP may include a first portion P1 and a pair of second portions P2. The second portions P2 may be disposed on and electrically connected to the source/drain regions SD, respectively, which are disposed at both sides of the gate electrode GE. Here, the first portion P1 may be formed to cross the gate electrode GE and extend in a second direction D2 and may be used to connect the second portions P2 to each other. In other words, the first portion P1 may connect the second portions P2, which are spaced apart from each other with the gate electrode GE interposed therebetween, to each other.

An interconnection line ML may be provided on the conductive structure CP, as previously described with reference to FIG. 3.

Figure 11:
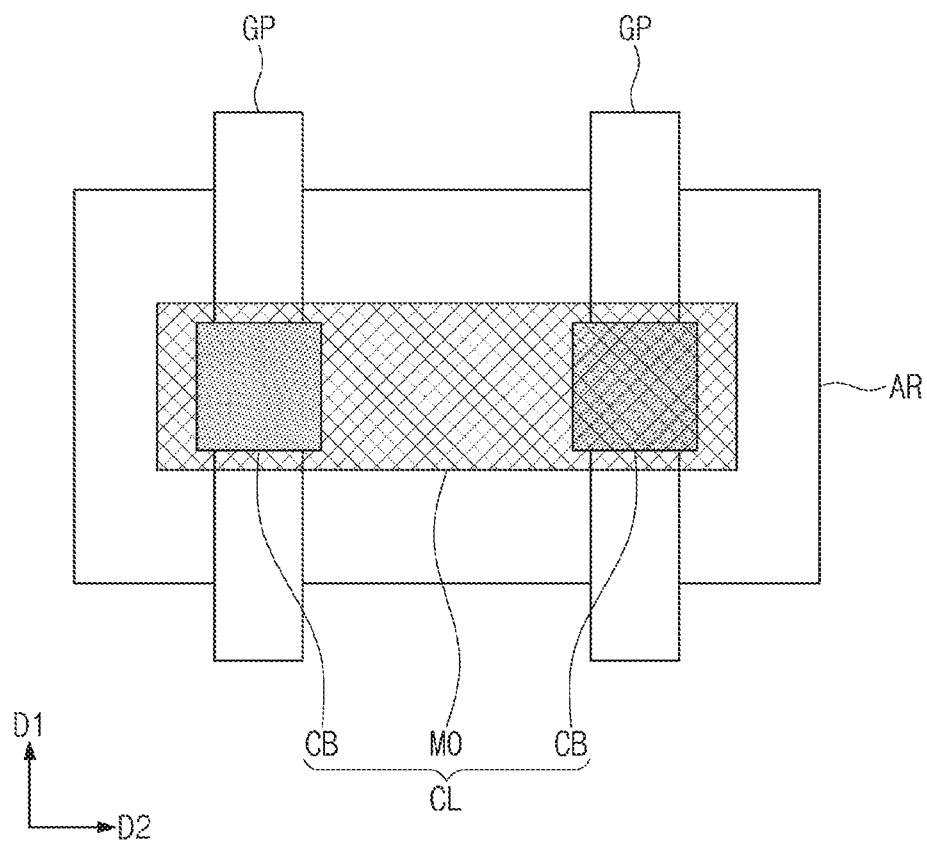
FIG. 11 is a layout diagram illustrating a portion of a standard cell layout according to exemplary embodiments of the present inventive concept.

FIG. 11 is a layout diagram illustrating a portion of a standard cell layout according to exemplary embodiments of the present inventive concept. In the following description of the present embodiment, an element previously described with reference to FIG. 5 may not be described in much further detail for the sake of brevity.

Referring to FIG. 11, a standard cell layout may include an active region AR, gate patterns GP, a conductive pattern CL, a via pattern V0, and a conductive line M1. The conductive pattern CL may include a connection pattern M0 and a pair of gate contact patterns CB.

The gate contact patterns CB may be disposed on the gate patterns GP, respectively. The gate contact patterns CB may be overlapped with the connection pattern M0. The connection pattern M0 may cross the gate patterns GP and extend in a second direction D2.

To reduce complexity in the drawings and to provide better understanding of exemplary embodiments of the present inventive concept, the via pattern V0 and the conductive line M1 are not shown in FIG. 11; however, they may be freely disposed on the connection pattern M0, as previously described with reference to FIG. 5, for example.

Figure 12:
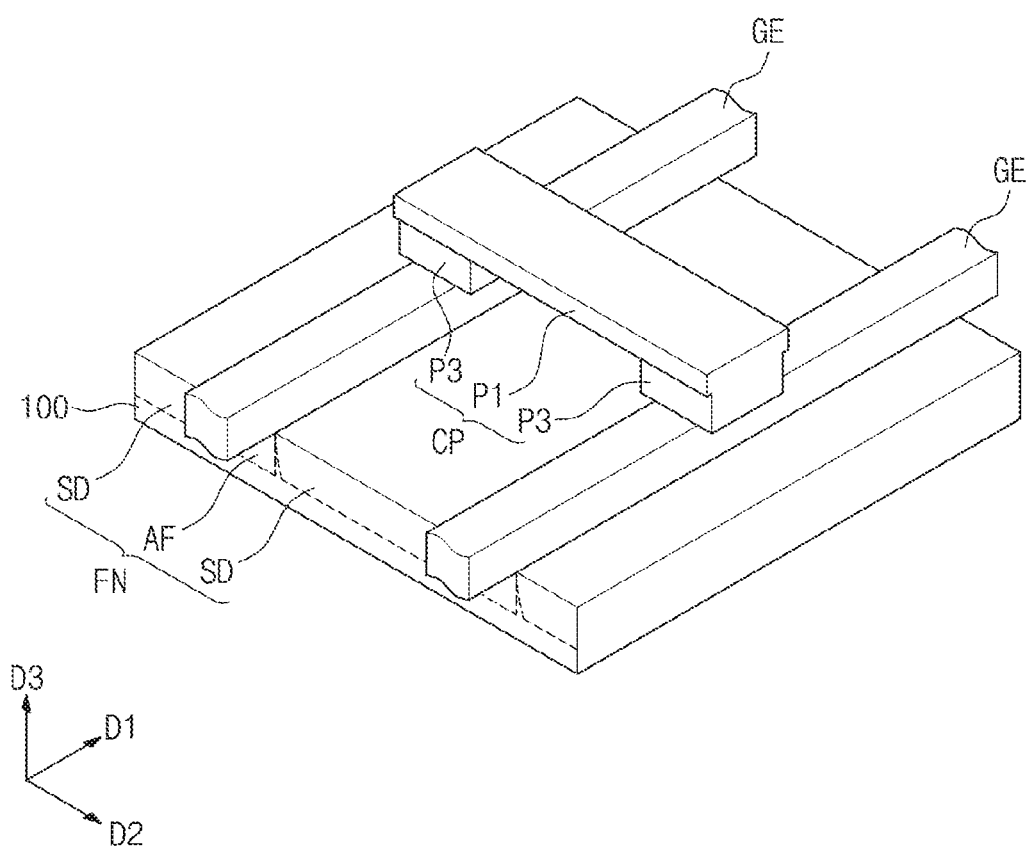
FIG. 12 is a perspective view illustrating a semiconductor device according to exemplary embodiments of the present inventive concept.

FIG. 12 is a perspective view illustrating a semiconductor device according to exemplary embodiments of the present inventive concept. For example, FIG. 12 is a perspective view illustrating a semiconductor device that is formed based on the layout of FIG. 11. In the following description of the present embodiment, an element previously described with reference to FIG. 6 may not be described in much further detail for the sake of brevity.

Referring to FIG. 12, a conductive structure CP may be disposed on gate electrodes GE that are formed on a substrate 100. The conductive structure CP may include a first portion P1 and a pair of third portions P3. The third portions P3 may be electrically connected to the gate electrodes GE, respectively. Here, the first portion P1 may extend in a second direction D2 to cross the gate electrodes GE, and the third portions P3 may be connected to each other by the first portion P1.

An interconnection line ML may be provided on the conductive structure CP, as previously described with reference to FIG. 3.

Figure 13:
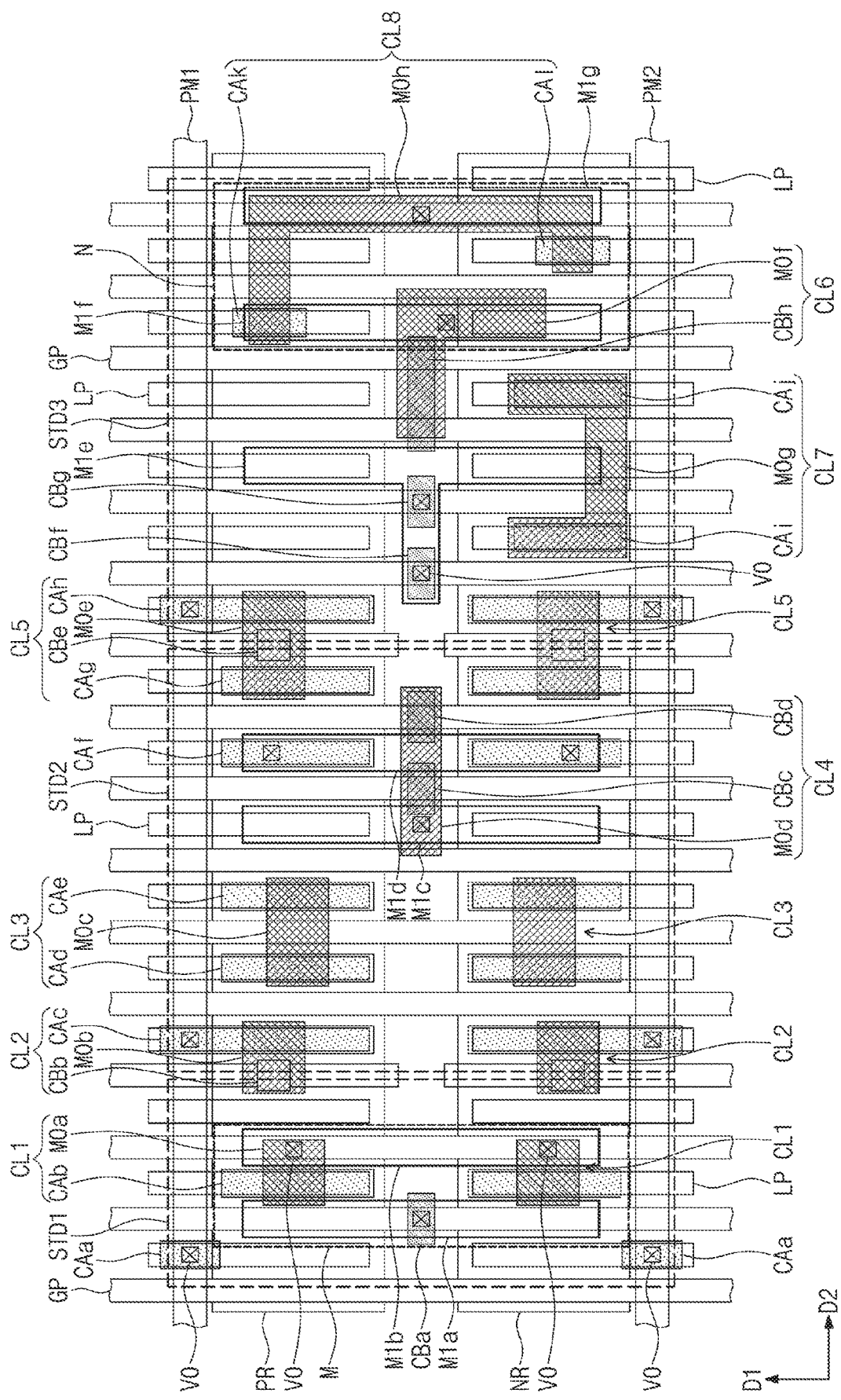
FIG. 13 is a layout diagram including standard cell layouts according to exemplary embodiments of the present inventive concept.

FIG. 13 is a layout diagram including standard cell layouts according to exemplary embodiments of the present inventive concept. In the following description of the present embodiment, an element previously described with reference to FIGS. 3, 5, 7, 9, and 11 may not be described in much further detail for the sake of brevity.

Referring to FIG. 13, a layout design tool may be used to dispose standard cell layouts side by side. As an example, the standard cell layouts may include first to third standard cell layouts STD1, STD2, and STD3. The first to third standard cell layouts STD1, STD2, and STD3 may be arranged in a second direction D2. Each of the first to third standard cell layouts STD1, STD2, and STD3 may include a logic layout for logic transistors, an interconnection line layout for interconnection lines provided on the logic transistors, and a contact layout for contacts connecting the logic transistors and the interconnection lines to each other.

The logic layout may include active layouts for active regions. The active layouts may include a PMOSFET region PR and an NMOSFET region NR. The PMOSFET region PR and the NMOSFET region NR may be spaced apart from each other in a first direction D1 crossing the second direction D2.

The logic layout may include layouts (e.g., gate patterns GP) for gate electrodes, which extend in the first direction D1 and cross the PMOSFET region PR and the NMOSFET region NR. The gate patterns GP may be spaced apart from each other in the second direction D2. The PMOSFET region PR, the NMOSFET region NR, and the gate patterns GP may constitute logic transistors provided on a semiconductor substrate 100.

The contact layout may include layouts (e.g., lower conductive patterns LP) for a lower conductive structure overlapped with or connected to each of the PMOSFET region PR and the NMOSFET region NR, layouts (e.g., connection patterns M0a-M0h) for connection patterns M0, layouts (e.g., active contact patterns CAa-CAl) for an active contact AC overlapped with or connected to the lower conductive patterns LP, and layouts (e.g., gate contact patterns CBa-CBh) for gate contacts GC overlapped with or connected to the gate patterns GP. Each of the connection patterns M0a-M0h may be overlapped with or connected to at least one of the active contact patterns CAa-CAl and the gate contact patterns CBa-CBh. In addition, layouts (e.g., conductive patterns CL1-CL8) for a conductive structure CP may be defined in the contact layout. The conductive patterns CL1-CL8 may include first to eighth conductive patterns CL1-CL8.

The interconnection line layout may include layouts (e.g., via patterns V0) for via patterns, layouts (e.g., conductive lines M1a-M1g) for interconnection lines, and layouts (e.g., power lines PM1 and PM2) for power interconnection lines. Each of the first and second power lines PM1 and PM2 may be a line-shaped structure extending in the second direction D2. The first and second power lines PM1 and PM2 may be connected to some of the active contact patterns CAa-CAl through the via patterns V0. The conductive lines M1a-M1g may be connected to some of the connection patterns M0a-M0h, some of the active contact patterns CAa-CAl, and some of the gate contact patterns CBa-CBh through the via patterns V0.

The first standard cell layout STD1 will now be described. For example, first active contact patterns CAa may be provided to be overlapped with the first and second power lines PM1 and PM2, respectively. The first and second power lines PM1 and PM2 may be respectively connected to the first active contact patterns CAa through the via patterns V0. A first gate contact pattern CBa may be provided to be overlapped with at least one of the gate patterns GP. The first conductive line M1a may be connected to the first gate contact pattern CBa through the via pattern V0.

A pair of first conductive patterns CL1 may be disposed to be adjacent to the first conductive line M1a. The pair of first conductive patterns CL1 may be disposed on the PMOSFET region PR and the NMOSFET region NR, respectively. Each of the first conductive patterns CL1 may include a second active contact pattern CAb and a first connection pattern M0a. The second active contact pattern CAb and the first connection pattern M0a may be partially overlapped with each other. A second conductive line M1b may be connected to the pair of first conductive patterns CL1, respectively, through the via patterns V0.

A pair of second conductive patterns CL2 may be disposed on a boundary between the first standard cell layout STD1 and the second standard cell layout STD2. The pair of second conductive patterns CL2 may be disposed on the PMOSFET region PR and the NMOSFET region NR, respectively. Each of the second conductive patterns CL2 may include a second gate contact pattern CBb, a second connection pattern M0b, and a third active contact pattern CAc. The second gate contact pattern CBb may be overlapped with the second connection pattern M0b. The third active contact pattern CAc and the second connection pattern M0b may be partially overlapped with each other. However, the second gate contact pattern CBb and the third active contact pattern CAc may be spaced apart from each other in the second direction D2. The first and second power lines PM1 and PM2 may be connected to the pair of second conductive patterns CL2, respectively, through the via patterns V0.

The second standard cell layout STD2 will now be described. A pair of third conductive patterns CL3 may be disposed on the substrate 100. The pair of third conductive patterns CL3 may be disposed on the PMOSFET region PR and the NMOSFET region NR, respectively. Each of the third conductive patterns CL3 may include a fourth active contact pattern CAd, a fifth active contact pattern CAe, and a third connection pattern M0c. The fourth and fifth active contact patterns CAd and CAe may be spaced apart from each other in the second direction D2 with the gate pattern GP interposed therebetween. The third connection pattern M0c may cross the gate pattern GP and extend in the second direction D2. The fourth active contact pattern CAd and the third connection pattern M0c may be partially overlapped with each other, and the fifth active contact pattern CAe and the third connection pattern M0c may be partially overlapped with each other.

A fourth conductive pattern CL4 may be disposed to be adjacent to the pair of third conductive patterns CL3. The fourth conductive pattern CL4 may be disposed between the PMOSFET region PR and the NMOSFET region NR. The fourth conductive pattern CL4 may include a third gate contact pattern CBc, a fourth gate contact pattern CBd, and a fourth connection pattern M0d. The third and fourth gate contact patterns CBc and CBd may each be overlapped with adjacent gate patterns GP. The fourth connection pattern M0d may cross the gate patterns GP and extend in the second direction D2. The third and fourth gate contact patterns CBc and CBd may be overlapped with the fourth connection pattern M0d. A third conductive line M1c may be connected to the fourth conductive pattern CL4 through the via pattern V0.

A pair of sixth active contact patterns CAf may be disposed between the gate patterns GP connected to the third and fourth gate contact patterns CBc and CBd, respectively. The pair of sixth active contact patterns CAf may be disposed on the PMOSFET region PR and the NMOSFET region NR, respectively. A fourth conductive line M1d may be connected to the pair of sixth active contact patterns CAf through the via patterns V0.

If the fourth connection pattern M0d is omitted, the third and fourth conductive lines M1c and M1d may not be formed in the shapes and positions shown in FIG. 13. For example, the first and second conductive lines M1a and M1b may have shapes and positions similar to those shown in FIG. 14B.

A pair of fifth conductive patterns CL5 may be disposed on a boundary between the second standard cell layout STD2 and the third standard cell layout STD3. The pair of fifth conductive patterns CL5 may be disposed on the PMOSFET region PR and the NMOSFET region NR, respectively. Each of the fifth conductive patterns CL5 may include a seventh active contact pattern CAg, a fifth connection pattern M0e, a fifth gate contact pattern CBe, and an eighth active contact pattern CAh. The fifth gate contact pattern CBe may be overlapped with the fifth connection pattern M0e. The seventh active contact pattern CAg and the fifth connection pattern M0e may be partially overlapped with each other, and the eighth active contact pattern CAh and the fifth connection pattern M0e may be partially overlapped with each other. The seventh and eighth active contact patterns CAg and CAh and the fifth gate contact pattern CBe may be spaced apart from each other in the second direction D2. The eighth active contact pattern CAh may extend in the first direction D1 and may be partially overlapped with the power lines PM1 and PM2. The first and second power lines PM1 and PM2 may be connected to the pair of fifth conductive patterns CL5, respectively, through the via patterns V0.

The third standard cell layout STD3 will now be described. For example, a sixth gate contact pattern CBf and a seventh gate contact pattern CBg may be provided on the substrate 100. The sixth and seventh gate contact patterns CBf and CBg may be disposed between the PMOSFET region PR and the NMOSFET region NR. The sixth and seventh gate contact patterns CBf and CBg may be respectively overlapped with the gate patterns GP that are adjacent to each other. Furthermore, the sixth and seventh gate contact patterns CBf and CBg may be overlapped with a fifth conductive line M1e. The fifth conductive line M1e may include a first portion, which is overlapped with the sixth and seventh gate contact patterns CBf and CBg and extends in the second direction D2, and a second portion extending in the first direction D1. The fifth conductive line M1e may be connected to the sixth and seventh gate contact patterns CBf and CBg through the via patterns V0.

A sixth conductive pattern CL6 may be disposed to be adjacent to the fifth conductive line M1e. The sixth conductive pattern CL6 may be disposed between the PMOSFET region PR and the NMOSFET region NR. The sixth conductive pattern CL6 may include an eighth gate contact pattern CBh and a sixth connection pattern M0f. The eighth gate contact pattern CBh may extend in the second direction D2 and may be overlapped with a pair of the gate patterns GP that are adjacent to each other. The sixth connection pattern M0f may include a first portion, which extends in the second direction D2 and is overlapped with the eighth gate contact pattern CBh, and a second portion extending in the first direction D1. The second portion of the sixth connection pattern M0f may be overlapped with the sixth conductive line M1f. The sixth conductive line M1f may be connected to the sixth conductive pattern CL6 through the via pattern V0.

A seventh conductive pattern CL7 may be provided on the NMOSFET region NR. The seventh conductive pattern CL7 may include a ninth active contact pattern CAi, a tenth active contact pattern CAj, and a seventh connection pattern M0g. The ninth and tenth active contact patterns CAi and CAj may be spaced apart from each other in the second direction D2 with the gate patterns GP interposed therebetween. The seventh connection pattern M0g may include a first portion, which extends in the first direction D1 and is overlapped with the ninth active contact pattern CAi, a second portion, which extends in the first direction D1 and is overlapped with the tenth active contact pattern CAj, and a third portion, which extends in the second direction D2 and crosses the gate patterns GP.

An eighth conductive pattern CL8 may be disposed to be adjacent to the sixth conductive pattern CL6. The eighth conductive pattern CL8 may extend from the PMOSFET region PR to the NMOSFET region NR. The eighth conductive pattern CL8 may include an eleventh active contact pattern CAk, a twelfth active contact pattern CAl, and an eighth connection pattern M0h. The eleventh and twelfth active contact patterns CAk and CAl may be disposed on the PMOSFET region PR and the NMOSFET region NR, respectively. The eleventh active contact pattern CAk may be overlapped with the sixth conductive line M1f. The eighth connection pattern M0h may include a first portion, which extends in the second direction D2 and is overlapped with the eleventh active contact pattern CAk, a second portion, which extends in the second direction D2 and is overlapped with the twelfth active contact pattern CAl, and a third portion, which extends in the first direction D and connects the first and second portions to each other. The first portion of the eighth connection pattern M0h may cross at least one of the gate patterns GP. Furthermore, the eighth connection pattern M0h and a seventh conductive line M1g may be partially overlapped with each other. The seventh conductive line M1g may be connected to the eighth connection pattern M0h through the via pattern V0.

In the pair of first conductive patterns CL1 described above, a pair of the second active contact patterns CAb may be connected to each other through the first connection patterns M0a and the second conductive line M1b. In the eighth conductive pattern CL8, the eleventh and twelfth active contact patterns CAk and CAl may be electrically connected to each other through only the eighth connection pattern M0h.

So far, examples of the first to eighth conductive patterns CL1-CL8, which are disposed on the first to third standard cell layouts STD1, STD2, and STD3, have been described. However, the inventive concept may not be limited thereto. For example, the active contact patterns, the gate contact patterns, and the connection patterns may be changed in terms of their shapes and positions and may be connected to each other in various manners.

Figure 14A:
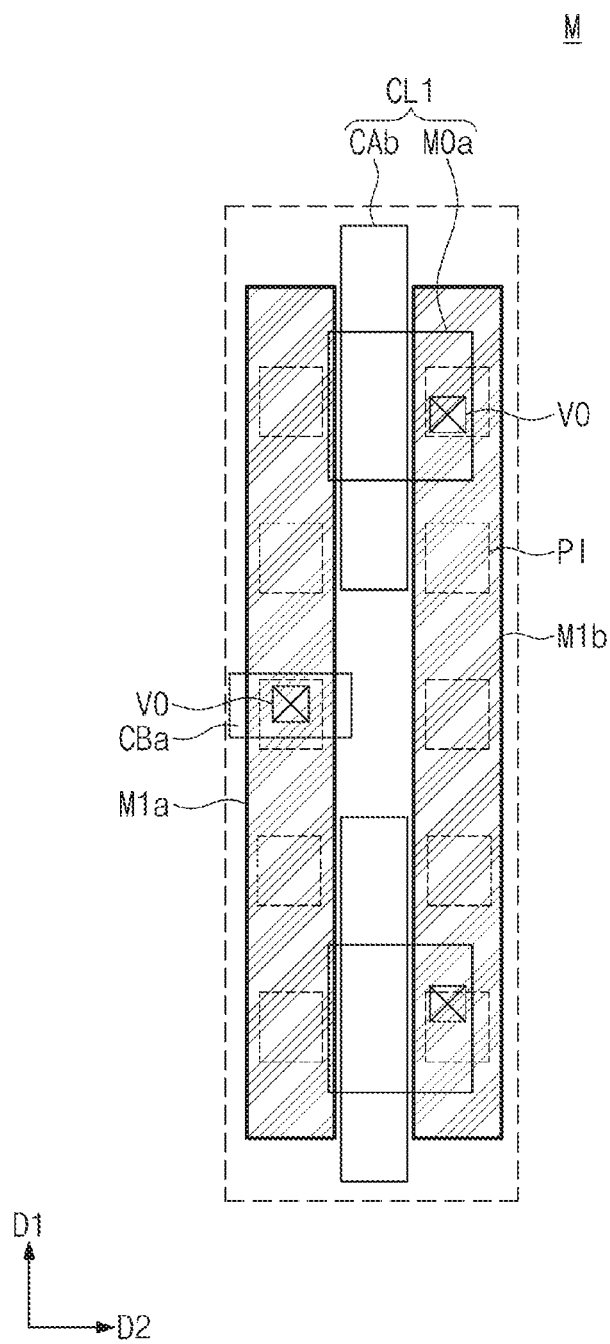
FIG. 14A is a layout diagram illustrating a region 'M' of FIG. 13 according to exemplary embodiments of the present inventive concept.
Figure 14B:
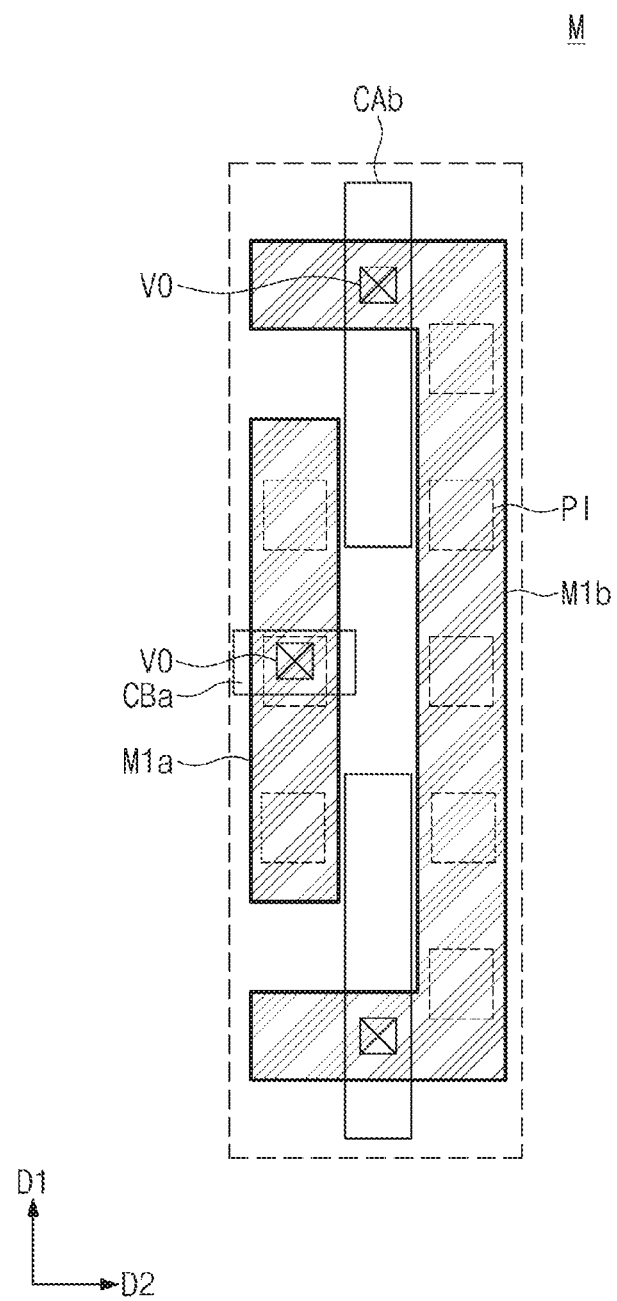
FIG. 14B is a layout diagram illustrating the region 'M' of FIG. 13 according to a comparative example.

FIG. 14A is a layout diagram illustrating a region 'M' of FIG. 13 according to exemplary embodiments of the present inventive concept. FIG. 14B is a layout diagram illustrating the region 'M' of FIG. 13 according to a comparative example.

Referring to FIG. 14A, the first gate contact pattern CBa, the pair of first conductive patterns CL1, and the first and second conductive lines M1a and M1b that have been previously described with reference to FIG. 13 may be disposed on the substrate 100. The first conductive line M1a may be connected to the first gate contact pattern CBa through a via pattern V0. Each of the first conductive patterns CL1 may include a second active contact pattern CAb and a first connection pattern M0a. The first connection pattern M0a and the second conductive line M1b may be partially overlapped with each other. Accordingly, the second conductive line M1b may be connected to the pair of the first connection patterns M0a through the via patterns V0.

Each of the first and second conductive lines M1a and M1b may include pin regions PI for establishing routing paths to upper interconnection lines. As an example, each of the first and second conductive lines M1a and M1b may include five pin regions PI, which are arranged parallel to its longitudinal axis or in the first direction D1. In other words, the first and second conductive lines M1a and M1b may include ten pin regions PI.

Referring to FIG. 14B, a first gate contact pattern CBa, a pair of second active contact patterns CAb, and first and second conductive lines M1a and M1b may be disposed on a substrate. However, unlike that of FIG. 14A, the first connection patterns M0a are not included. The second conductive line M1b may include a first portion extending in a first direction D1 and second portions, which extend in a second direction D2 and are overlapped with the pair of second active contact patterns CAb, respectively. The second conductive line M1b may be connected to the pair of second active contact patterns CAb through via patterns V0.

Each of the first and second conductive lines M1a and M1b may include pin regions PI for establishing routing paths to upper interconnection lines. Due to the second portions of the second conductive line M1b, a length of the first conductive line M1a in the first direction D1 may be shorter than that of the first conductive line M1a of FIG. 14A. Thus, the first conductive line M1a may include, for example, three pin regions PI, and the second conductive line M1b may include five pin regions PI. As a result, the first and second conductive lines M1a and M1b may include eight pin regions PI. In other words, the number of the pin regions PI on the first and second conductive lines M1a and M1b may be less than that in the embodiment described with reference to FIG. 14A.

Figure 15A:
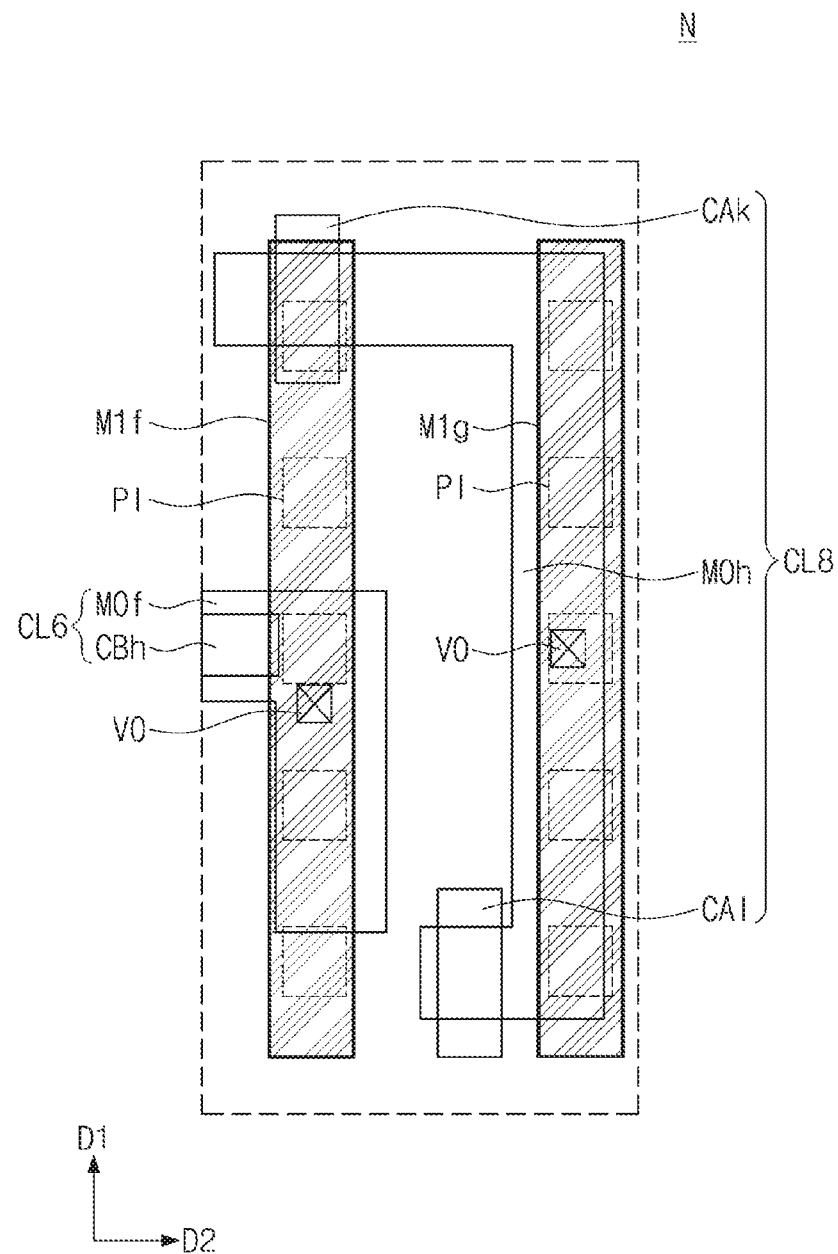
FIG. 15A is a layout diagram illustrating a region 'N' of FIG. 13 according to exemplary embodiments of the inventive concept.
Figure 15B:
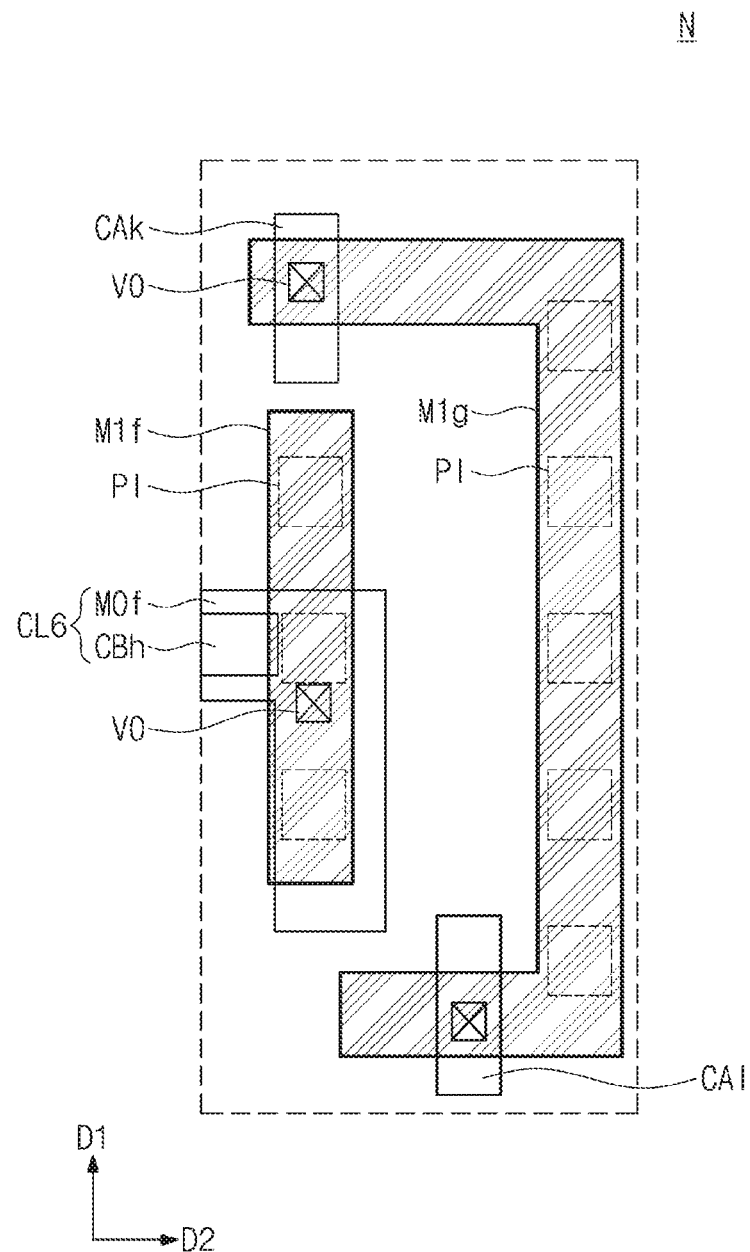
FIG. 15B is a layout diagram illustrating the region 'N' of FIG. 13 according to a comparative example.

FIG. 15A is a layout diagram illustrating a region 'N' of FIG. 13 according to exemplary embodiments of the present inventive concept. FIG. 15B is a layout diagram illustrating the region 'N' of FIG. 13 according to a comparative example.

Referring to FIG. 15A, the sixth conductive pattern CL6, the eighth conductive pattern CL8, and the sixth and seventh conductive lines M1f and M1g previously described with reference to FIG. 13 may be disposed on the substrate 100. The sixth conductive pattern CL6 may include an eighth gate contact pattern CBh and a sixth connection pattern M0f. The eighth conductive pattern CL8 may include an eleventh active contact pattern CAk, a twelfth active contact pattern CAl, and an eighth connection pattern M0h. The sixth connection pattern M0f and the sixth conductive line M1f may be partially overlapped with each other, and the eighth connection pattern M0h and the seventh conductive line M1g may be partially overlapped with each other. Accordingly, the sixth conductive line M1f may be connected to the sixth connection pattern M0f through the via pattern V0, and the seventh conductive line M1g may be connected to the eighth connection pattern M0h through the via pattern V0.

Each of the sixth and seventh conductive lines M1f and M1g may include pin regions PI for establishing routing paths to upper interconnection lines. As an example, each of the sixth and seventh conductive lines M1f and M1g may include five pin regions PI, which are arranged parallel to its longitudinal axis or in the first direction D1. In other words, the sixth and seventh conductive lines M1f and M1g may include ten pin regions PI.

Referring to FIG. 15B, a sixth conductive pattern CL6, an eleventh active contact pattern CAk, a twelfth active contact pattern CAl, and sixth and seventh conductive lines M1f and M1g may be disposed on a substrate. However, unlike that of FIG. 15A, the eighth connection pattern M0h is not included. The seventh conductive line M1g may include a first portion extending in a first direction D1 and second portions, which extend in a second direction D2 and are overlapped with the eleventh and twelfth active contact patterns CAk and CAl, respectively. The seventh conductive line M1g may be connected to each of the eleventh and twelfth active contact patterns CAk and CAl through via patterns V0.

Each of the sixth and seventh conductive lines M1f and M1g may include pin regions PI for establishing routing paths to upper interconnection lines. Due to the second portions of the seventh conductive line M1g, a length of the sixth conductive line M1f in the first direction D1 may be shorter than that of the sixth conductive line M1f of FIG. 15A. Thus, the sixth conductive line M1f may include, for example, three pin regions PI, and the seventh conductive line M1g may include five pin regions PI. As a result, the sixth and seventh conductive lines M1f and M1g may include eight pin regions PI. In other words, the number of the pin regions PI on the sixth and seventh conductive lines M1f and M1g may be less than that in the embodiment described with reference to FIG. 15A.

As described with reference to FIGS. 14 and 15, a standard cell layout according to exemplary embodiments of the present inventive concept may include an additional connection pattern, as well as an active contact pattern and a gate contact pattern. Thus, it is possible to increase a degree of freedom in placing a layout for interconnection lines or conductive lines and to increase an area of pin regions for establishing routing paths to upper interconnection lines. In other words, the connection pattern makes it possible to more easily construct a routing structure.

Figure 16:
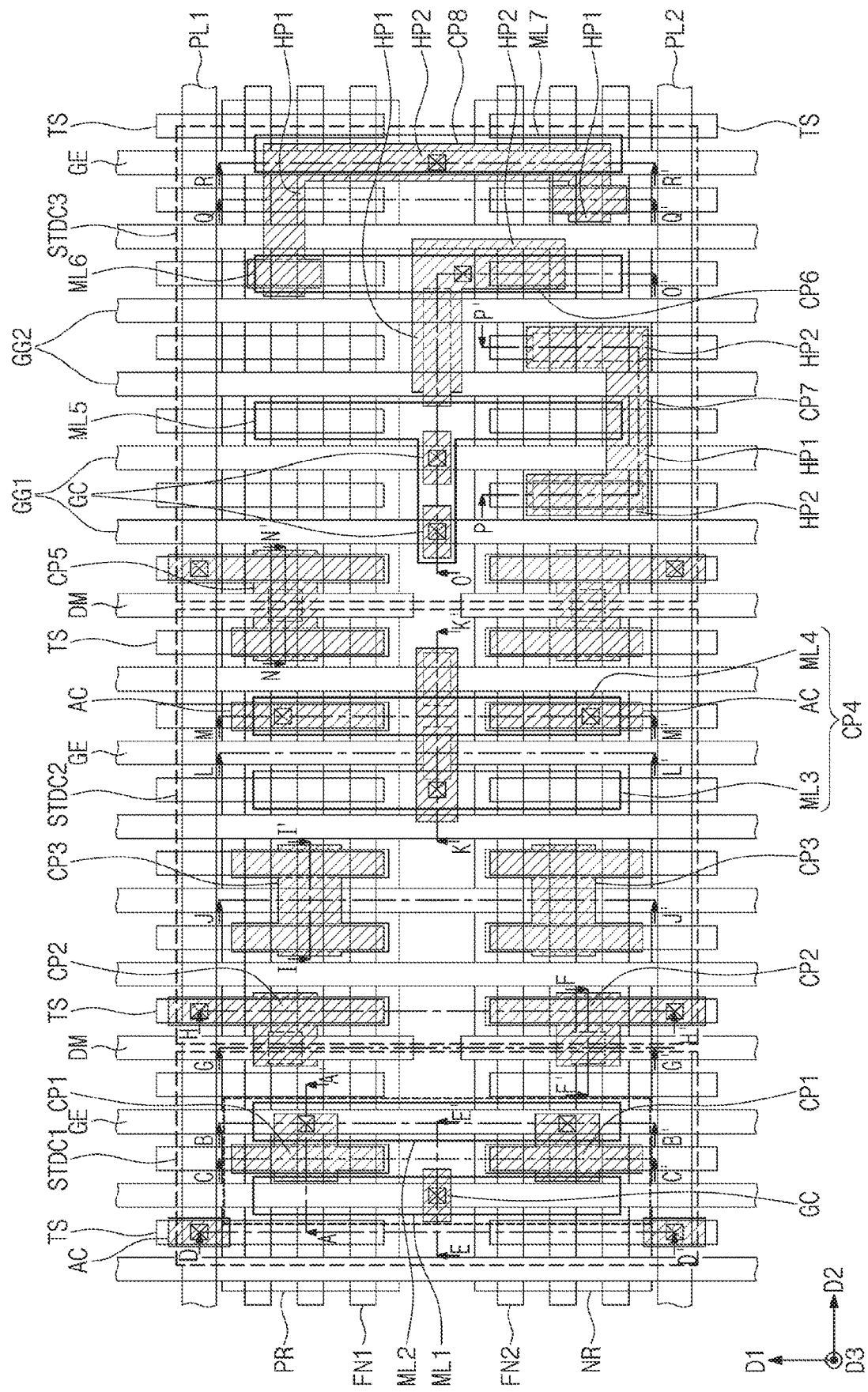
FIG. 16 is a plan view illustrating a semiconductor device according to exemplary embodiments of the inventive concept.
Figure 17A:
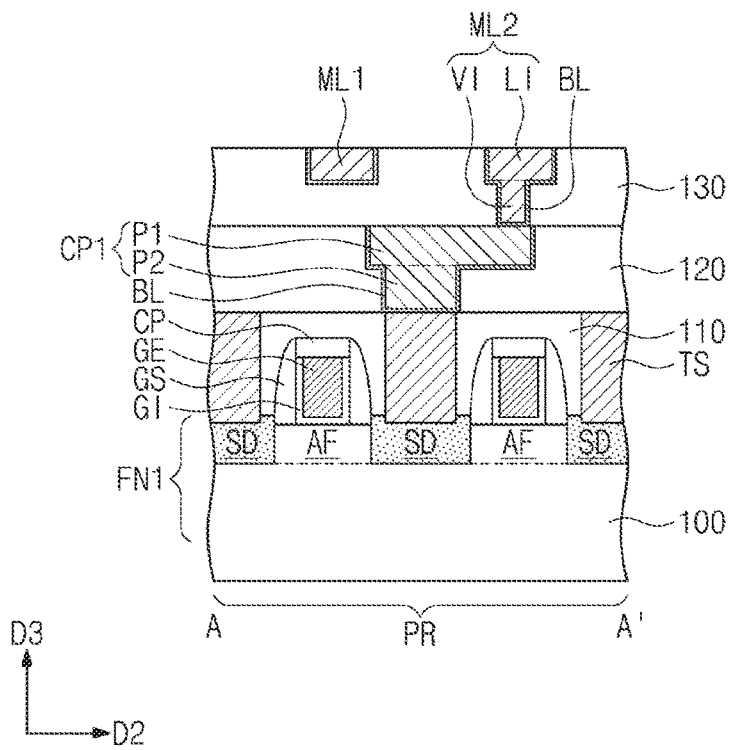
FIGS. 17A, 17B, 17C, 17D, 17E, 17F, 17G, 17H, 17I, 17J, 17K, 17L, 17M, 17N, 17O, 17P, 17Q and 17R are sectional views taken along lines A-A', B-B', C-C', D-D', E-E', F-F', G-G', H-H', I-I', J-J', K-K', L-L', M-M', N-N', O-O', P-P', Q-Q', and R-R', respectively, of FIG. 16 according to exemplary embodiments of the preset inventive concept.
Figure 17B:
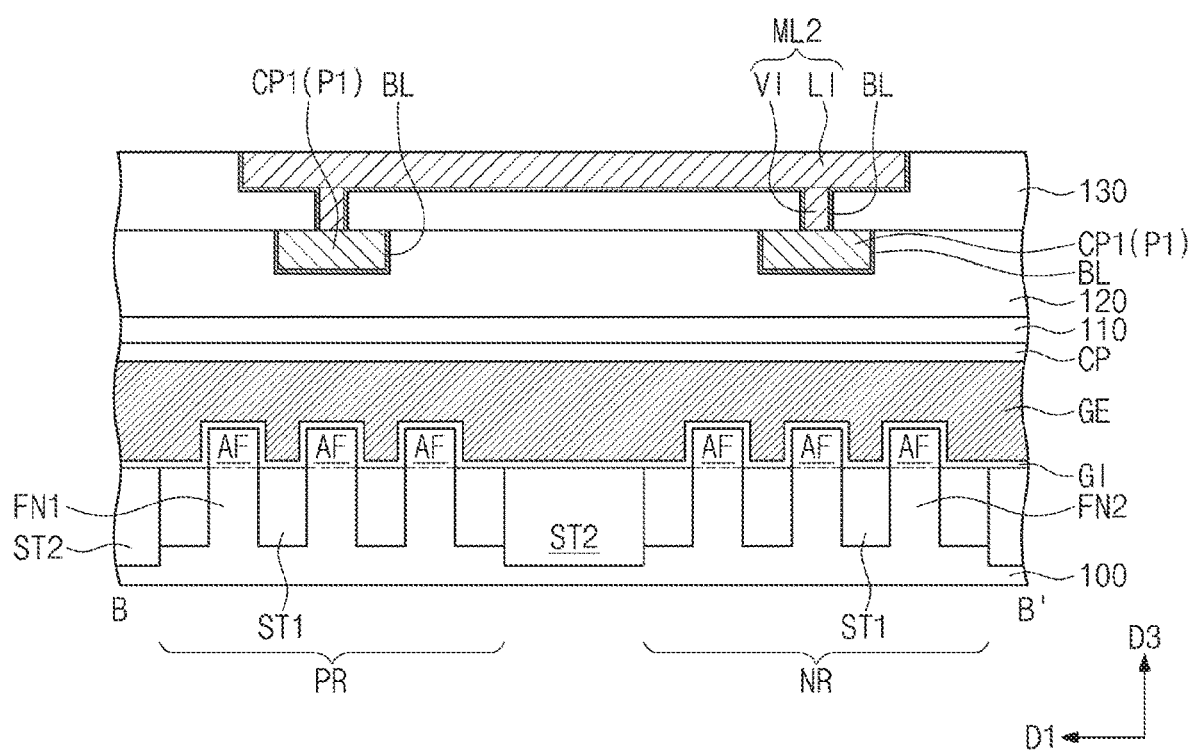
Figure 17C:
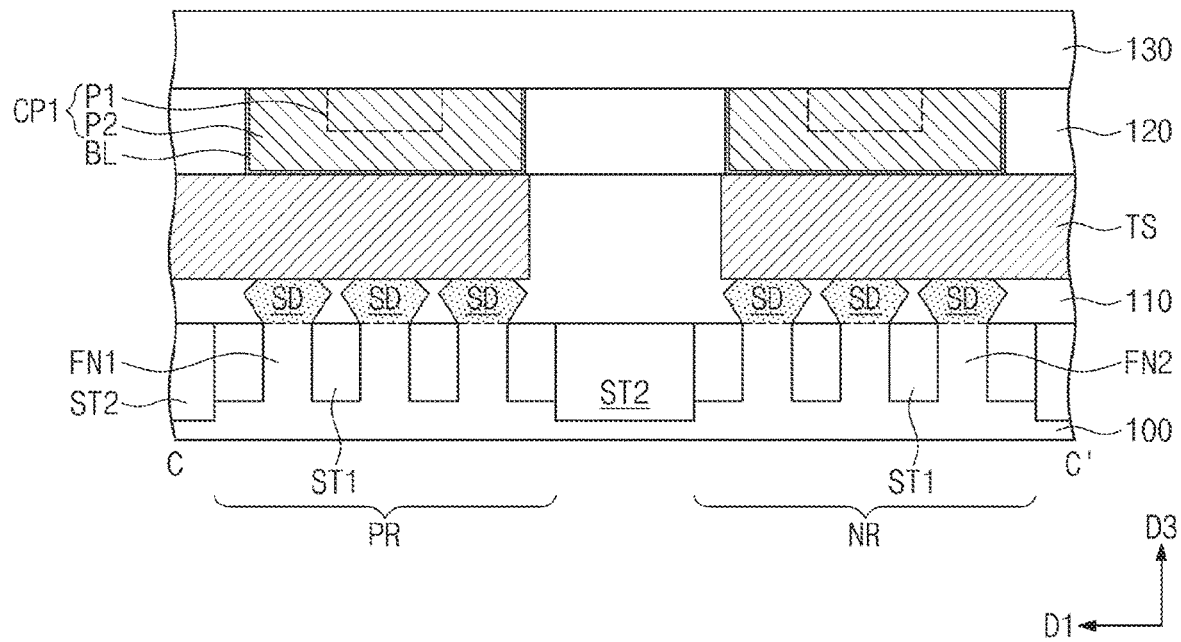
Figure 17D:
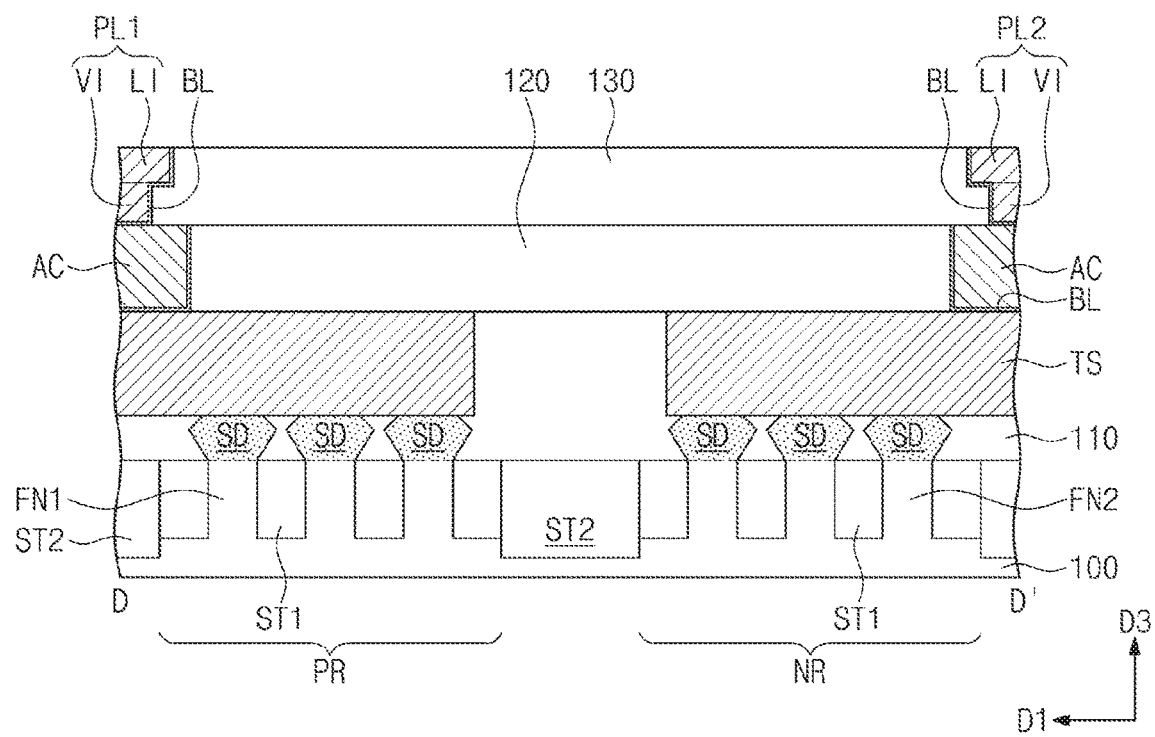
Figure 17E:
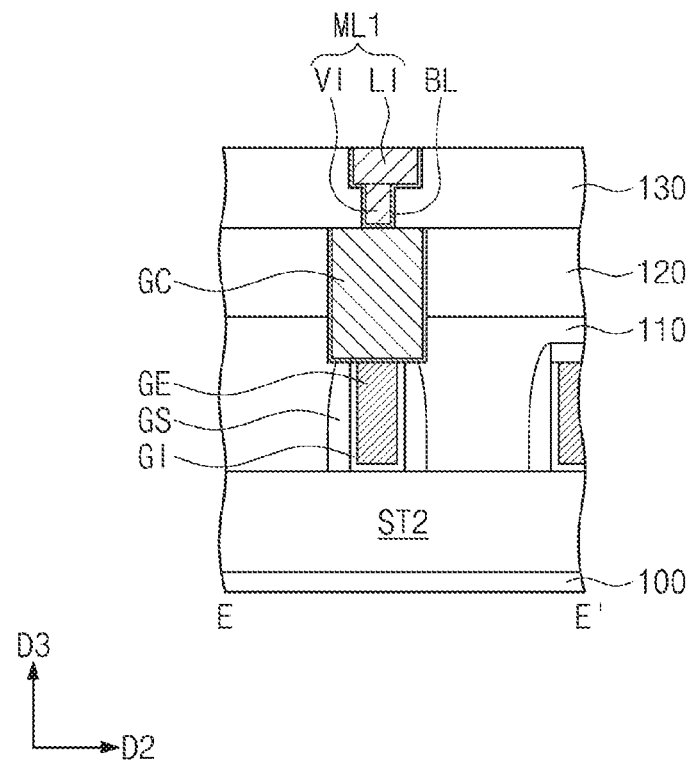
Figure 17F:
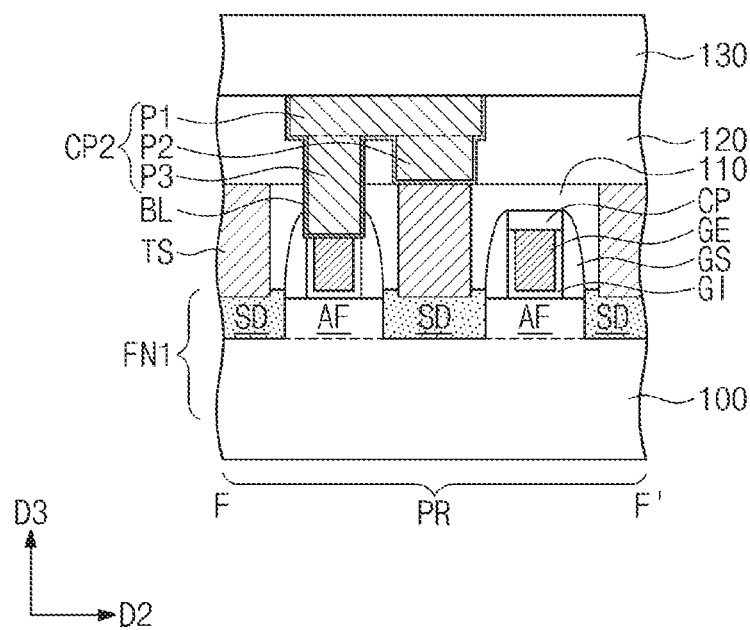
Figure 17G:
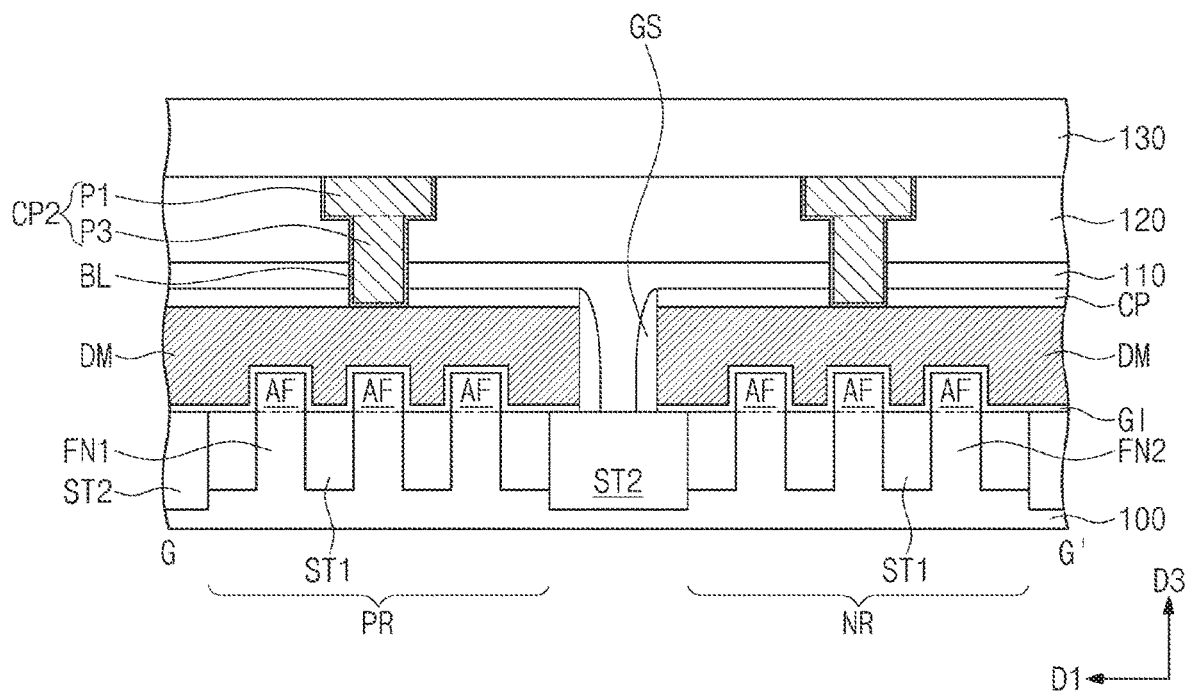
Figure 17H:
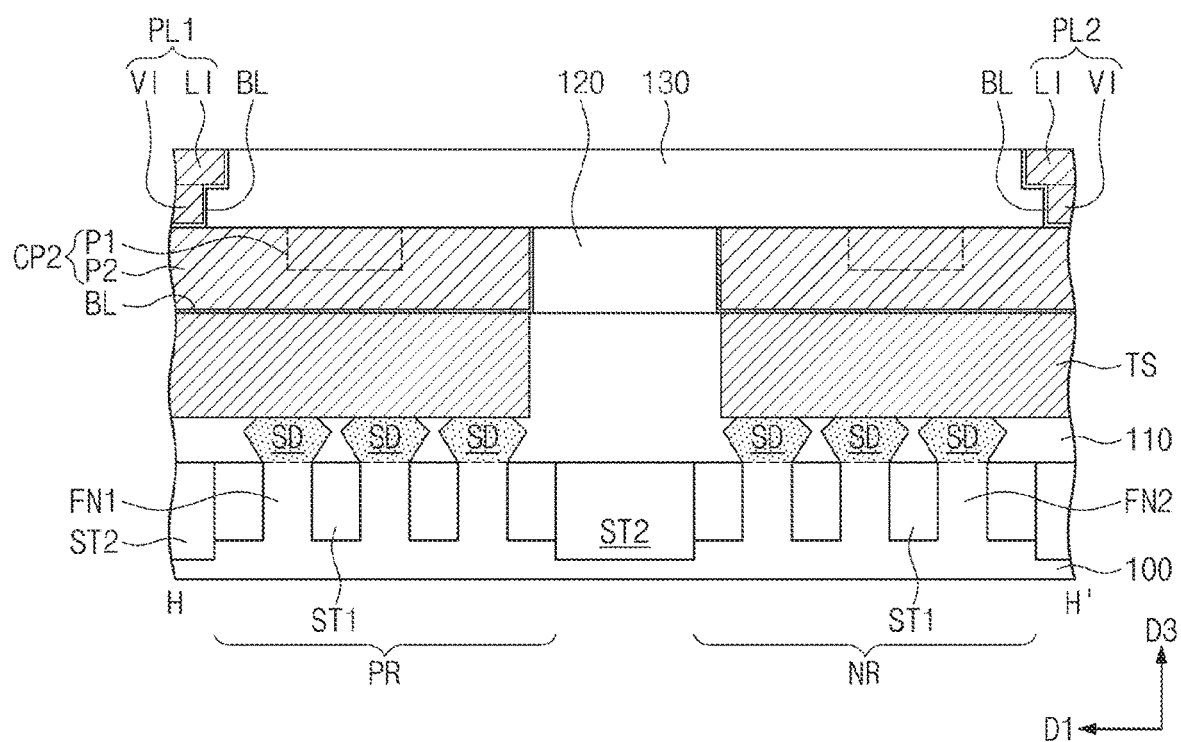
Figure 17I:
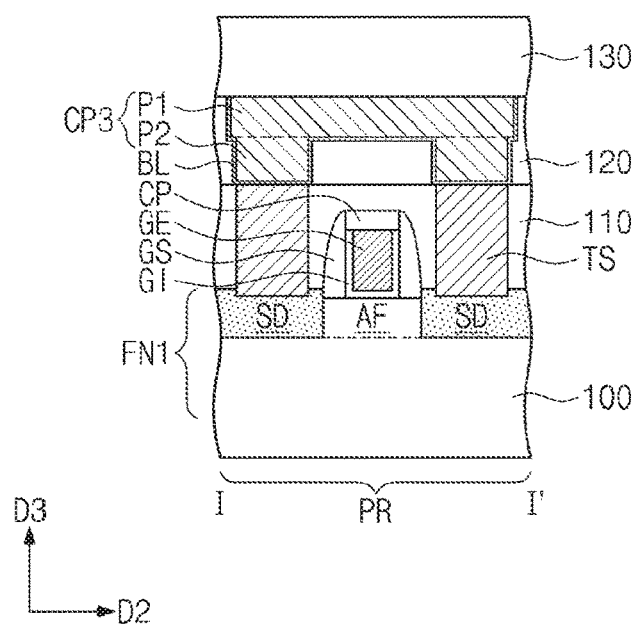
Figure 17J:
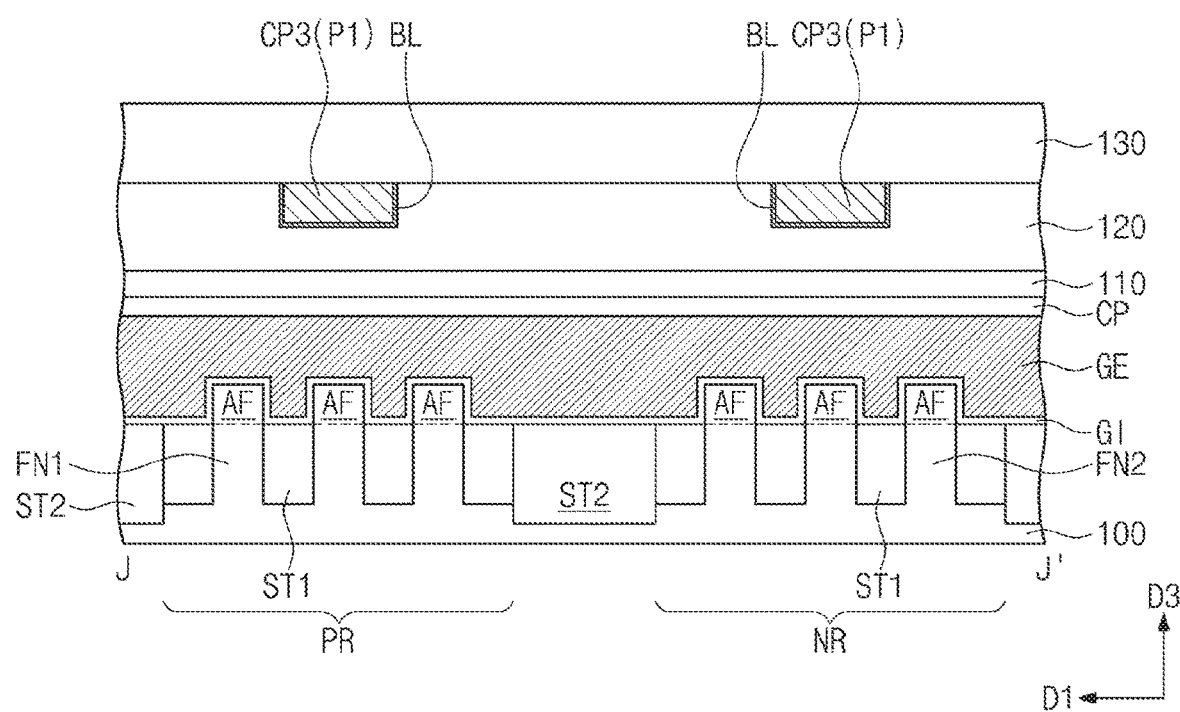
Figure 17K:
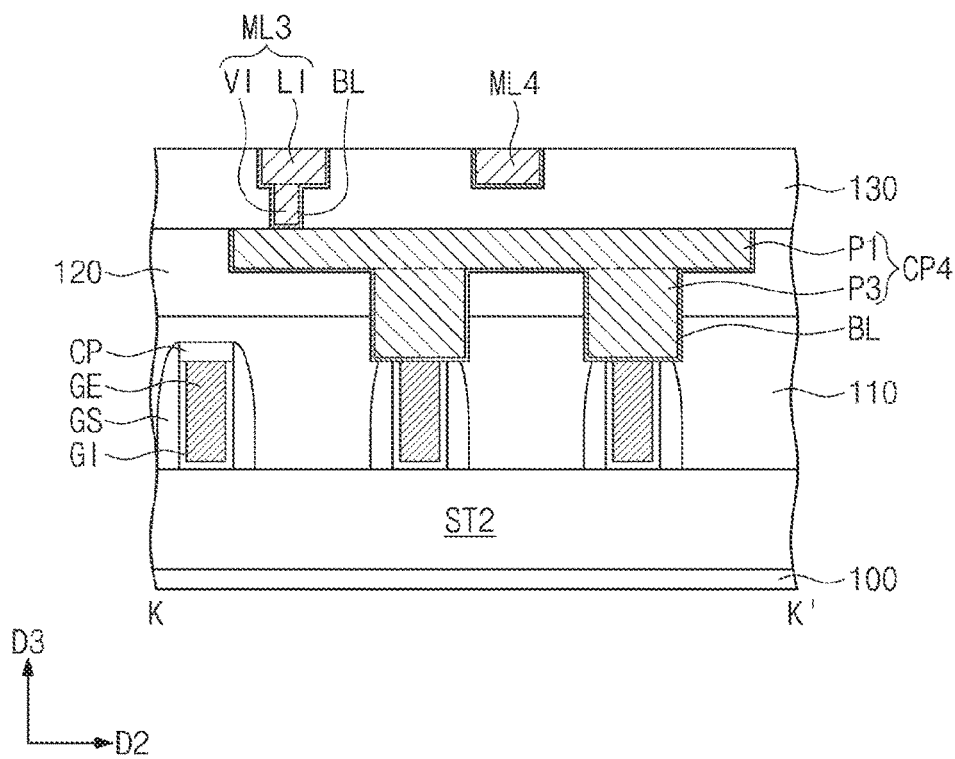
Figure 17L:
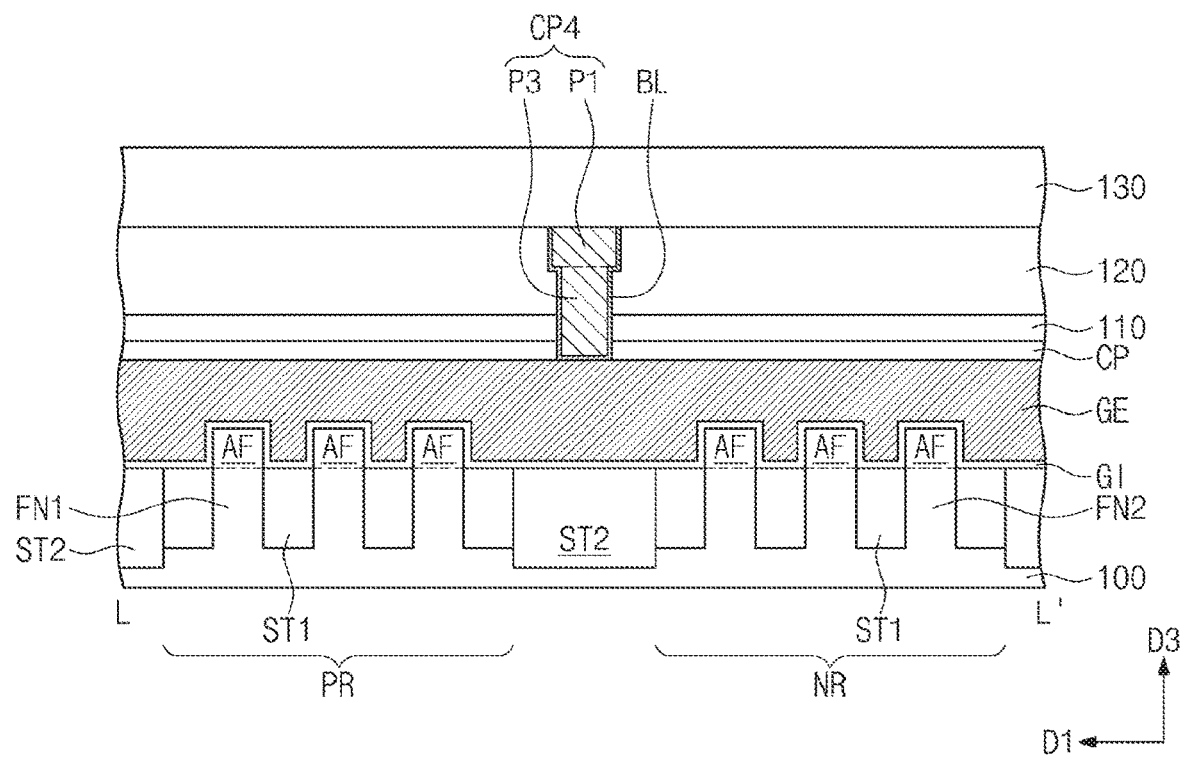
Figure 17M:
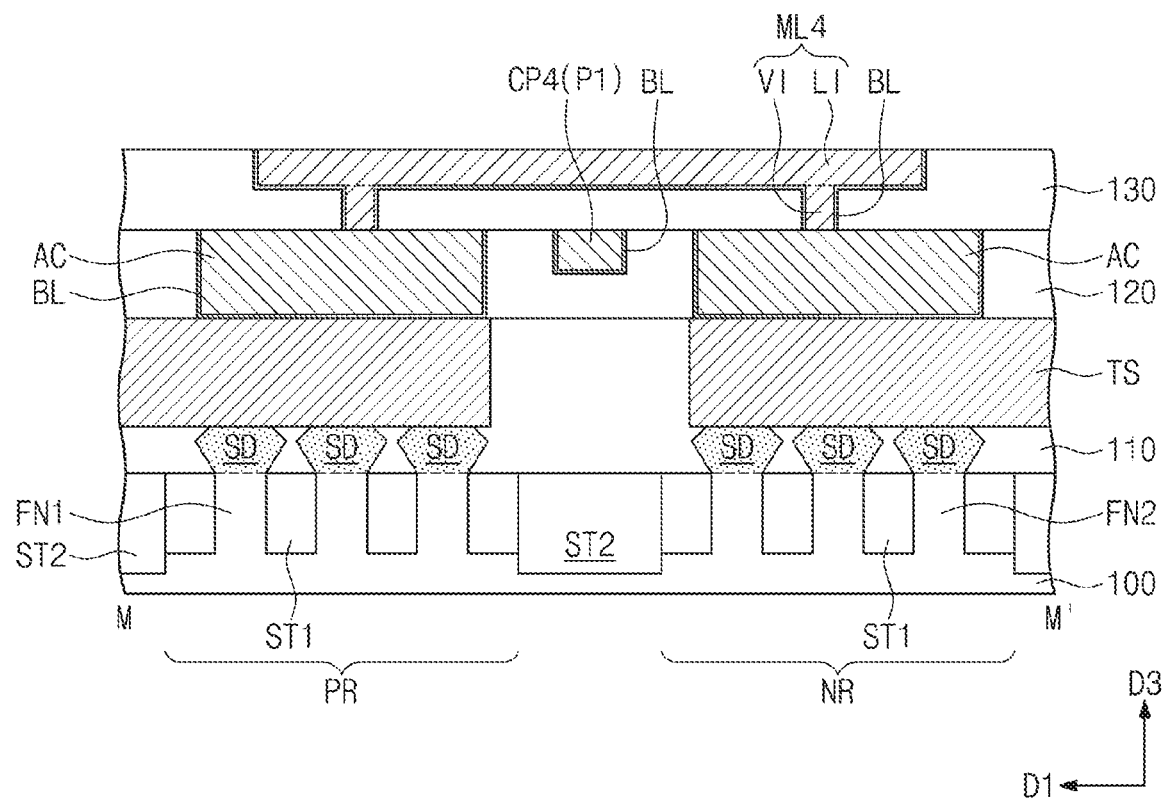
Figure 17N:
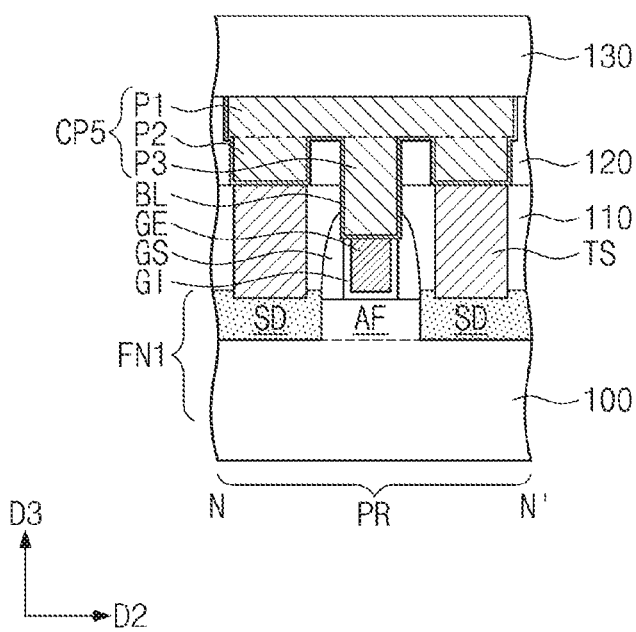
Figure 17O:
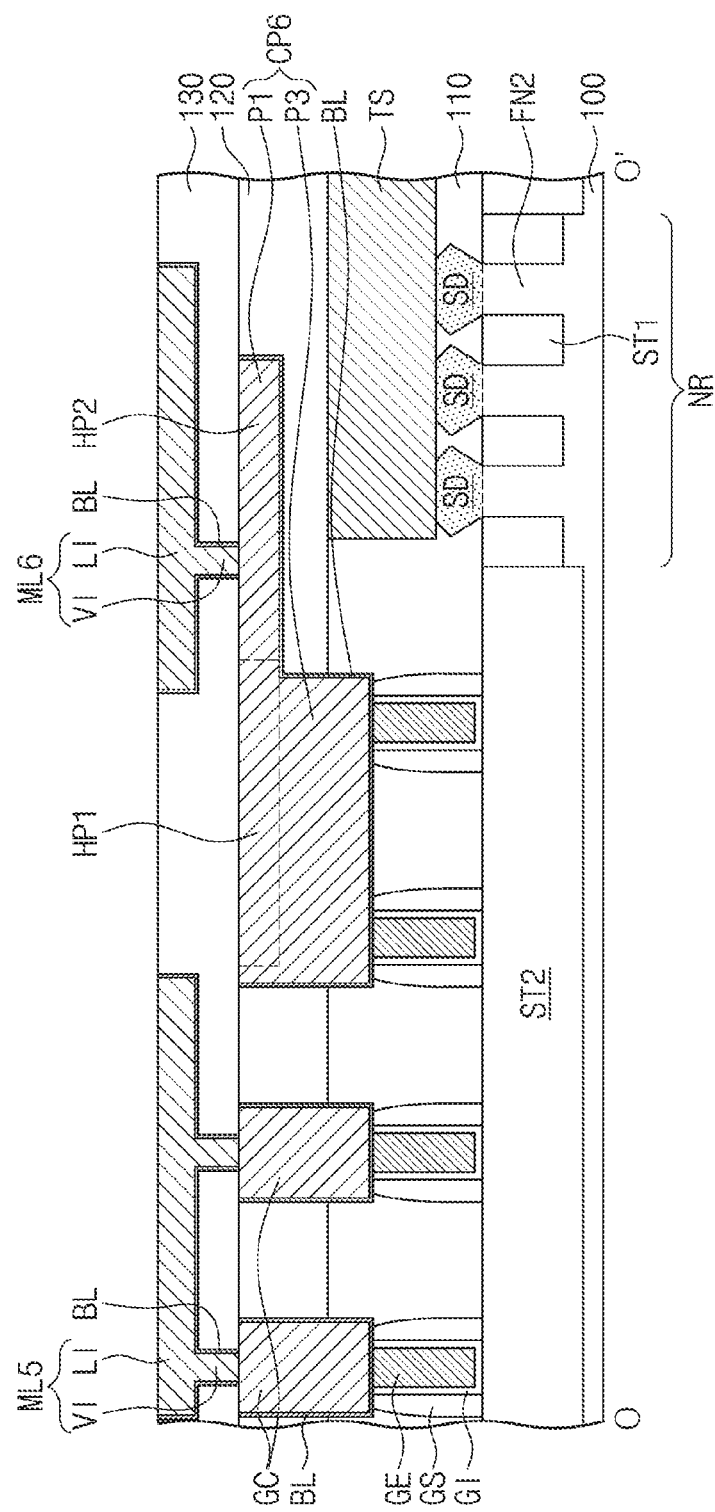
Figure 17P:
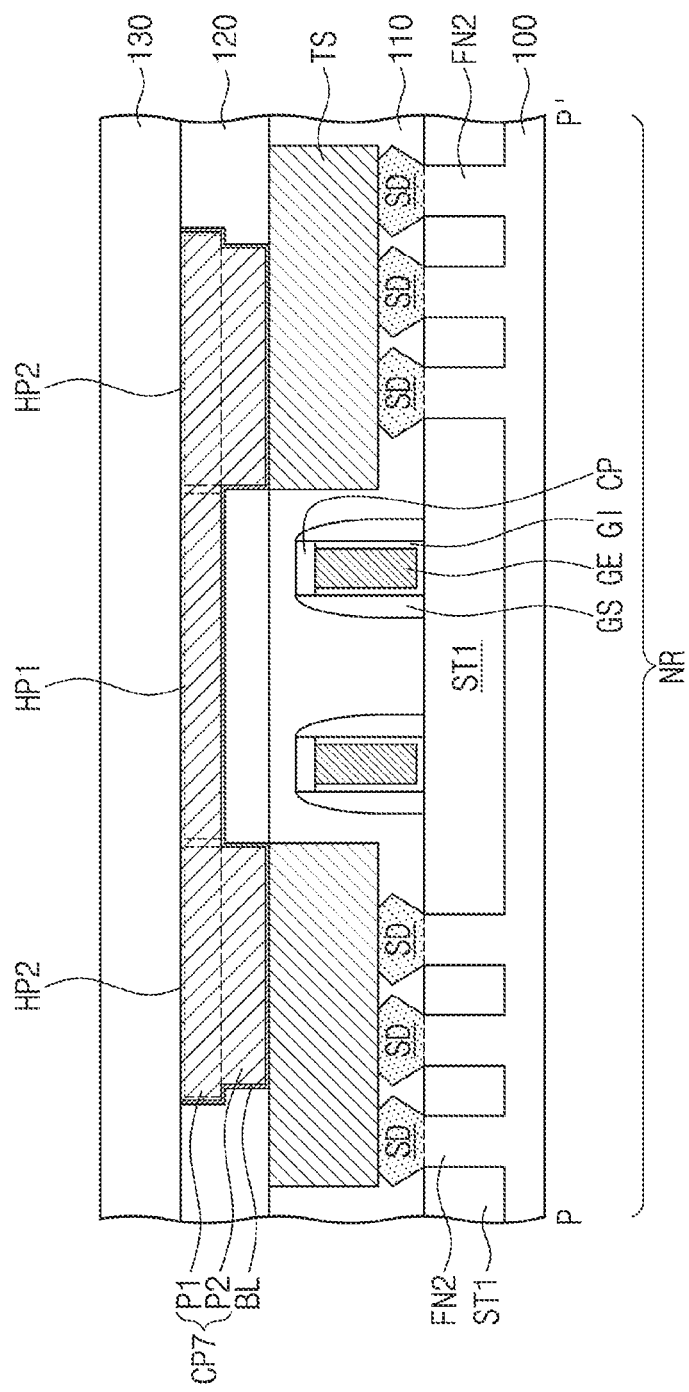
Figure 17Q:
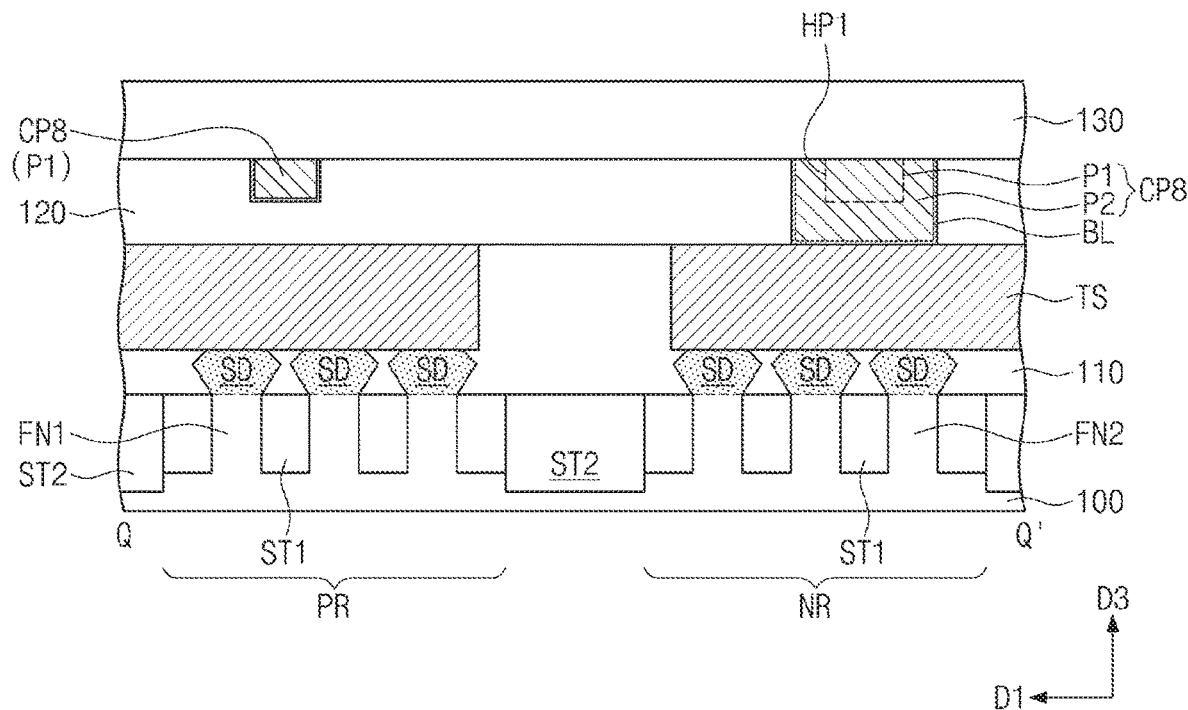
Figure 17R:
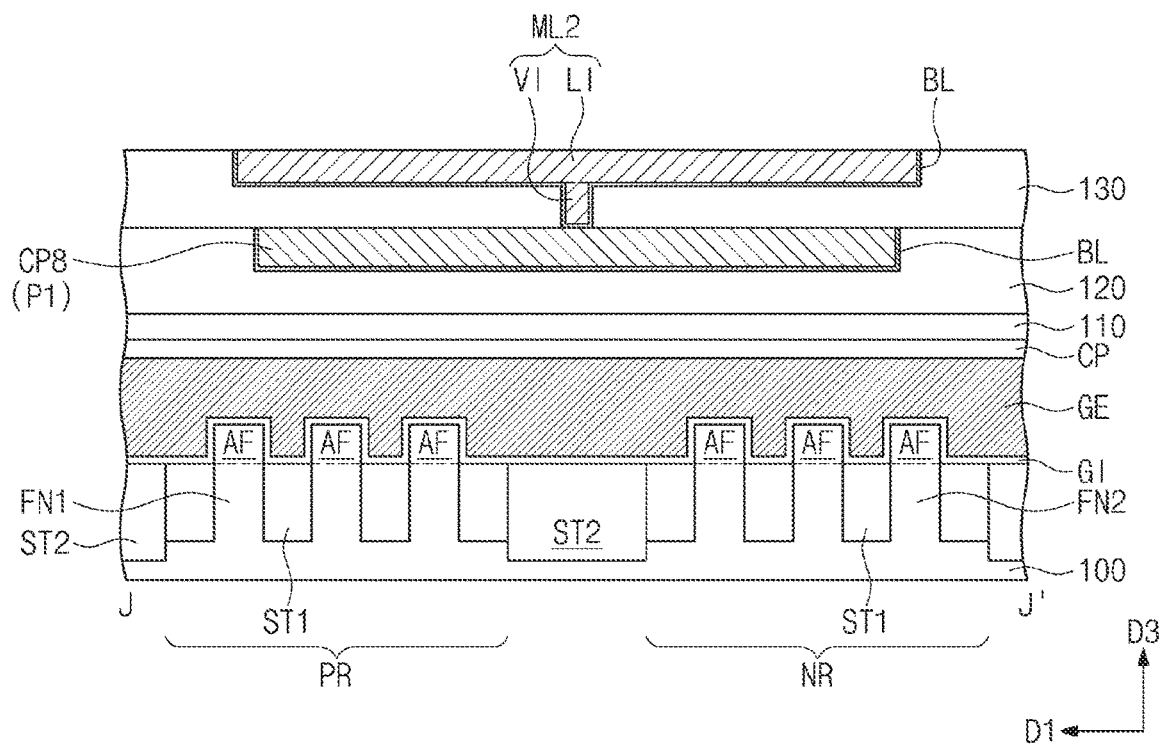

FIG. 16 is a plan view illustrating a semiconductor device according to exemplary embodiments of the present inventive concept. FIGS. 17A through 17R are sectional views taken along lines A-A', B-B', C-C', D-D', E-E', F-F', G-G', H-H', I-I', J-J', K-K', L-L', M-M', N-N', O-O', P-P', Q-Q', and R-R', respectively, of FIG. 16. For example, FIG. 16 and FIGS. 17A through 17R illustrate an example of a semiconductor device that is formed based on the standard cell layouts of FIG. 13. In the following description of the present embodiment, an element previously described with reference to FIGS. 4, 6, 8, 10, and 12 may not be described in much further detail for the sake of brevity.

In a semiconductor device to be described with reference to FIGS. 16 and 17A to 17R, each element of the semiconductor device may be integrated on a semiconductor substrate 100 through the photolithography process S150 of FIG. 2, and thus, they may not be identical to corresponding patterns constituting the standard cell layout of FIG. 13. The semiconductor device may be, for example, a system-on-chip.

Referring to FIGS. 16 and 17A to 17R, second device isolation patterns ST2 may be provided on a substrate 100 to define a PMOSFET region PR and an NMOSFET region NR. The second device isolation patterns ST2 may be provided in an upper portion of the substrate 100. In exemplary embodiments of the present inventive concept, the substrate 100 may be a silicon substrate, a germanium substrate, or a silicon-on-insulator (SOI) substrate.

The PMOSFET and NMOSFET regions PR and NR may be spaced apart from each other, in a first direction D1 parallel to a top surface of the substrate 100, by the second device isolation patterns ST2 interposed therebetween. Although each of the PMOSFET and NMOSFET regions PR and NR is illustrated to be a single region, each of the PMOSFET and NMOSFET regions PR and NR may include a plurality of regions spaced apart from each other by the second device isolation patterns ST2.

A plurality of first active patterns FN1 may be provided on the PMOSFET region PR to extend in a second direction D2 crossing the first direction D1, and a plurality of second active patterns FN2 may be provided on the NMOSFET region NR to extend in the second direction D2. The first and second active patterns FN1 and FN2 may be parts of the substrate 100 and may have a protruding shape. In other words, they may protrude from the substrate 100. The first and second active patterns FN1 and FN2 may be arranged in the first direction D1. First device isolation patterns ST1 extending in the second direction D2 may be disposed at both sides of each of the first and second active patterns FN1 and FN2.

Between the first device isolation patterns ST1, upper portions of the first and second active patterns FN1 and FN2 may vertically protrude with respect to the first device isolation patterns ST1. In other words, each of the upper portions of the first and second active patterns FN1 and FN2 may have a fin-shaped structure, between the first device isolation patterns ST1.

The second device isolation patterns ST2 may be substantially connected to the first device isolation patterns ST1 to form a single insulating pattern. The second device isolation patterns ST2 may be thicker than the first device isolation patterns ST1. In this case, the first device isolation patterns ST1 and the second device isolation patterns ST2 may be formed by different processes. As an example, the first and second device isolation patterns ST1 and ST2 may be formed of or include a silicon oxide layer.

Gate electrodes GE may be provided on the first and second active patterns FN1 and FN2 to extend in the first direction D1 and to cross the first and second active patterns FN1 and FN2. The gate electrodes GE may be spaced apart from each other in the second direction D2. Each of the gate electrodes GE may extend in the first direction D1 and cross the PMOSFET region PR, the second device isolation patterns ST2, and the NMOSFET region NR.

In exemplary embodiments of the present inventive concept, dummy gate electrodes DM may be respectively provided on a boundary between a first standard cell STDC1 and a second standard cell STDC2 and on a boundary between the second standard cell STDC2 and a third standard cell STDC3. Each of the dummy gate electrodes DM may be divided into two electrodes, by the second device isolation pattern ST2, but the present inventive concept may not be limited thereto. The dummy gate electrodes DM may have substantially the same structure as the gate electrodes GE and may be formed of substantially the same material as the gate electrodes GE. In a circuit, the dummy gate electrodes DM may serve as a conductive line, of a transistor.

A gate insulating pattern GI may be provided below each of the gate electrodes GE, and gate spacers GS may be provided at both sides of each of the gate electrodes GE. Furthermore, a capping pattern CP may be provided to cover a top surface of each of the gate electrodes GE. However, in exemplary embodiments of the present inventive concept, the capping pattern CP may be partially removed from a portion of the top surface of the gate electrode GE, to which a gate contact GC to be described below is connected. The gate insulating pattern GI may be vertically extended to cover both sidewalls of the gate electrode GE. For example, the gate insulating pattern GI may be interposed between the gate electrode GE and the gate spacer GS. First to third interlayer insulating layers 110-130 may be provided to cover the first and second active patterns FN1 and FN2 and the gate electrodes GE.

The gate electrodes GE may be formed of or include doped semiconductor materials, conductive metal nitrides, or metals. The gate insulating pattern GI may be formed of or include a silicon oxide layer, a silicon oxynitride layer, or high-k dielectric materials, whose dielectric constants are lower than that of silicon oxide. Each of the capping pattern CP and the gate spacers GS may include a silicon oxide layer, a silicon nitride layer, or a silicon oxynitride layer. Each of the first to third interlayer insulating layers 110-130 may include a silicon oxide layer or a silicon oxynitride layer.

Source/drain regions SD may be provided on or in the upper portions of the first and second active patterns FN1 and FN2. The source/drain regions SD on the PMOSFET region PR may be p-type impurity regions, and the source/drain regions SD on the NMOSFET region NR may be n-type impurity regions. Channel regions AF may be provided in the upper portion of each of the first and second active patterns FN1 and FN2 that are overlapped with the gate electrodes GE, respectively. Each of the channel regions AF may be interposed between the source/drain regions SD.

The source/drain regions SD may be epitaxial patterns formed by a selective epitaxial growth process. Accordingly, the source/drain regions SD may have top surfaces positioned at a higher level than those of the channel regions AF. The source/drain regions SD may include a semiconductor element different from those of the substrate 100. As an example, the source/drain regions SD may be formed of or include a semiconductor material having a lattice constant different from (for example, greater or smaller than) the substrate 100. Accordingly, the source/drain regions SD may exert a compressive stress or a tensile stress on the channel regions AF.

Lower conductive structures TS may be provided on the PMOSFET and NMOSFET regions PR and NR between the gate electrodes GE. The lower conductive structures TS may be a pattern that is formed in accordance with the lower conductive patterns LP of FIG. 13. The lower conductive structures TS may be provided in the first interlayer insulating layer 110 and may be directly connected to the source/drain regions SD. The lower conductive structures TS may extend in the first direction D1. Each of the lower conductive structures TS may be partially overlapped with a first or second power interconnection line PL1 or PL2, when viewed in a plan view. The lower conductive structures TS may have top surfaces that are substantially coplanar with that of the first interlayer insulating layer 110. In the present embodiment, each of the lower conductive structures TS are illustrated to be in contact with a plurality of the source/drain regions SD, but the present inventive concept may not be limited thereto. As an example, at least one of the lower conductive structures TS may be in contact with one or two of the source/drain regions SD. The lower conductive structures TS may be formed of or include doped semiconductor materials, conductive metal nitrides, metals, or metal silicides.

Conductive structures GC, AC, and CP1-CP8 may be provided in the second interlayer insulating layer 120. The conductive structures GC, AC, and CP1-CP8 may include gate contacts GC, active contacts AC, and first to eighth conductive structures CP1-CP8. The conductive structures GC, AC, and CP1-CP8 may be patterns that are formed in accordance with the connection patterns M0a-M0h, the active contact patterns CAa-CAl, and the gate contact patterns CBa-CBh of FIG. 13. The conductive structures GC, AC, and CP1-CP8 may include conductive metal nitrides or metals.

The conductive structures GC, AC, and CP1-CP8 may have top surfaces that are substantially coplanar with that of the second interlayer insulating layer 120. In addition, the active contacts AC may have bottom surfaces that are substantially coplanar with that of the second interlayer insulating layer 120. The bottom surfaces of the gate contacts GC may be lower than that of the second interlayer insulating layer 120. In other words, the bottom surfaces of the gate contacts GC may be lower than those of the active contacts AC. The first to eighth conductive structures CP1-CP8 will be described in more detail below.

Barrier patterns BL may be respectively interposed between the second interlayered insulating layer 120 and the conductive structures GC, AC, and CP1-CP8. The barrier pattern BL may directly cover side and bottom surfaces of the conductive structures GC, AC, and CP1-CP8, except for top surfaces thereof. The barrier patterns BL may include a metal nitride for preventing metallic elements in the conductive structures GC, AC, and CP1-CP8 from being diffused. For example, the barrier patterns BL may be formed of or include TiN.

First and second power interconnection lines PL1 and PL2 and first to sixth interconnection lines ML1-ML6 may be provided in the third interlayer insulating layer 130. The first and second power interconnection lines PL1 and PL2 may be patterns that are formed in accordance with the power lines PM1 and PM2 of FIG. 13, and the first to sixth interconnection lines ML1-ML6 may be patterns that are formed in accordance with the conductive lines M1a-M1f of FIG. 13.

Each of the first and second power interconnection lines PL1 and PL2 and each of the first to sixth interconnection lines ML1-ML6 may include a line portion LI extending parallel to the top surface of the substrate 100 and a contact portion VI, which is vertically connected to the conductive structures GC, AC, and CP1-CP8. The contact portion VI may be a pattern that is formed in accordance with the via pattern V0 of FIG. 13.

Barrier patterns BL may be respectively interposed between the third interlayer insulating layer 130 and the first and second power interconnection lines PL1 and PL2 and between the third interlayer insulating layer 130 and the first to sixth interconnection lines ML1-ML6. The barrier patterns BL may include a metal nitride for preventing metallic elements from being diffused. For example, the barrier patterns BL may be formed of or include TiN.

The first standard cell STDC1 will be described with reference to FIGS. 16 and 17A to 17E. A pair of the active contacts AC may be provided on the lower conductive structures TS disposed below the first or second power interconnection line PL1 or PL2. In other words, when viewed in a sectional view, the pair of active contacts AC may be interposed between the first or second power interconnection line PL1 and PL2 and the lower conductive structures TS. The pair of active contacts AC may be patterns that are formed in accordance with the pair of first active contact patterns CAa of FIG. 13. The pair of active contacts AC may be electrically connected to the first and second power interconnection lines PL1 and PL2. A power or ground voltage applied to the first and second power interconnection lines PL1 and PL2 may be applied to the lower conductive structures TS through the pair of active contacts AC (e.g., see FIG. 17D). Here, since, when viewed in a plan view, the lower conductive structures TS may be overlapped with the first and second power interconnection lines PL1 and PL2, the power or ground voltage may be applied to the lower conductive structures TS through a vertical and straight current path.

The gate contact GC may be provided on at least one gate electrode GE of the first standard cell STDC1. The gate contact GC may be provided on the second device isolation pattern ST2 between the PMOSFET region PR and the NMOSFET region NR. The gate contact GC may be a pattern that is formed in accordance with the first gate contact pattern CBa of FIG. 13. The first interconnection line ML1 may be provided on and connected to the gate contact GC. For example, the first interconnection line ML1 and the gate electrode GE may be electrically connected to each other through the gate contact GC.

A pair of the first conductive structures CP1 may be provided on the PMOSFET region PR and the NMOSFET region NR of the first standard cell STDC1, respectively. The pair of first conductive structures CP1 may be patterns that are formed in accordance with the pair of first conductive patterns CL1 of FIG. 13. Each of the first conductive structures CP1 may include a first portion P1 and a second portion P2.

The first portion P1 may be a pattern that is formed in accordance with the first connection pattern M0a of FIG. 13, and the second portion P2 may be a pattern that is formed in accordance with the second active contact pattern CAb of FIG. 13. For example, the second portion P2 may be connected to the lower conductive structure TS, and the first portion P1 may extend from the second portion P2 in a direction parallel to a top surface of the substrate 100.

The first conductive structures CP1 may be similar to the conductive structure CP previously described with reference to FIG. 4. However, the semiconductor device according to the present embodiment may further include the lower conductive structure TS provided between the active regions AR and the first conductive structures CP1. For example, the first portion P1 and the second portion P2 may have top surfaces that are substantially coplanar with each other, but a bottom surface of the first portion P1 may be higher than that of the second portion P2. The bottom surface of the second portion P2 may be positioned at substantially the same height as those of the active contacts AC.

The second interconnection line ML2 may be provided on and connected to the first conductive structures CP1. In other words, the second interconnection line ML2 and the lower conductive structures TS may be electrically connected to each other through the first conductive structures CP1. In addition, the source/drain regions SD on the PMOSFET region PR may be electrically connected to the source/drain regions SD on the NMOSFET region NR through the lower conductive structures TS, the first conductive structures CP1, and the second interconnection line ML2.

The second conductive structures CP2 provided at an interface between the first standard cell STDC1 and the second standard cell STDC2 will be described with reference to FIGS. 16 and 17F to 17H. A pair of the second conductive structures CP2 may be provided on the PMOSFET region PR and the NMOSFET region NR, respectively.

The pair of second conductive structures CP2 may be patterns that are formed in accordance with the pair of second conductive patterns CL2 of FIG. 13. Each of the second conductive structures CP2 may include a first portion P1, a second portion P2, and a third portion P3.

The first portion P1 may be a pattern that is formed in accordance with the second connection pattern M0b of FIG. 13, the second portion P2 may be a pattern that is formed in accordance with the third active contact pattern CAc of FIG. 13, and the third portion P3 may be a pattern that is formed in accordance with the second gate contact pattern CBb of FIG. 13. For example, the second portion P2 may be connected to the lower conductive structure TS, and the third portion P3 may be connected to the gate electrode GE. The first portion P1 may extend in a direction parallel to a top surface of the substrate 100 and connect the second portion P2 and the third portion P3 to each other.

The second conductive structures CP2 may be similar to the conductive structure CP previously described with reference to FIG. 8. For example, the first portion P1, the second portion P2, and the third portion P3 may have top surfaces that are substantially coplanar with each other. However, the first portion P1, the second portion P2, and the third portion P3 may have bottom surfaces that are positioned at different heights. For example, the bottom surface of the second portion P2 may be higher than that of the third portion P3, and the bottom surface of the first portion P1 may be higher than that of the second portion P2. The bottom surface of the third portion P3 may be positioned at the same height as bottom surfaces of the gate contacts GC.

The first and second power interconnection lines PL1 and PL2 may be connected to the second conductive structures CP2, respectively, through the second portions P2. In other words, the first and second power interconnection lines PL1 and PL2 may be electrically connected to the lower conductive structures TS and the gate electrodes GE through the second conductive structures CP2.

The second standard cell STDC2 will be described with reference to FIGS. 16 and 17I to 17M. A pair of the third conductive structures CP3 may be provided to be adjacent to each of the pair of second conductive structures CP2. The pair of third conductive structures CP3 may be provided on the PMOSFET region PR and the NMOSFET region NR, respectively. The pair of third conductive structures CP3 may be patterns that are formed in accordance with the pair of third conductive patterns CL3 of FIG. 13. Each of the third conductive structures CP3 may include a first portion P1 and a pair of second portions P2.

The first portion P1 may be a pattern that is formed in accordance with the third connection pattern M0c of FIG. 13, and the second portions P2 may be patterns that are respectively formed in accordance with the fourth active contact pattern CAd and the fifth active contact pattern CAe of FIG. 13. For example, the pair of second portions P2 may be respectively connected to a pair of the lower conductive structures TS, which are disposed to be adjacent to each other with the gate electrode GE interposed therebetween. The first portion P1 may extend parallel to the top surface of the substrate 100 and may connect the second portions P2 to each other.

The third conductive structures CP3 may be similar to the conductive structure CP previously described with reference to FIG. 10. For example, the first portion P1 and the second portions P2 may have top surfaces that are substantially coplanar with each other, but a bottom surface of the first portion P1 may be higher than that of the second portions P2. Since the bottom surface of the first portion P1 is higher than top surfaces of the lower conductive structures TS and a top surface of the gate electrode GE, the third conductive structure CP3 may electrically connect the lower conductive structures TS, which are spaced apart from each other in the second direction D2, to each other. This way, the gate electrode GE is not short circuited. In other words, the third conductive structures CP3 may each serve as a jumper for electrically connecting the source/drain regions SD that are separated from each other in the second direction D2.

A fourth conductive structure CP4 may be provided on an adjacent pair of the gate electrodes GE of the second standard cell STDC2. The fourth conductive structure CP4 may be provided on a second device isolation pattern ST2 between the PMOSFET and NMOSFET regions PR and NR. The fourth conductive structure CP4 may be a pattern that is formed in accordance with the fourth conductive pattern CL4 of FIG. 13. The fourth conductive structure CP4 may include a first portion P1 and a pair of third portions P3.

The first portion P1 may be a pattern that is formed in accordance with the fourth connection pattern M0d of FIG. 13, and the third portions P3 may be patterns that are respectively formed in accordance with the third gate contact pattern CBc and the fourth gate contact pattern CBd of FIG. 13. For example, the pair of third portions P3 may be connected to the pair of gate electrodes GE, respectively. The first portion P1 may extend parallel to the top surface of the substrate 100 and may connect the third portions P3 to each other.

The fourth conductive structure CP4 may be similar to the conductive structure CP previously described with reference to FIG. 12. For example, the first portion P1 and the third portions P3 may have top surfaces that are substantially coplanar with each other, but a bottom surface of the first portion P1 may be higher than that of the third portions P3. Since the bottom surface of the first portion P1 is higher than the top surfaces of the lower conductive structures TS, the third conductive structure CP3 may connect the pair of gate electrodes GE electrically to each other, without shorting the lower conductive structures TS adjacent thereto.

The third interconnection line ML3 may be provided on and connected to the fourth conductive structure CP4. When viewed in a plan view, the third interconnection line ML3 may be spaced apart from the pair of gate electrodes GE in the second direction D2. When the third interconnection line ML3 is not overlapped with at least one of the pair of gate electrodes GE in a plan view, the third interconnection line ML3 may be electrically connected to the pair of gate electrodes GE through the first portion P1.

A pair of the active contacts AC may be respectively provided on the PMOSFET region PR and the NMOSFET region NR to be adjacent to the fourth conductive structure CP4. The pair of active contacts AC may be patterns that are formed in accordance with the pair of sixth active contact patterns CAf of FIG. 13.

The fourth interconnection line ML4 may be provided on and connected to the pair of active contacts AC. When viewed in a plan view, the fourth interconnection line ML4 may cross the fourth conductive structure CP4 and extend in the first direction D1. Since a bottom surface of the line portion LI of the fourth interconnection line ML4 is higher than a top surface of the fourth conductive structure CP4, the fourth interconnection line ML4 may be vertically separated from the fourth conductive structure CP4.

The fifth conductive structures CP5, which are provided at an interface between the second standard cell STDC2 and the third standard cell STDC3, will be described with reference to FIGS. 16 and 17N. A pair of the fifth conductive structures CP5 may be provided on the PMOSFET region PR and the NMOSFET region NR, respectively. The pair of fifth conductive structures CP5 may be patterns that are formed in accordance with the pair of fifth conductive patterns CL5 of FIG. 13. Each of the fifth conductive structures CP5 may include a first portion P1, second portions P2, and a third portion P3.

The first portion P1 may be a pattern that is formed in accordance with the fifth connection pattern M0e of FIG. 13, the second portions P2 may be patterns that are respectively formed in accordance with the seventh active contact pattern CAg and the eighth active contact pattern CAh of FIG. 13, and the third portion P3 may be a pattern that is formed in accordance with the fifth gate contact pattern CBe of FIG. 13. For example, the second portions P2 may be connected to a pair of the lower conductive structures TS that are adjacent to each other, and the third portion P3 may be connected to the gate electrode GE between the pair of lower conductive structures TS. In other words, when viewed in a plan view, the third portion P3 may be interposed between the second portions P2. One of the second portions P2 may extend farther in the first direction D1, compared with the other, and thus, it may be overlapped with the first or second power interconnection line PL1 and PL2, when viewed in a plan view. The first portion P1 may extend the second direction D2 and may connect the second portions P2 and the third portion P3 to each other. Except that a plurality of second portions P2 are provided, the fifth conductive structures CP5 may be similar to the second conductive structures CP2 described above.

The third standard cell STDC3 will be described with reference to FIGS. 16 and 17O to 17R. A first gate group GG1 and a second gate group GG2 may be provided on the third standard cell STDC3. Each of the first and second gate groups GG1 and GG2 may include a pair of the gate electrodes GE that are disposed to be adjacent to each other. Furthermore, the first gate group GG1 and the second gate group GG2 may be adjacent to each other.

A pair of the gate contacts GC may be provided on the pair of gate electrodes GE, respectively, of the first gate group GG1. Furthermore, a sixth conductive structure CP6 may be provided on the second gate group GG2. The pair of gate contacts GC may be patterns that are respectively formed in accordance with the sixth gate contact pattern CBf and the seventh gate contact pattern CBg of FIG. 13. The sixth conductive structure CP6 may be a pattern that is formed in accordance with the sixth conductive pattern CL6 of FIG. 13. The sixth conductive structure CP6 may include a first portion P1 and a third portion P3.

The first portion P1 may be a pattern that is formed in accordance with the sixth connection pattern M0f of FIG. 13, and the third portion P3 may be a pattern that is formed in accordance with the eighth gate contact pattern CBh of FIG. 13. The third portion P3 may extend in the second direction D2 and may be connected to both of the pair of gate electrodes GE of the second gate group GG2. The first portion P1 of the sixth conductive structure CP6 may include a first extended portion HP1 extending in the second direction D2 and a second extended portion HP2 extending in the first direction D1. The first extended portion HP1 may be overlapped with the third portion P3. In this case, the first extended portion HP1 and the third portion P3 may be connected to each other to constitute a single body.

A fifth interconnection line ML5 may be provided on the pair of gate contacts GC, and a sixth interconnection line ML6 may be provided on the sixth conductive structure CP6. The fifth interconnection line ML5 may include a first region extending in the first direction D1 and a second region extending from the first region in the second direction D2. The second region of the fifth interconnection line ML5 may be overlapped with the pair of gate contacts GC, when viewed in a plan view. The fifth interconnection line ML5 may be connected to the pair of gate contacts GC through the second region.

The second extended portion HP2 of the sixth conductive structure CP6 may be partially overlapped with the sixth interconnection line ML6, when viewed in a plan view. The sixth interconnection line ML6 may be connected to the sixth conductive structure CP6 through the second extended portion HP2.

A seventh conductive structure CP7 may be provided on the NMOSFET region NR to be adjacent to the pair of gate contacts GC and the sixth conductive structure CP6. The seventh conductive structure CP7 may be a pattern that is formed in accordance with the seventh conductive pattern CL7 of FIG. 13. The seventh conductive structure CP7 may include a first portion P1 and a pair of second portions P2. The seventh conductive structure CP7 may be similar to the third conductive structure CP3 described above.

The first portion P1 may be a pattern that is formed in accordance with the seventh connection pattern M0g of FIG. 13, and the second portions P2 may be patterns that are respectively formed in accordance with the ninth active contact pattern CAi and the tenth active contact pattern CAj of FIG. 13. The second portions P2 may be spaced apart from each other with at least one of the gate electrodes GE interposed therebetween. The first portion P1 of the seventh conductive structure CP7 may include a first extended portion HP1 extending in the second direction D2 and a pair of second extended portions HP2 extending in the first direction D1. The pair of second extended portions HP2 may be overlapped with the pair of second portions P2, respectively. In other words, the first portion P1 may connect the pair of second portions P2 to each other.

An eighth conductive structure CP8 may be provided to be adjacent to the seventh conductive structure CP7. The eighth conductive structure CP8 may extend from the PMOSFET region PR to the NMOSFET region NR. The eighth conductive structure CP8 may be a pattern that is formed in accordance with the eighth conductive pattern CL8 of FIG. 13. The eighth conductive structure CP8 may include a first portion P1 and a pair of second portions P2.

The first portion P1 may be a pattern that is formed in accordance with the eighth connection pattern M0h of FIG. 13, and the second portions P2 may be patterns that are respectively formed in accordance with the eleventh and twelfth active contact patterns CAk and CAl of FIG. 13.

For example, the second portions P2 may be connected to the lower conductive structure TS on the PMOSFET region PR and the lower conductive structure TS on the NMOSFET region NR, respectively. As an example, the second portion P2 on the PMOSFET region PR may be overlapped with the sixth interconnection line ML6, when viewed in a plan view.

The first portion P1 of the eighth conductive structure CP8 may include a pair of first extended portions HP1 extending in the second direction D2 and a second extended portion HP2 extending in the first direction D1. The pair of first extended portions HP1 may be overlapped with the pair of second portions P2, respectively. For example, the first extended portion HP1 on the PMOSFET region PR may be provided to cross at least one of the gate electrodes GE. In other words, the first portion P1 may connect the pair of second portions P2 to each other. As a result, the source/drain regions SD on the PMOSFET region PR and the source/drain regions SD on the NMOSFET region NR may be electrically connected to each other through the lower conductive structures TS and the eighth conductive structure CP8.

In the case of the first conductive structures CP1 described above, the source/drain regions SD on the PMOSFET region PR and the source/drain regions SD on the NMOSFET region NR may be connected to each other in the first direction D1 through the second interconnection line ML2. In the case of the eighth conductive structure CP8, the source/drain regions SD on the PMOSFET region PR and the source/drain regions SD on the NMOSFET region NR may be electrically connected to each other in the first direction D1 through the first portion P1 of the eighth conductive structure CP8.

A seventh interconnection line ML7 may be provided on the eighth conductive structure CP8. The second extended portion HP2 of the eighth conductive structure CP8 may be partially overlapped with the seventh interconnection line ML7, when viewed in a plan view. The seventh interconnection line ML7 may be connected to the eighth conductive structure CP8 through the second extended portion HP2.

Figure 18A:
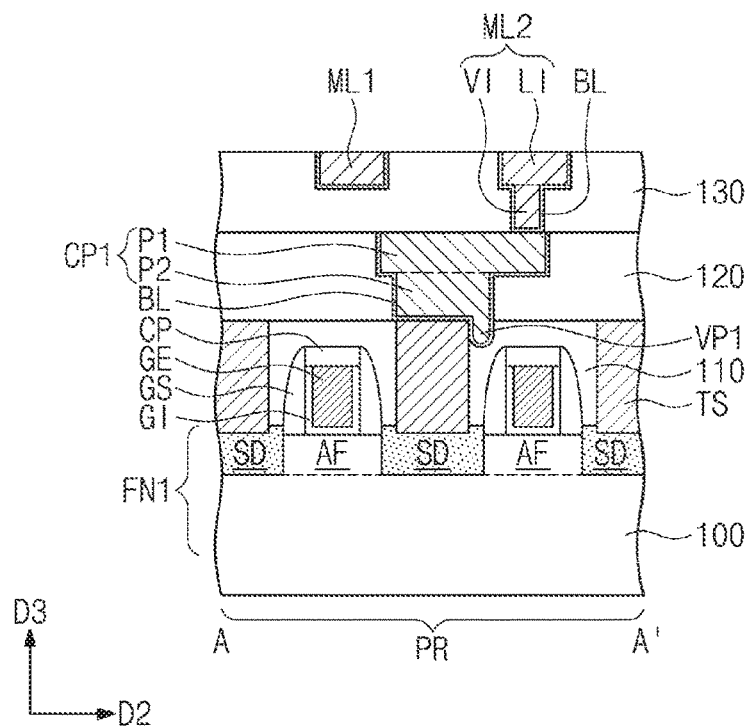
FIGS. 18A and 18B are sectional views taken along the line A-A' of FIG. 16 to illustrate a semiconductor device according to exemplary embodiments of the present inventive concept.
Figure 18B:
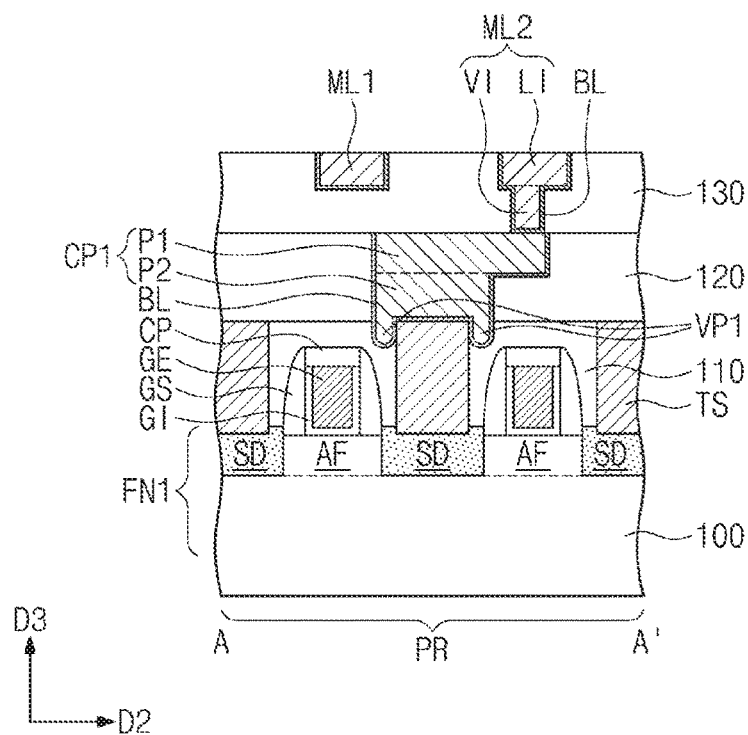
Figure 18C:
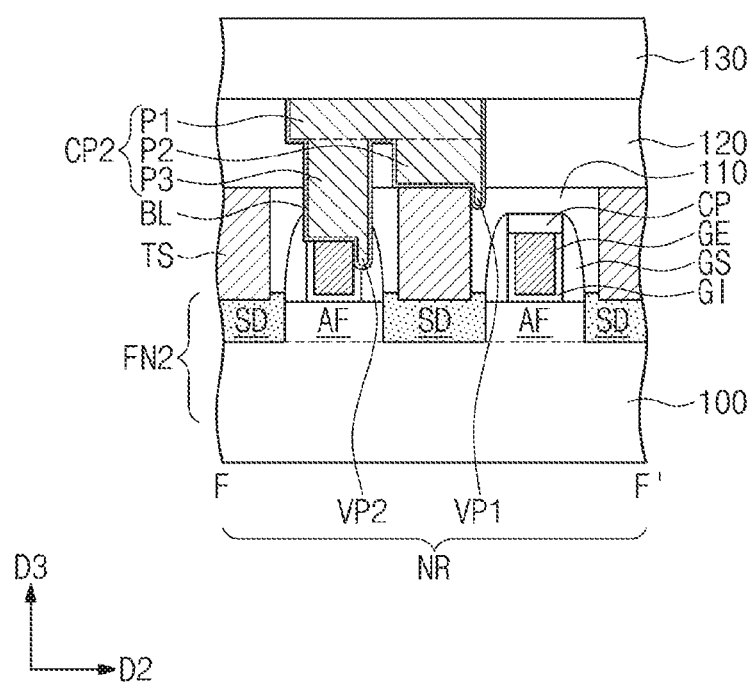
FIG. 18C is a sectional view taken along the line F-F' of FIG. 16 to illustrate a semiconductor device according to exemplary embodiments of the present inventive concept.

FIGS. 18A and 18B are sectional views taken along line A-A' of FIG. 16 to illustrate a semiconductor device according to exemplary embodiments of the present inventive concept. FIG. 18C is a sectional view taken along line F-F' of FIG. 16 to illustrate a semiconductor device according to exemplary embodiments of the present inventive concept. In the following description of the present embodiment, an element previously described with reference to FIG. 16 and FIGS. 17A through 17P may not be described in much further detail for the sake of brevity.

Referring to FIGS. 16 and 18A, a first conductive structure CP1 may be provided. Unlike the first conductive structure CP1 of FIG. 17A, the first conductive structure CP1 may further include a first vertically-extended portion VP1. For example, a second portion P2 of the first conductive structure CP1 may include the first vertically-extended portion VP1 vertically extending toward a substrate 100. The first vertically-extended portion VP1 may be provided to cover an upper portion of a sidewall of a lower conductive structure TS. A bottom surface of the first vertically-extended portion VP1 may be lower than a top surface of the lower conductive structure TS. When viewed in a plan view, the first vertically-extended portion VP1 may be overlapped with a first portion P1 of the first conductive structure CP1.

Referring to FIGS. 16 and 18B, a first conductive structure CP1 may be provided. Unlike the first conductive structure CP1 of FIG. 17A, the first conductive structure CP1 may further include a pair of first vertically-extended portions VP1. For example, a second portion P2 of the first conductive structure CP1 may include the pair of first vertically-extended portions VP1 vertically extending toward a substrate 100. The pair of first vertically-extended portions VP1 may be provided to cover upper portions of both sidewalls of the lower conductive structure TS. Bottom surfaces of the first vertically-extended portions VP1 may be lower than a top surface of the lower conductive structure TS. When viewed in a plan view, the first vertically-extended portions VP1 may be overlapped with a first portion P1 of the first conductive structure CP1.

Referring to FIGS. 16 and 18C, a second conductive structure CP2 may be provided. Unlike the second conductive structure CP2 of FIG. 17F, the second conductive structure CP2 may further include a first vertically-extended portion VP1 and a second vertically-extended portion VP2. For example, a second portion P2 of the second conductive structure CP2 may include the first vertically-extended portion VP1 vertically extending toward a substrate 100, and a third portion P3 of the second conductive structure CP2 may include the second vertically-extended portion VP2 vertically extending toward the substrate 100. The first vertically-extended portion VP1 may be provided to cover an upper portion of a sidewall of a lower conductive structure TS. A bottom surface of the first vertically-extended portion VP1 may be lower than a top surface of the lower conductive structure TS. The second vertically-extended portion VP2 may be provided to cover an upper portion of a sidewall of a gate electrode GE. A bottom surface of the second vertically-extended portion VP2 may be lower than a top surface of the gate electrode GE. When viewed in a plan view, the first and second vertically-extended portions VP1 and VP2 may be overlapped with a first portion P1 of the second conductive structure CP2.

Figure 28A:
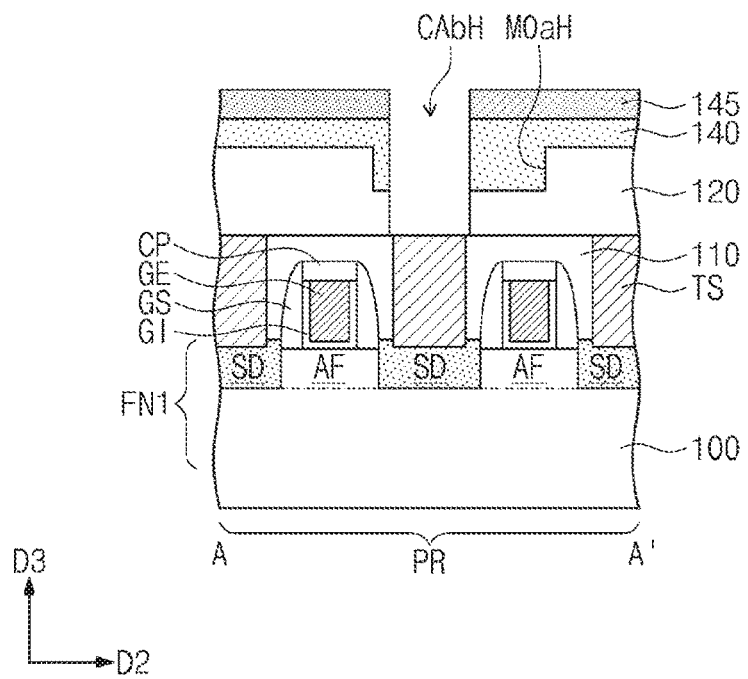
Figure 28B:
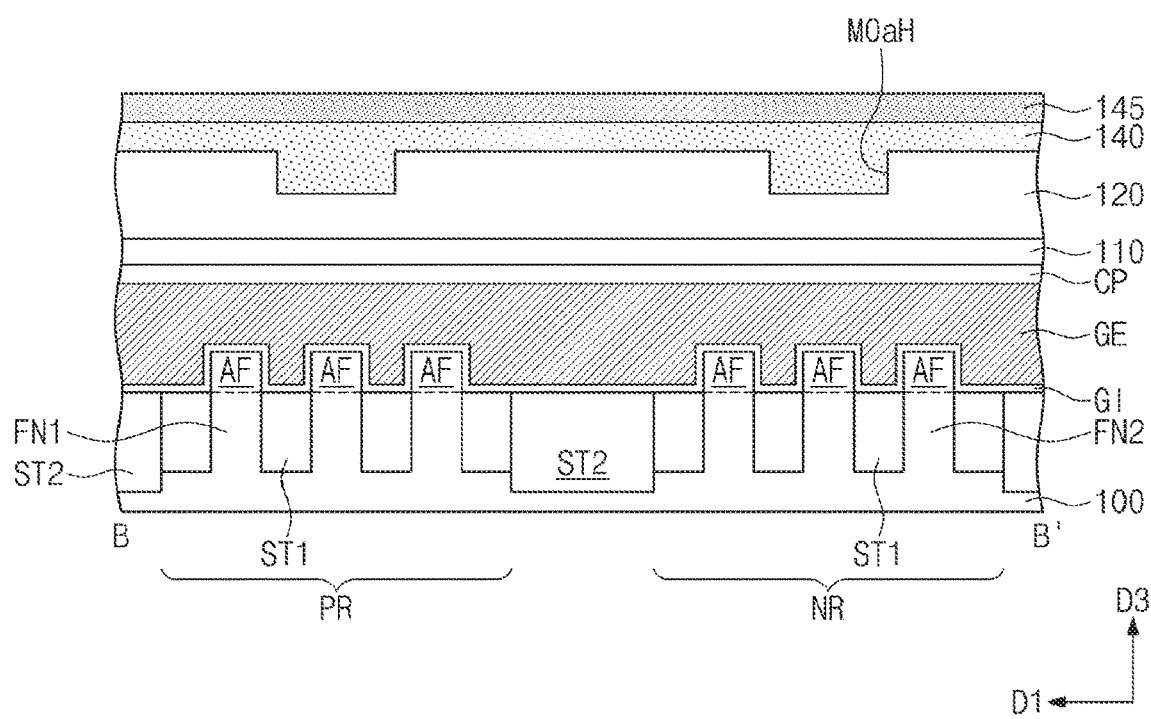
Figure 28C:
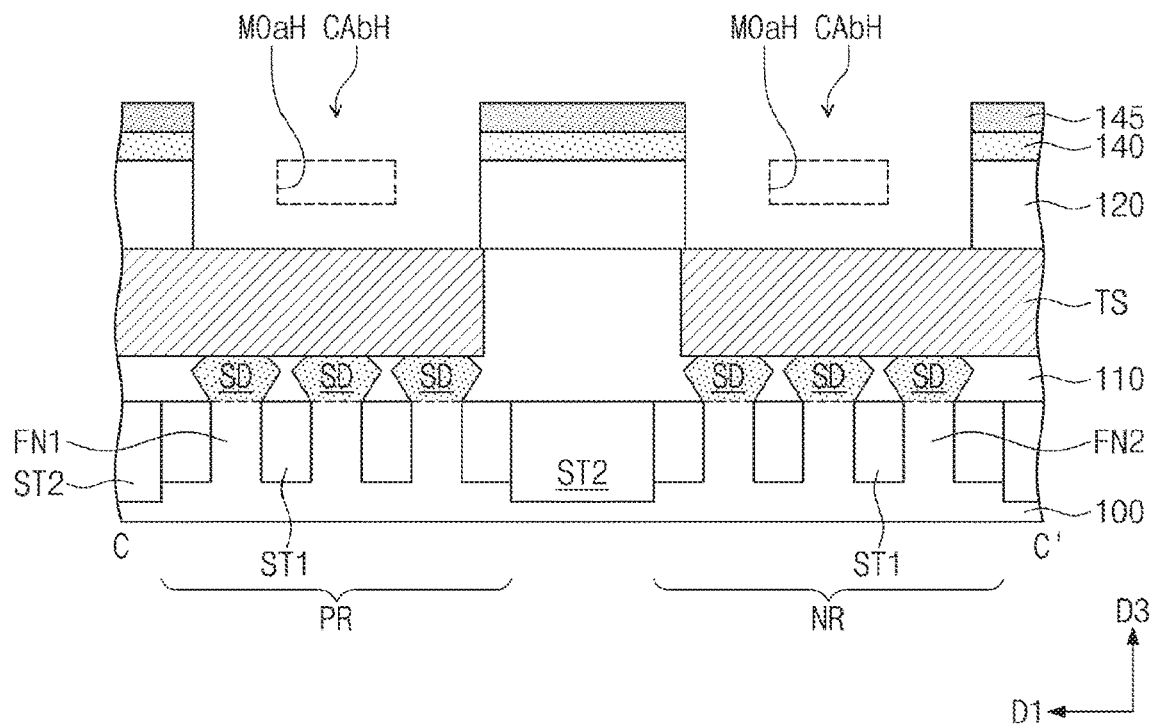
Figure 28D:
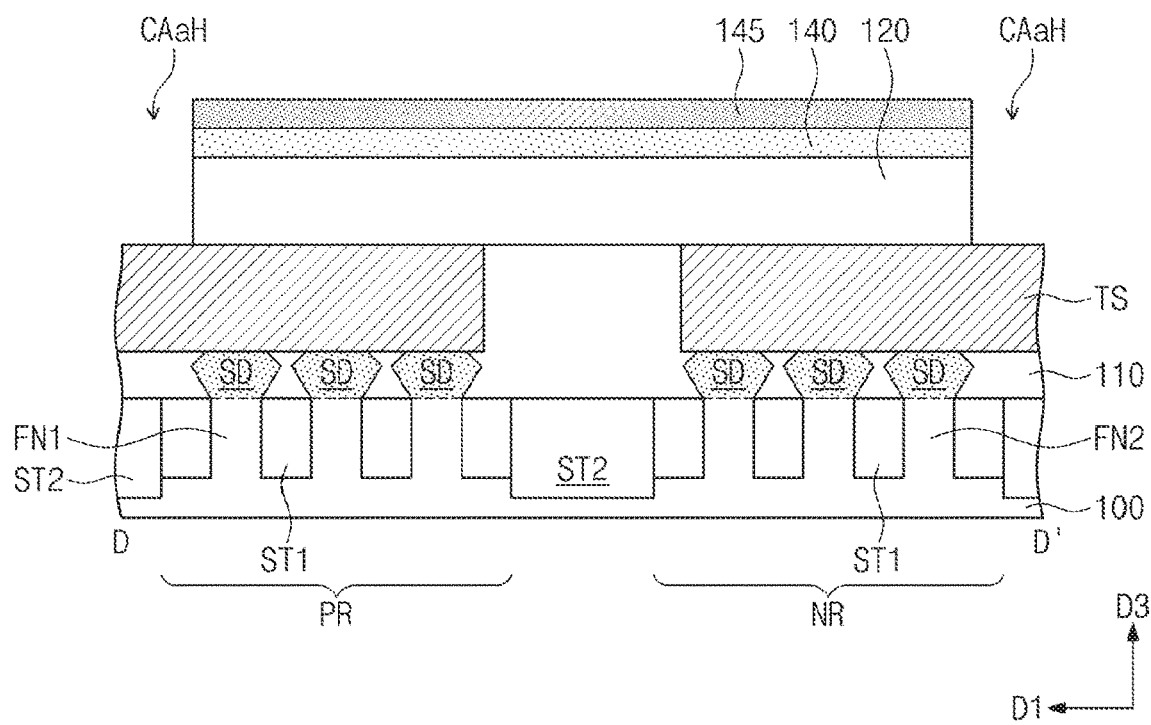
FIGS. 28D, 30D, and 32D are sectional views taken along lines D-D' of FIGS. 27, 29, and 31, respectively, according to exemplary embodiments of the preset inventive concept.
Figure 29:
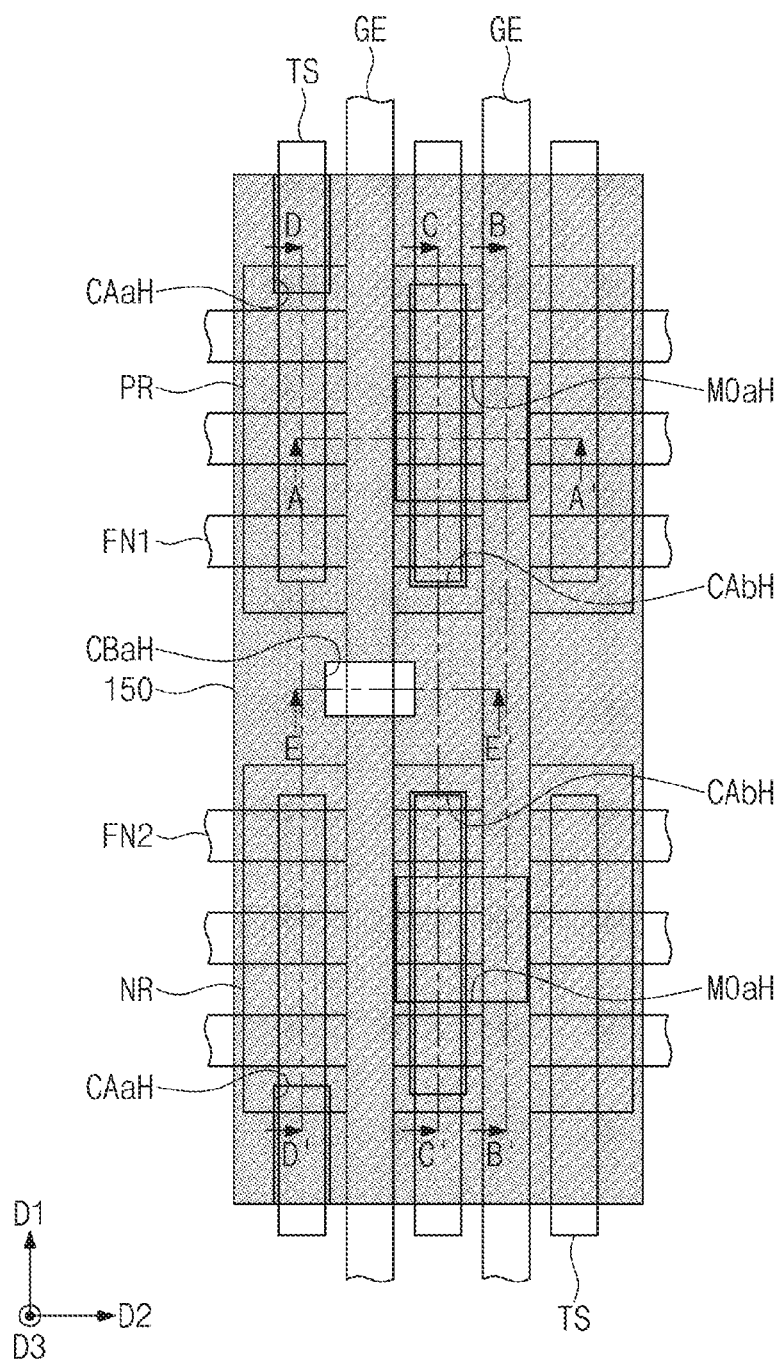
Figure 30A:
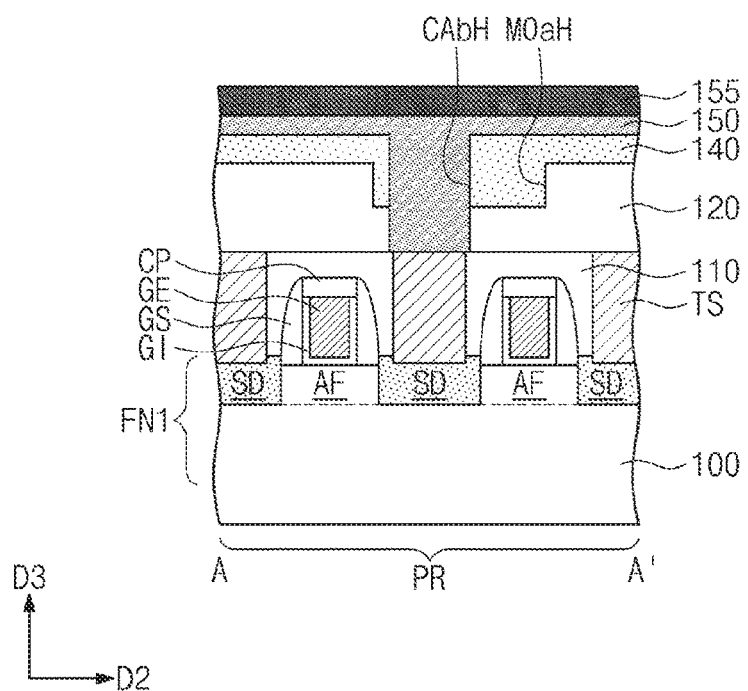
Figure 30B:
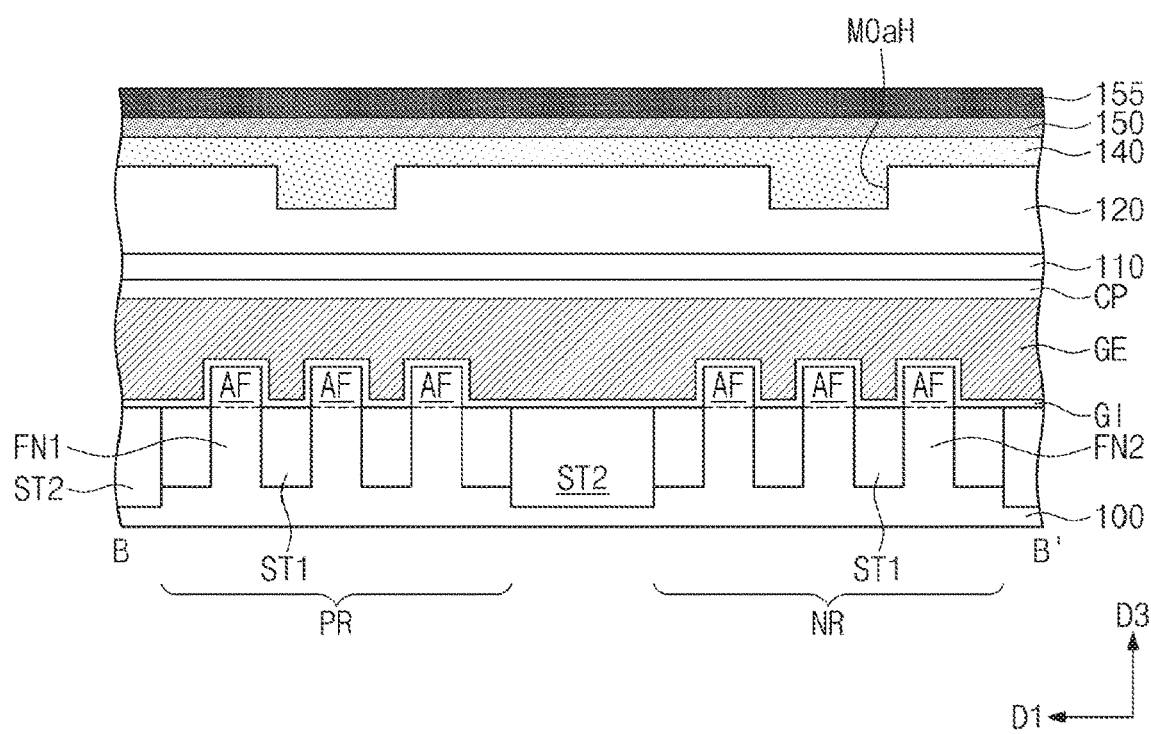
Figure 30C:
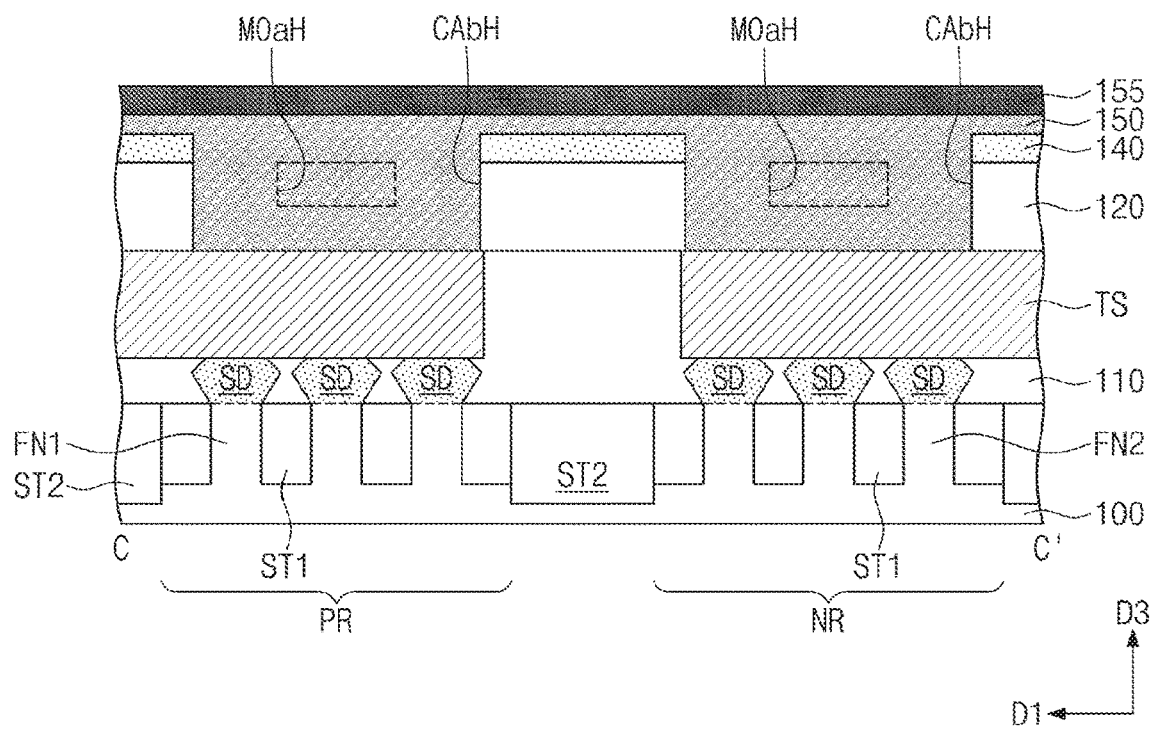
Figure 30D:
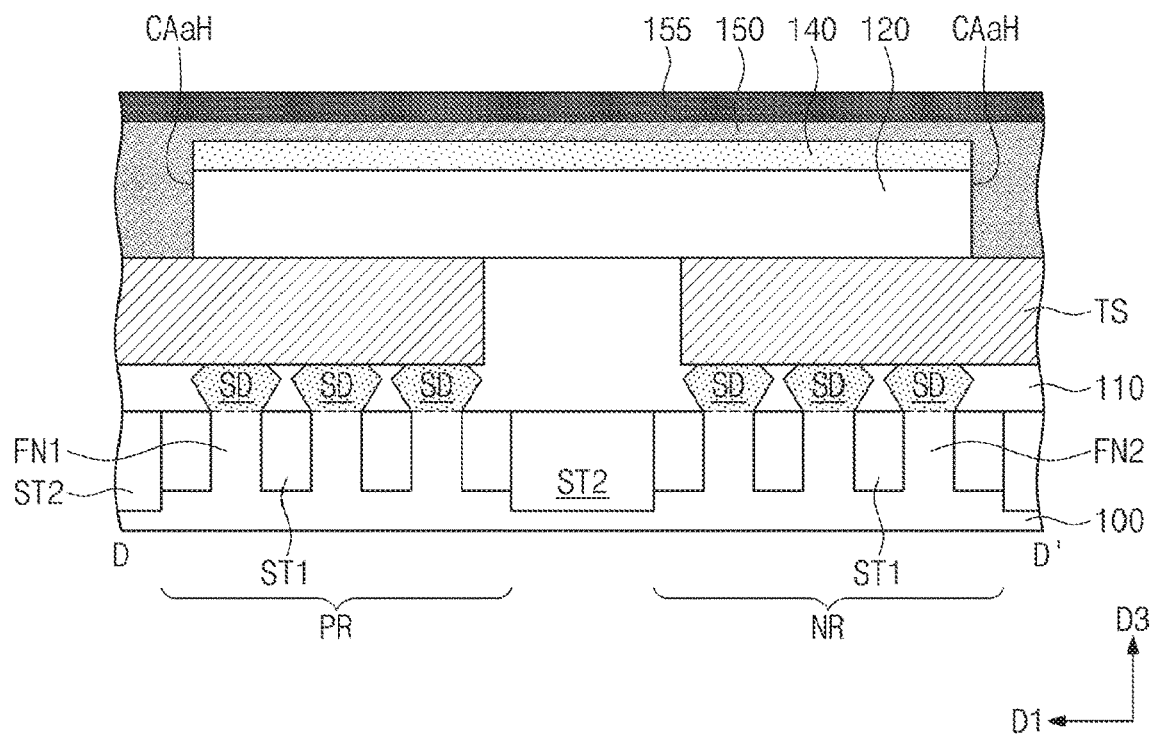
Figure 30E:
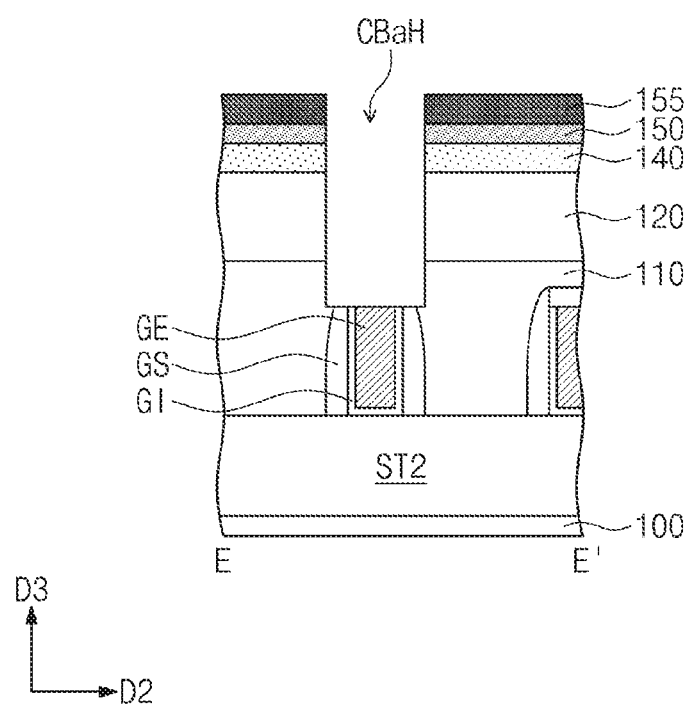
FIGS. 30E and 32E are sectional views taken along lines E-E' of FIGS. 29 and 31, respectively, according to exemplary embodiments of the preset inventive concept.
Figure 31:
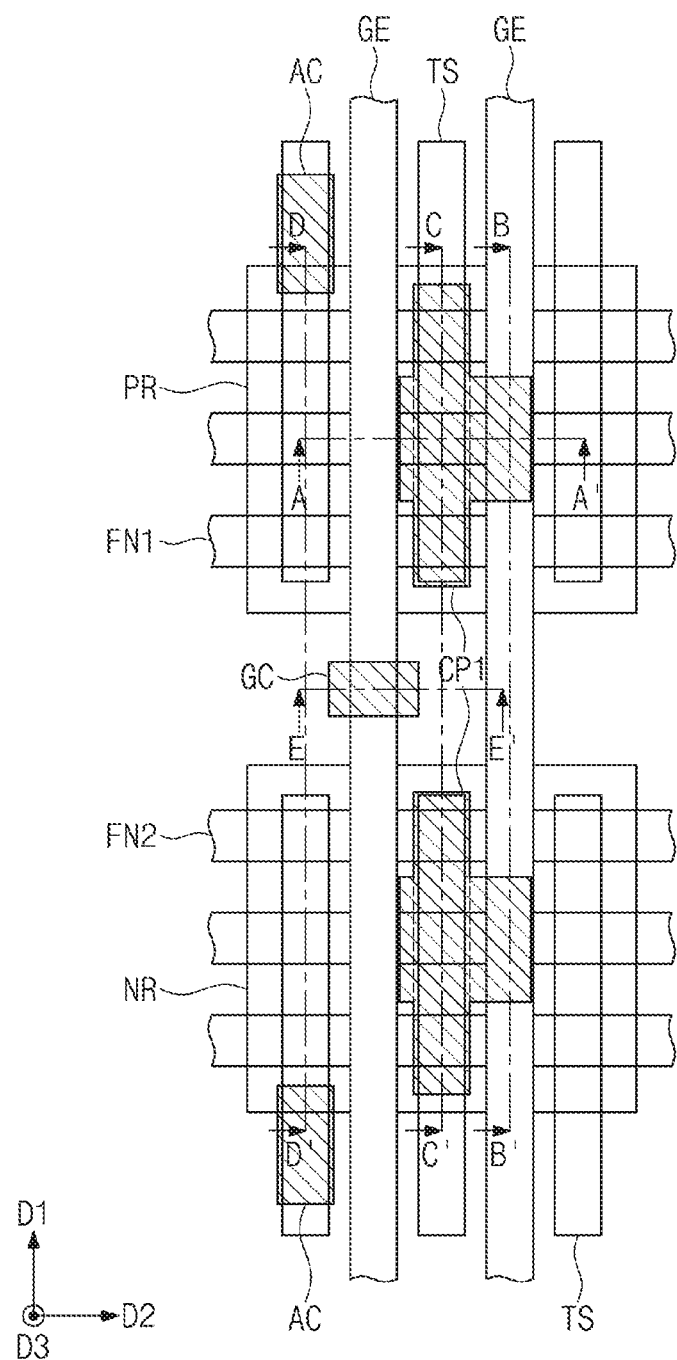
Figure 32A:
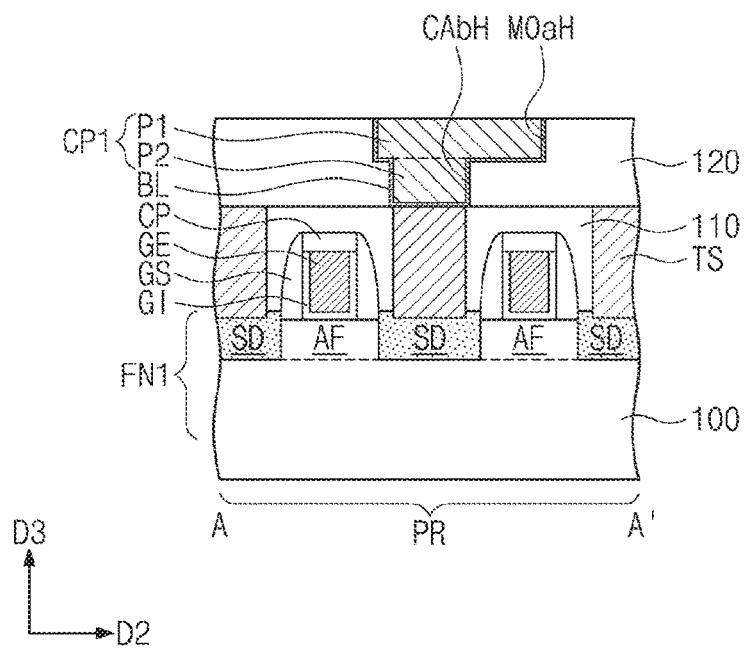
Figure 32B:
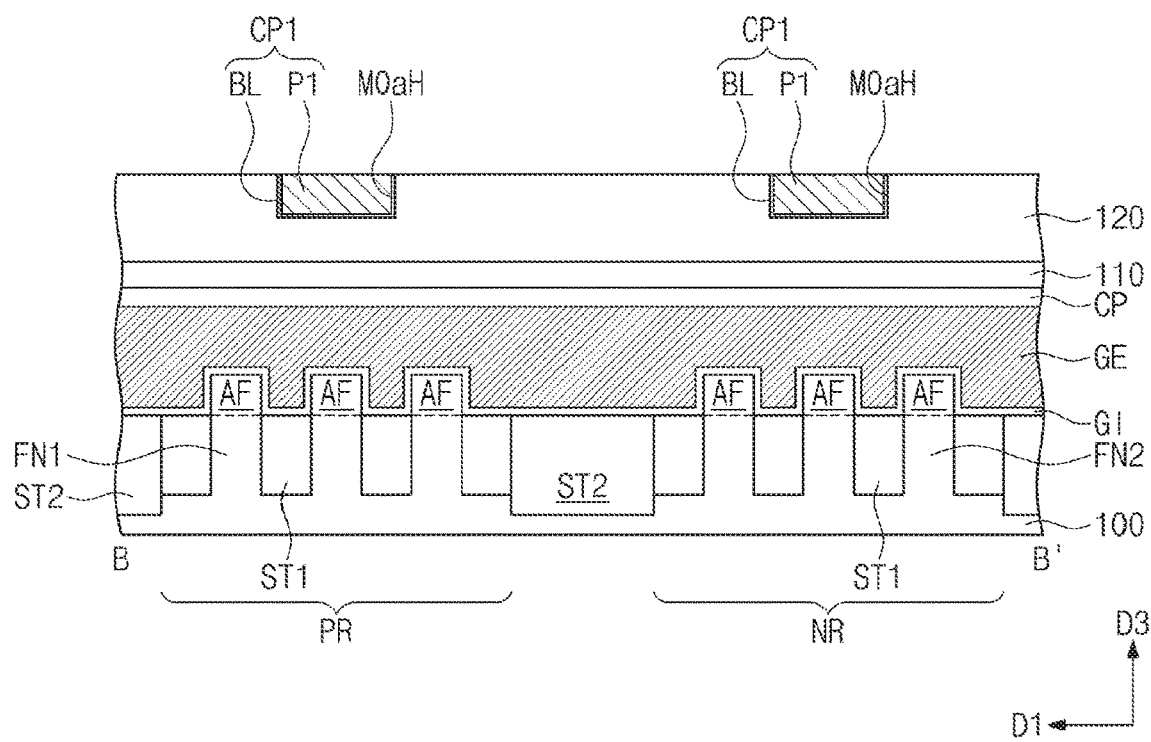
Figure 32C:
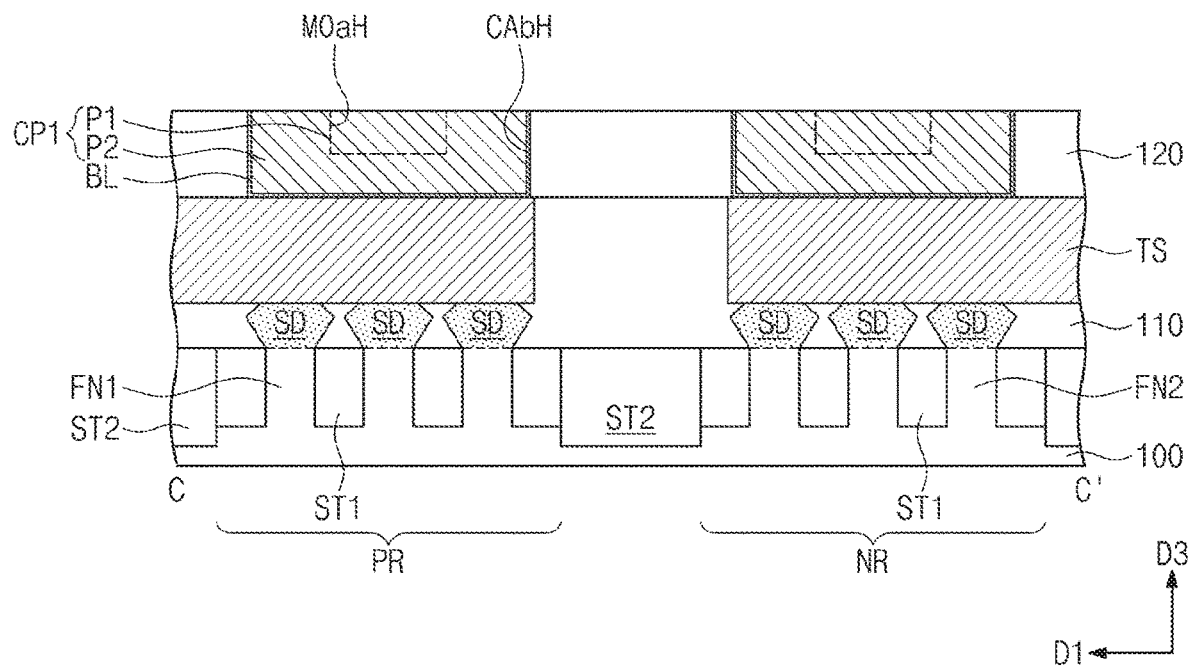
Figure 32D:
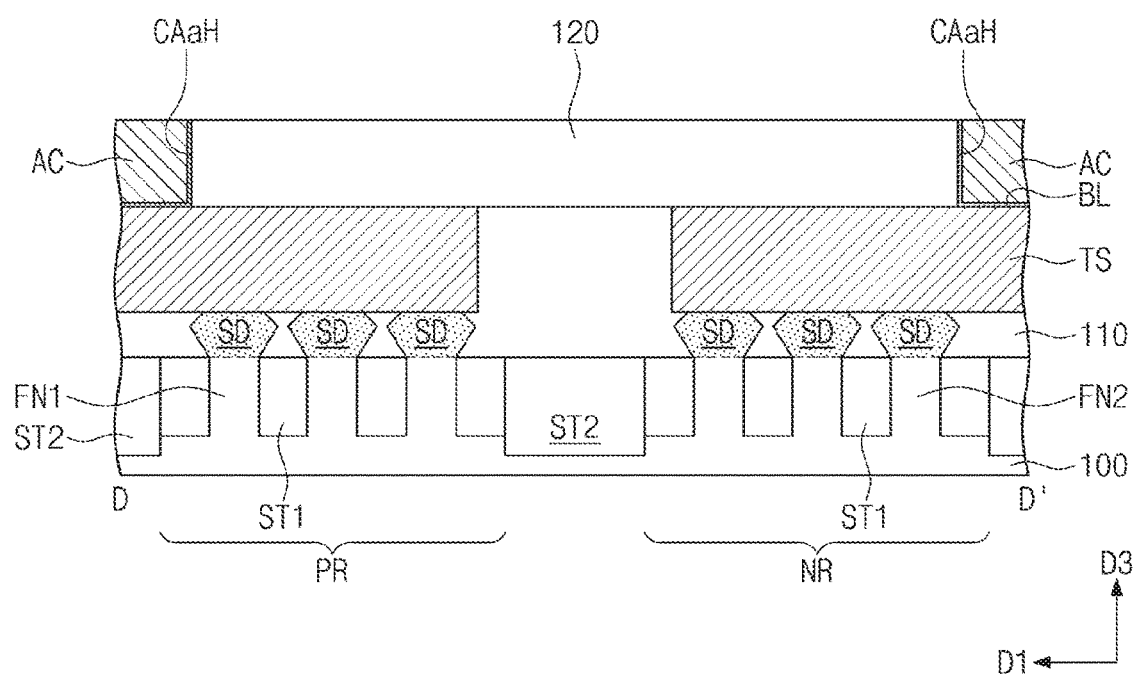
Figure 32E:
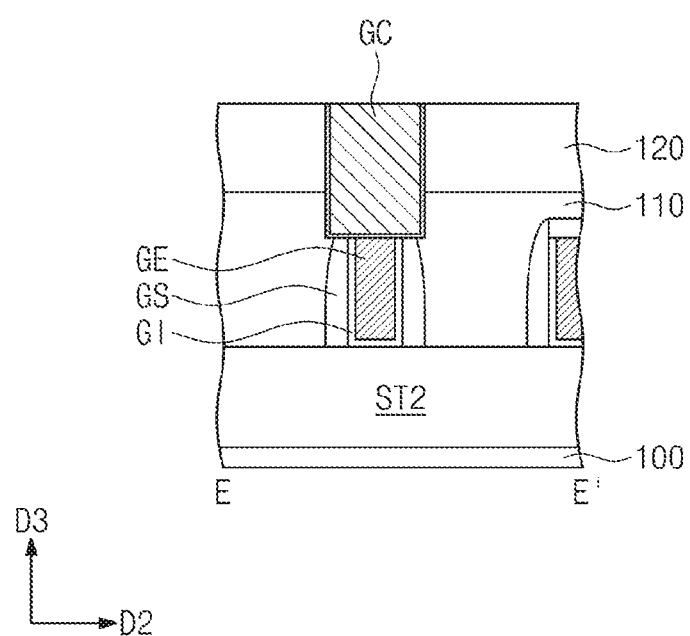

FIGS. 19, 21, 23, 25, 27, 29, and 31 are plan views illustrating a method of fabricating a semiconductor device, according to exemplary embodiments of the present inventive concept. FIGS. 20A, 22A, 24A, 26A, 28A, 30A, and 32A are sectional views taken along lines A-A' of FIGS. 19, 21, 23, 25, 27, 29, and 31, respectively, FIGS. 20B, 22B, 24B, 26B, 28B, 30B, and 32B are sectional views taken along lines B-B' of FIGS. 19, 21, 23, 25, 27, 29, and 31, respectively, FIGS. 22C, 24C, 26C, 28C, 30C, and 32C are sectional views taken along lines C-C' of FIGS. 21, 23, 25, 27, 29, and 31, respectively, FIGS. 28D, 30D, and 32D are sectional views taken along lines D-D' of FIGS. 27, 29, and 31, respectively, and FIGS. 30E and 32E are sectional views taken along lines E-E' of FIGS. 29 and 31, respectively. A method of fabricating a semiconductor device using the standard cell layout of FIG. 13 will be described below. For the sake of simplicity, the description that follows will refer to an example related to a fabrication method using the first standard cell STDC1 of FIG. 16; however, this method may be applied for other standard cells (e.g., STDC2, STDC3, and so forth).

Figure 19:
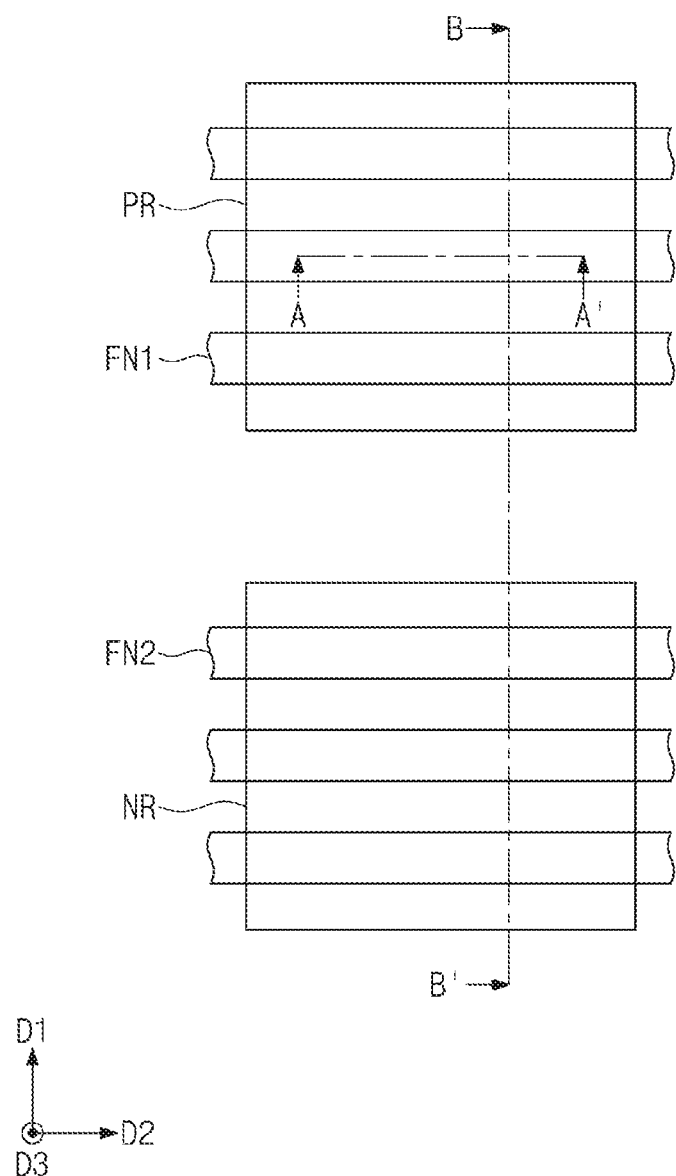
FIGS. 19, 21, 23, 25, 27, 29, and 31 are plan views illustrating a method of fabricating a semiconductor device, according to exemplary embodiments of the present inventive concept.
Figure 21:
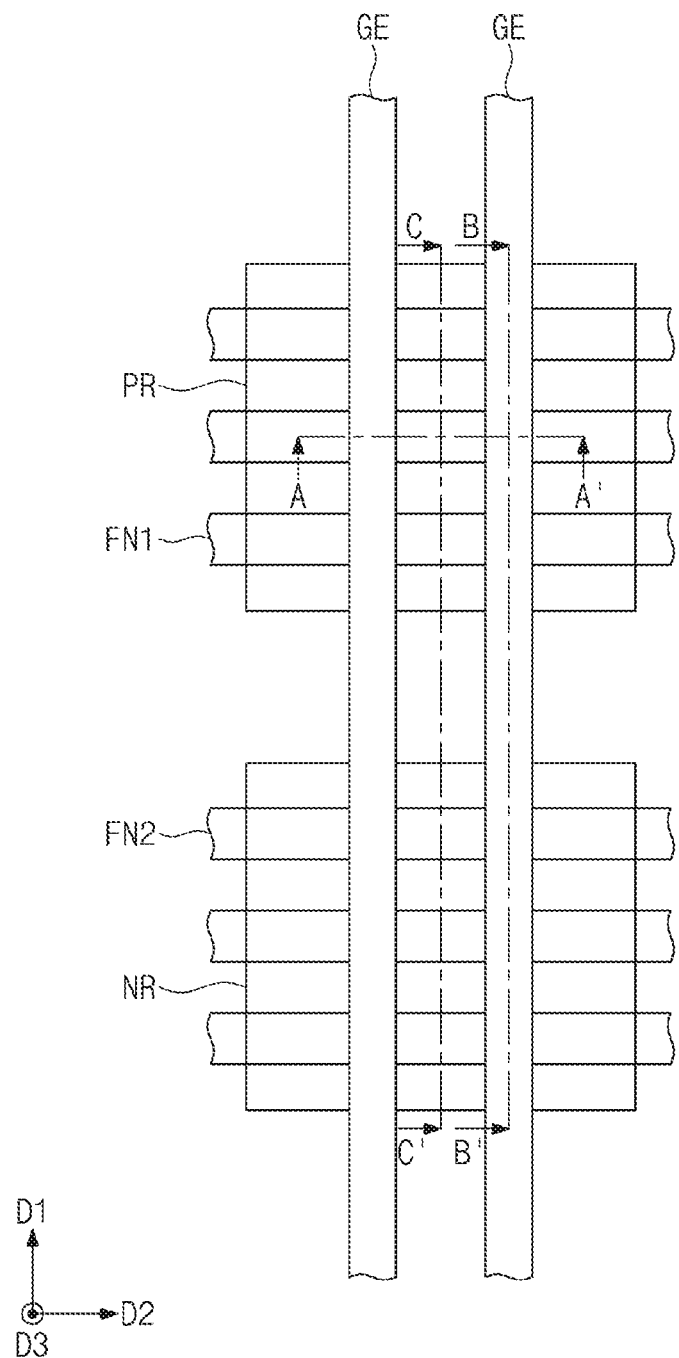
Figure 22A:
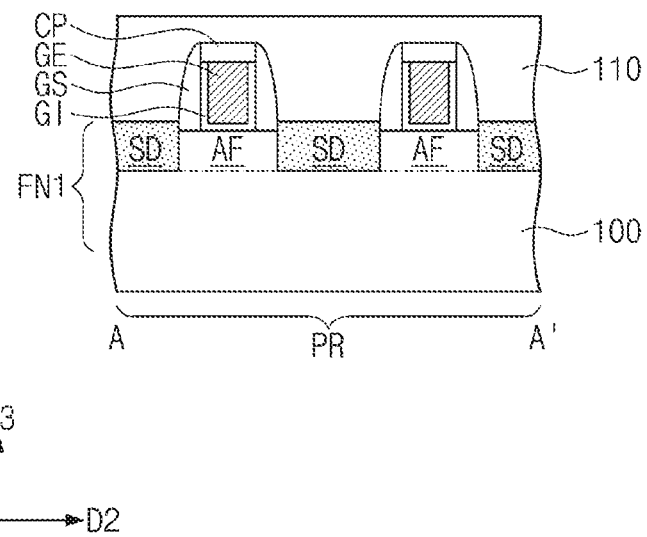
Figure 22B:
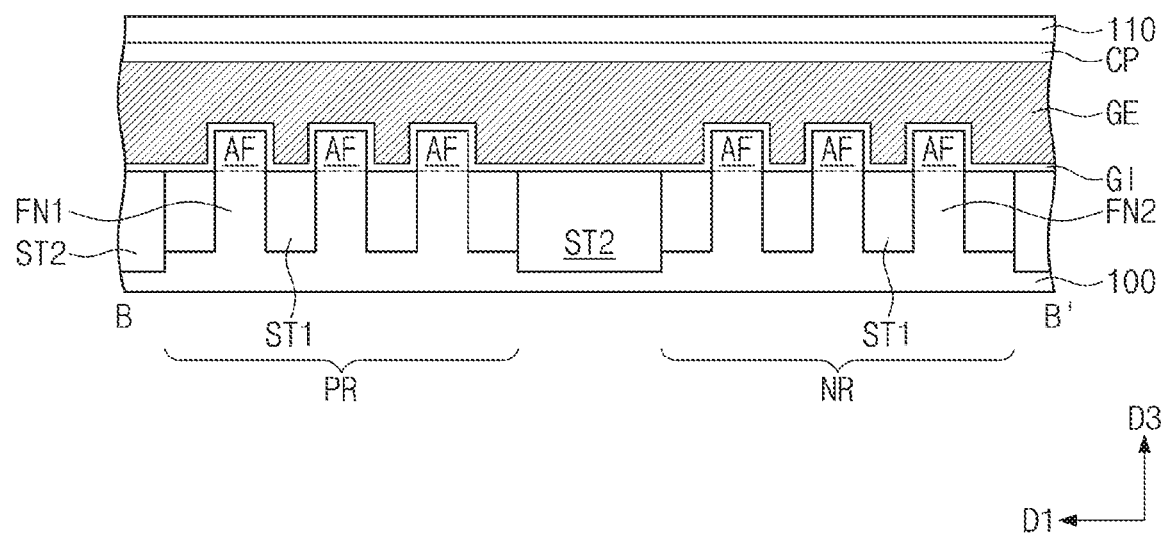
Figure 22C:
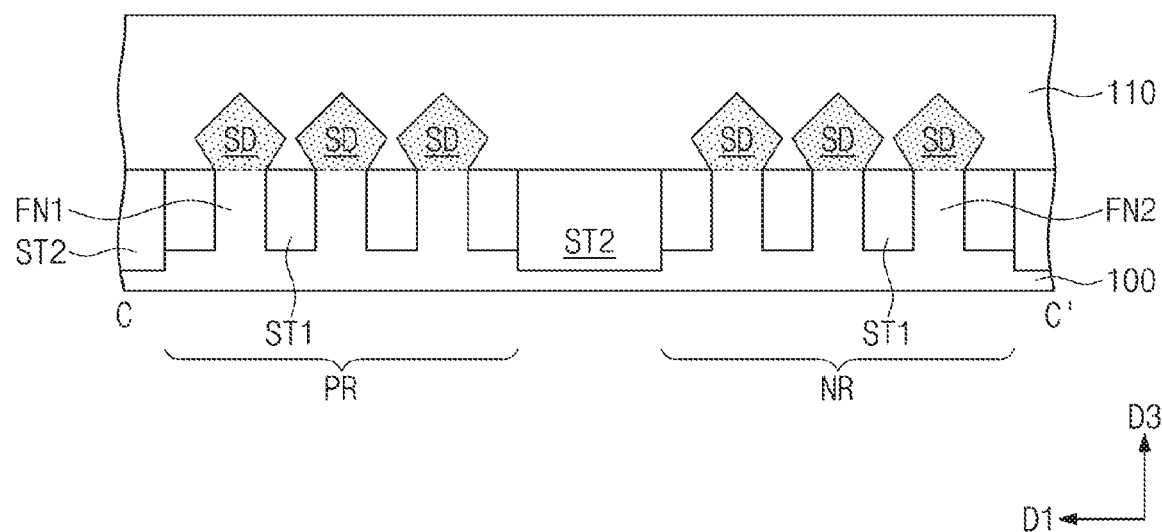
FIGS. 22C, 24C, 26C, 28C, 30C, and 32C are sectional views taken along lines C-C' of FIGS. 21, 23, 25, 27, 29, and 31, respectively, according to exemplary embodiments of the preset inventive concept.
Figure 23:
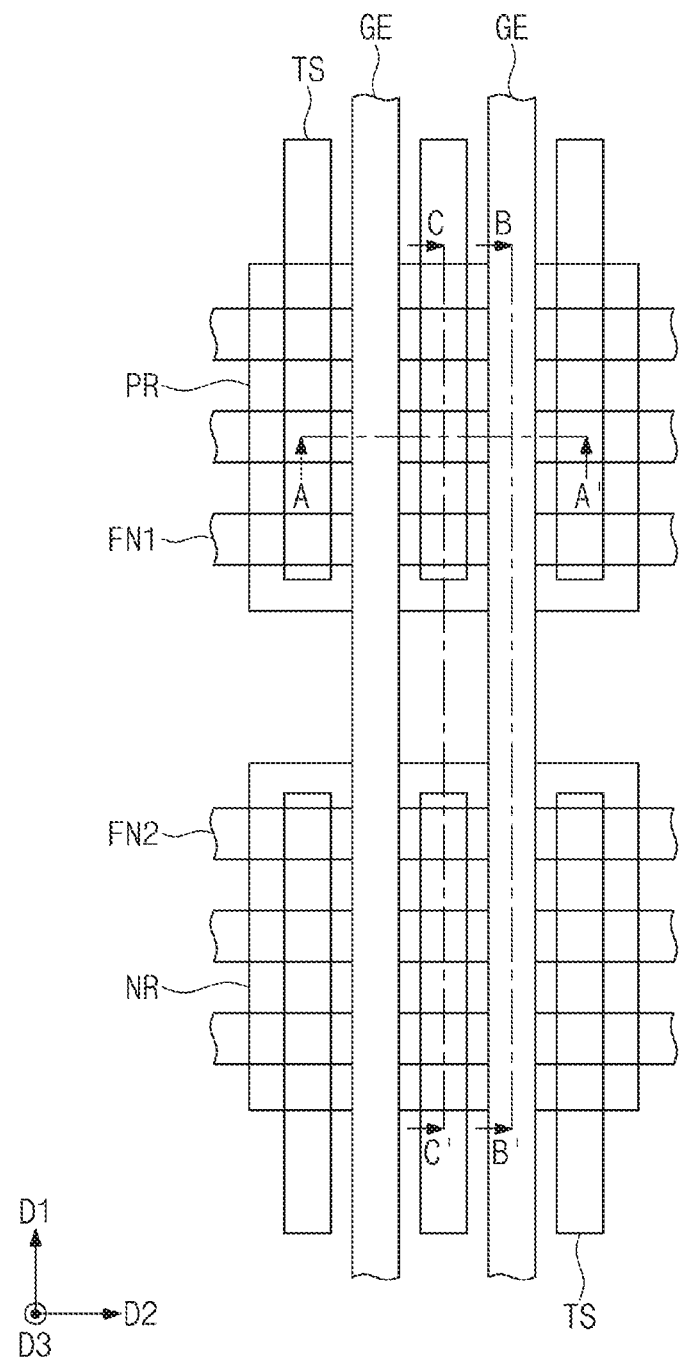
Figure 24A:
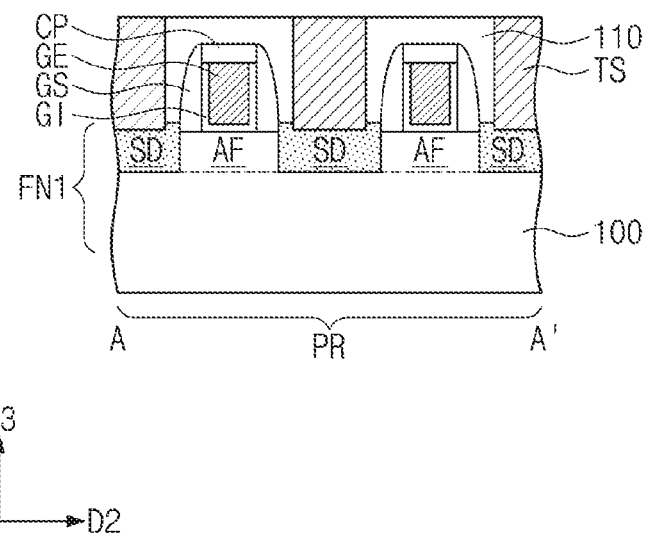
Figure 24B:
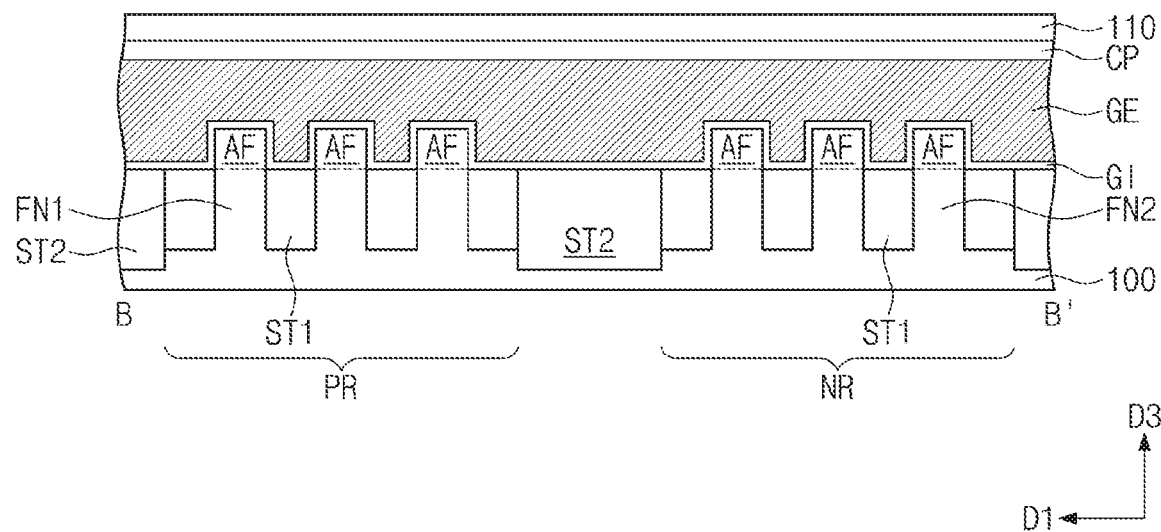
Figure 24C:
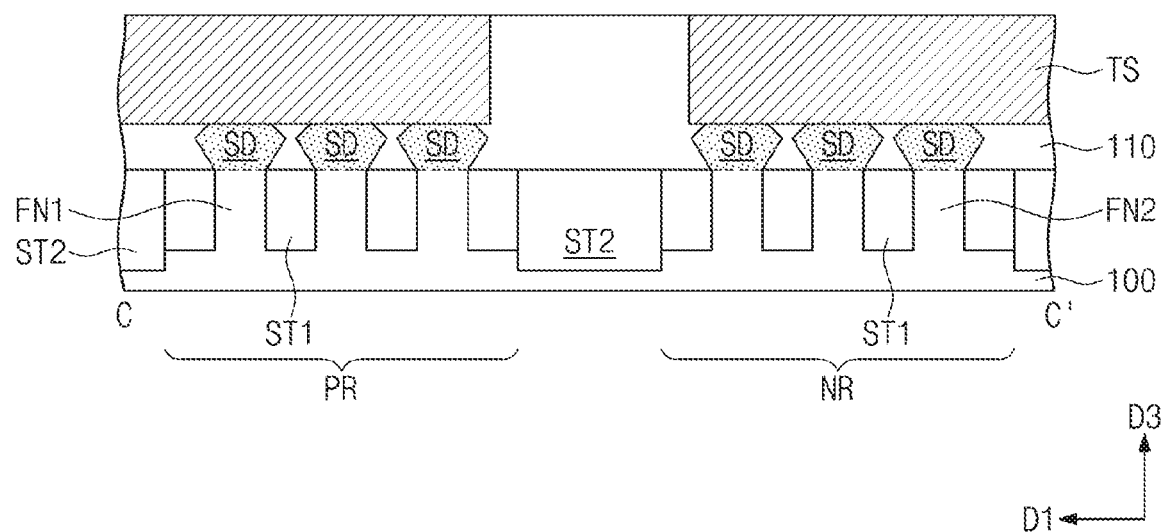
Figure 25:
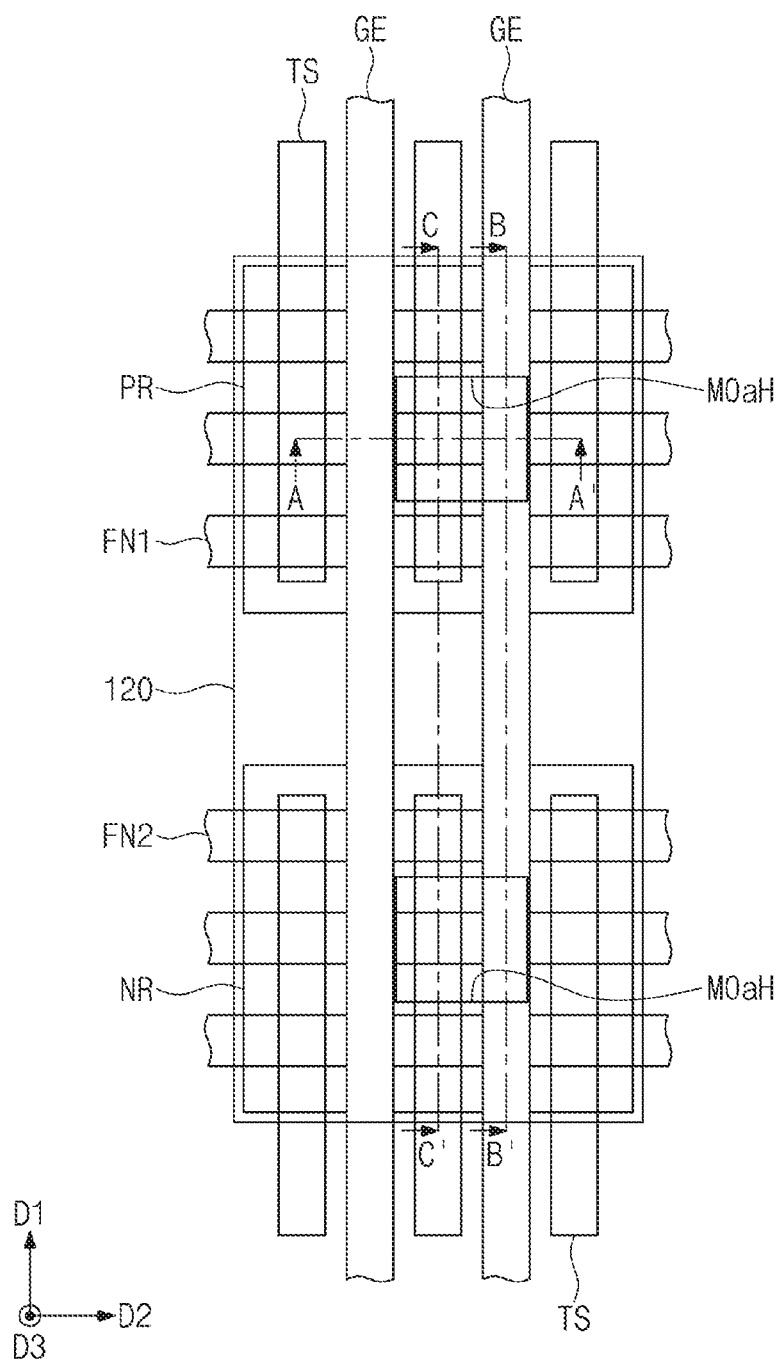
Figure 26A:
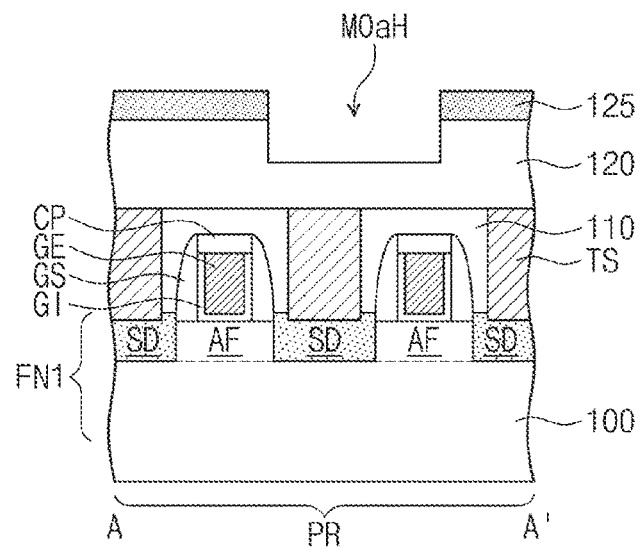
Figure 26B:
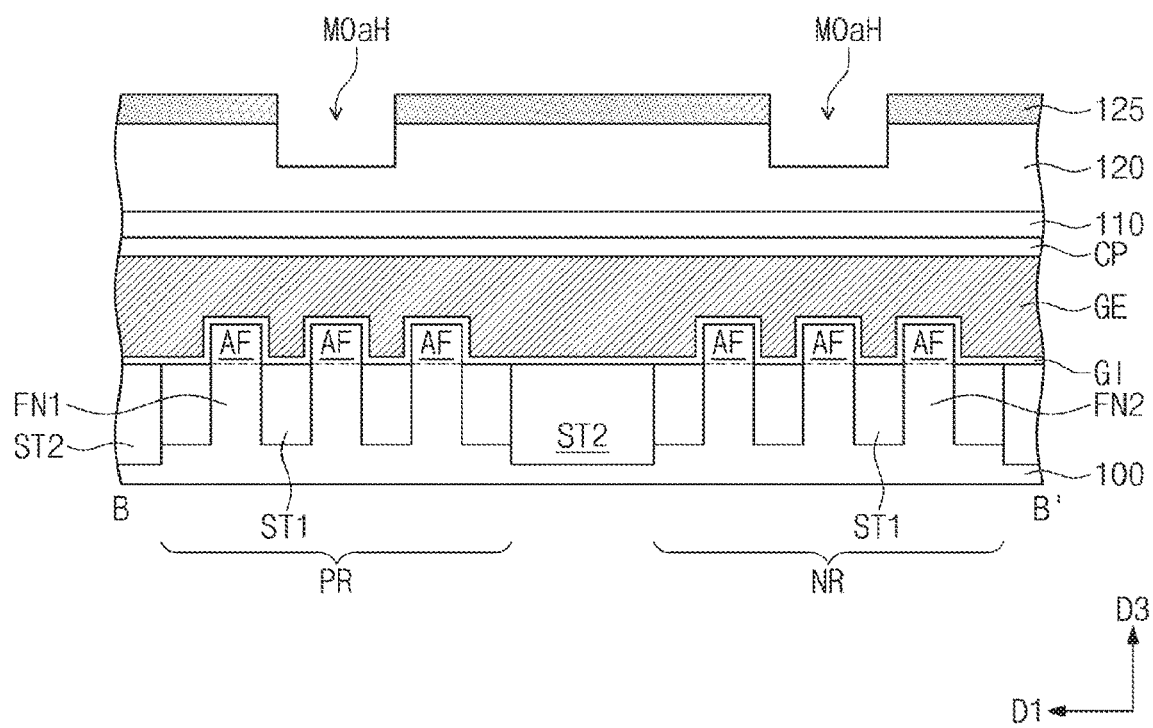
Figure 26C:
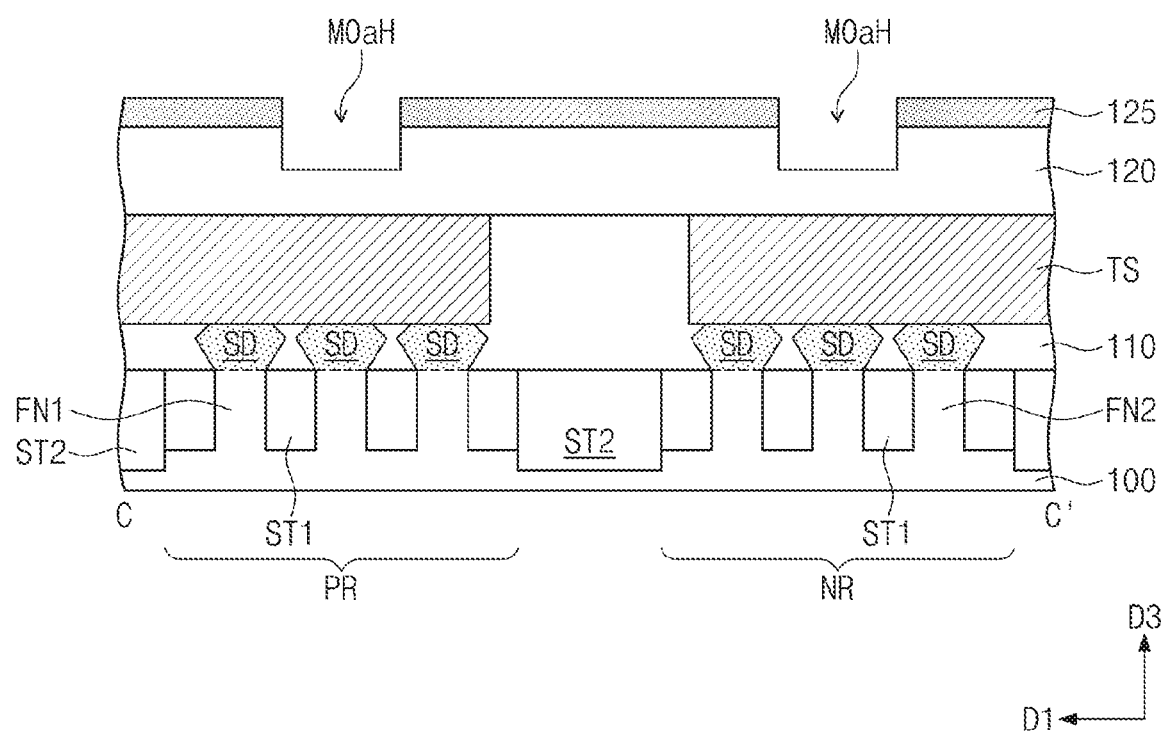
Figure 27:
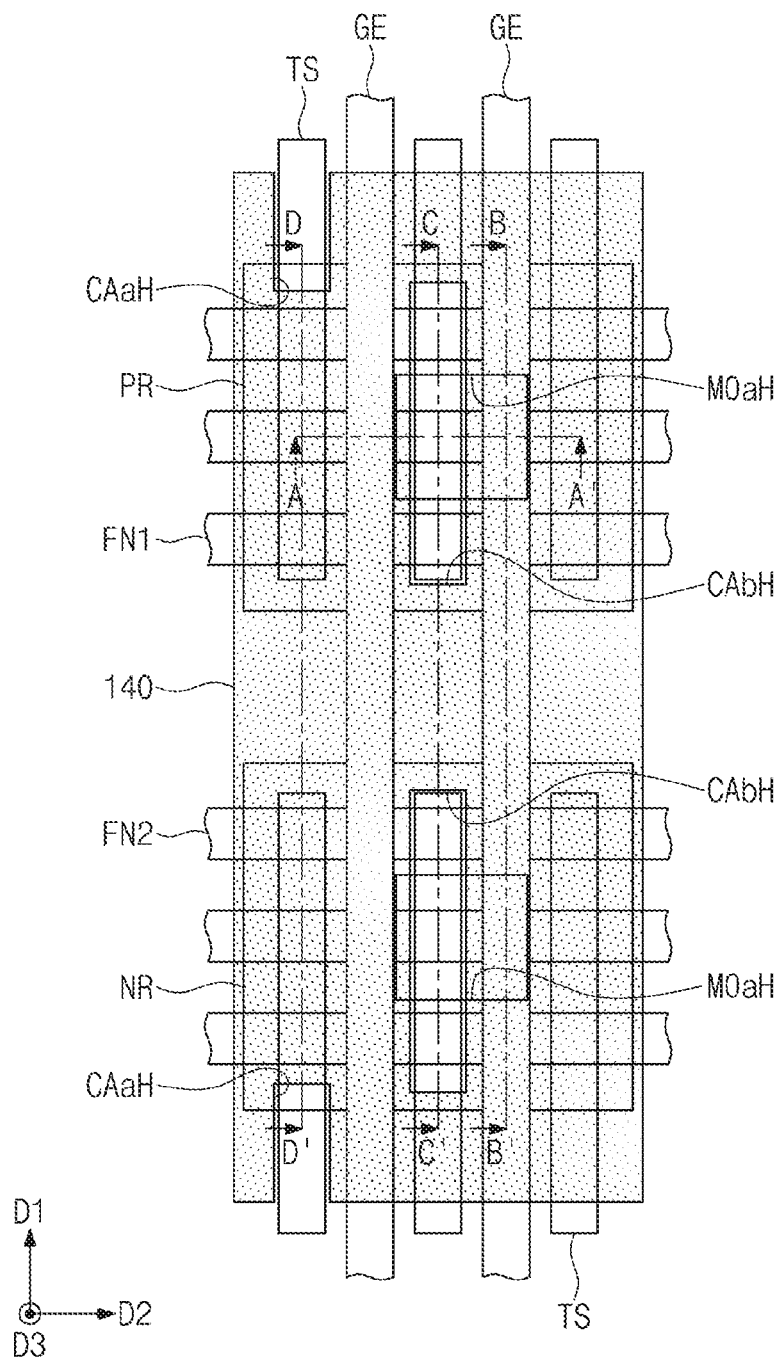

Referring to FIGS. 19, 20A, and 20B, a substrate 100 may be provided. In exemplary embodiments of the present inventive concept, the substrate 100 may be a silicon substrate, a germanium substrate, or a silicon-on-insulator (SOI) substrate. Active patterns FN may be formed in an upper portion of the substrate 100. First device isolation patterns ST1 may be formed to fill a gap between the active patterns FN. The first device isolation patterns ST1 may be recessed to expose upper portions of the active patterns FN. Second device isolation patterns ST2 may be formed on the substrate 100 to define a border between a PMOSFET region PR and an NMOSFET region NR. In exemplary embodiments of the present inventive concept, when the second device isolation patterns ST2 are formed, the active patterns FN may be removed from regions other than the PMOSFET and NMOSFET regions PR and NR. The active patterns FN on the PMOSFET region PR may be referred to as 'first active patterns FN1', and the active patterns FN on the NMOSFET region NR may be referred to as 'second active patterns FN2'.

The first and second device isolation patterns ST1 and ST2 may be formed by a shallow trench isolation (STI) process. The first and second device isolation patterns ST1 and ST2 may be formed of or include silicon oxide. The first device isolation patterns ST1 may be formed to have a depth less than that of the second device isolation patterns ST2. In this case, the first device isolation patterns ST1 and the second device isolation patterns ST2 may be formed by different processes. In exemplary embodiments of the present inventive concept, the first device isolation patterns ST1 may be formed to have substantially the same depth as that of the second device isolation patterns ST2. For example, the first device isolation patterns ST1 and the second device isolation patterns ST2 may be formed at substantially the same time by the same process.

Referring to FIGS. 21 and 22A to 22C, gate electrodes GE may be formed to cross the first and second active patterns FN1 and FN2 and to extend in a first direction D1. The gate electrodes GE may be spaced apart from each other in a second direction D2. A gate insulating pattern GI may be formed below each of the gate electrodes GE, and gate spacers GS may be formed on both side surfaces of each of the gate electrodes GE. In addition, a capping pattern CP may be formed to cover a top surface of each of the gate electrodes GE.

For example, the formation of the gate electrodes GE may include forming sacrificial patterns to cross the first and second active patterns FN1 and FN2, forming gate spacers GS at both sides of the sacrificial patterns, and replacing the sacrificial patterns with the gate electrodes GE.

The gate electrodes GE may be formed of or include doped semiconductor materials, conductive metal nitrides, or metals. The gate insulating pattern GI may be formed of or include a silicon oxide layer, a silicon oxynitride layer, or high-k dielectric materials, whose dielectric constants are lower than that of silicon oxide. Each of the capping pattern CP and the gate spacers GS may be formed of or include a silicon oxide layer, a silicon nitride layer, or a silicon oxynitride layer.

Source/drain regions SD may be formed on or in the upper portions of the first and second active patterns FN1 and FN2. The source/drain regions SD on the PMOSFET region PR may be doped with p-type impurities, while the source/drain regions SD on the NMOSFET region NR may be doped with n-type impurities.

In exemplary embodiments of the present inventive concept, the source/drain regions SD may be epitaxial patterns, which are formed using a selective epitaxial growth process. For example, the formation of the source/drain regions SD may include partially recessing the first and second active patterns FN1 and FN2 at both sides of each of the gate electrodes GE and performing the epitaxial growth process to form the source/drain regions SD in the recessed regions of the first and second active patterns FN1 and FN2. The epitaxial growth process may be performed using a semiconductor material different from that of the substrate 100. As an example, the source/drain regions SD may be formed of or include a semiconductor material having a lattice constant different from (for example, greater or smaller than) the substrate 100. Since the source/drain regions SD are formed of a semiconductor material different from that of the substrate 100, the source/drain regions SD may exert a compressive stress or a tensile stress on the channel regions AF therebetween.

Next, a first interlayer insulating layer 110 may be formed to cover the source/drain regions SD and the gate electrodes GE. The first interlayer insulating layer 110 may be formed of or include a silicon oxide layer or a silicon oxynitride layer.

Referring to FIGS. 23 and 24A to 24C, lower conductive structures TS may be formed on the source/drain regions SD of the PMOSFET and NMOSFET regions PR and NR. Each of the lower conductive structures TS may include at least a portion extending in the first direction D1 or may have a line- or bar-shaped structure. In addition, a portion of each of the lower conductive structures TS may be positioned on the second device isolation pattern ST2, which is adjacent to the PMOSFET region PR or the NMOSFET region NR. The lower conductive structures TS may be formed to have top surfaces that are substantially coplanar with that of the first interlayer insulating layer 110.

For example, the formation of the lower conductive structures TS may include patterning the first interlayer insulating layer 110 to form holes exposing the source/drain regions SD and filling the holes with a conductive material. Upper portions of the source/drain regions SD may be etched or removed during the formation of the holes. The lower conductive structures TS may be formed of or include doped semiconductor materials, conductive metal nitrides, metals, or metal silicides.

Referring to FIGS. 25 and 26A to 26C, a second interlayer insulating layer 120 may be formed on the first interlayer insulating layer 110. The second interlayer insulating layer 120 may be formed of a silicon oxide layer or a silicon oxynitride layer.

A first photoresist pattern 125 may be formed on the second interlayer insulating layer 120. The first photoresist pattern 125 may include openings, which are formed in accordance with the first connection patterns M0$a$ of FIG. 13. For example, the formation of the first photoresist pattern 125 may include forming a first photoresist layer on the second interlayer insulating layer 120 and then performing an exposure and development process on the first photoresist layer using a first photomask manufactured based on the first connection patterns M0$a$ of FIG. 13 (e.g., see steps S140 and S150 of FIG. 2).

The second interlayer insulating layer 120 may be patterned using the first photoresist pattern 125 as an etch mask to form connection holes M0$a$H. The connection holes M0$a$H may be formed to partially (e.g., not completely) penetrate the second interlayer insulating layer 120. In other words, bottoms of the connection holes M0$a$H may be higher than top surfaces of the lower conductive structures TS and the gate electrodes GE. Accordingly, the connection holes M0$a$H may not expose the top surfaces of the lower conductive structures TS and the gate electrodes GE.

Referring to FIGS. 27 and 28A to 28D, the first photoresist pattern 125 may be selectively removed. Thereafter, a first mask layer 140 may be formed on the second interlayer insulating layer 120. The first mask layer 140 may be formed to wholly fill the connection holes M0$a$H.

A second photoresist pattern 145 may be formed on the first mask layer 140. The second photoresist pattern 145 may include openings formed in accordance with the first active contact patterns CAa and the second active contact patterns CAb of FIG. 13. For example, the formation of the second photoresist pattern 145 may include forming a second photoresist layer on the first mask layer 140 and then performing an exposure and development process on the second photoresist layer using a second photomask manufactured based on the first and second active contact patterns CAa and CAb of FIG. 13.

The first mask layer 140 and the second interlayer insulating layer 120 may be sequentially patterned using the second photoresist pattern 145 as an etch mask to form first active holes CAaH and second active holes CAbH. The first active holes CAaH may be hole patterns that are respectively formed in accordance with the first active contact patterns CAa of FIG. 13, and the second active holes CAbH may be hole patterns that are respectively formed in accordance with the second active contact patterns CAb of FIG. 13.

The first and second active holes CAaH and CAbH may be formed to completely penetrate the second interlayered insulating layer 120. In other words, the first and second active holes CAaH and CAbH may be formed to expose the top surfaces of the lower conductive structures TS. When viewed in a plan view, each of the second active holes CAbH may be partially overlapped with a corresponding one of the connection holes M0$a$H. Each of the second active holes CAbH, in conjunction with each of the connection holes M0$a$H, may be formed to constitute a single connection hole.

Referring back to FIG. 18A, if there is a misalignment in a process of forming the second active hole CAbH, a vertically-extended hole may be formed on a region that is overlapped with both of the second active hole CAbH and the connection hole M0$a$H. In a subsequent step, the vertically-extended hole may be used to form a first vertically-extended portion VP1, as shown in FIG. 18A. As a result of the process for forming the connection holes M0$a$H, a portion of the second interlayer insulating layer 120 may be thinner than other portions, and thus, the vertically-extended hole may be formed by the process for forming the second active hole CAbH.

As another example, if, as shown in FIG. 18B, the second active hole CAbH is formed to be wider than the lower conductive structure TS in the second direction D2, the vertically-extended hole may be formed on a region that is overlapped with both of the second active hole CAbH and the connection hole M0$a$H. In a subsequent step, the vertically-extended hole may be used to form a first vertically-extended portion VP1, as shown in FIG. 18B.

Referring to FIGS. 29 and 30A to 30E, the second photoresist pattern 145 may be selectively removed. Next, a second mask layer 150 may be formed on the first mask layer 140. The second mask layer 150 may be formed to fill the whole regions of the first and second active holes CAaH and CAbH.

A third photoresist pattern 155 may be formed on the second mask layer 150. The third photoresist pattern 155 may include an opening formed in accordance with the first gate contact pattern CBa of FIG. 13. For example, the formation of the third photoresist pattern 155 may include forming a third photoresist layer on the second mask layer 150 and then performing an exposure and development process on the third photoresist layer using a third photomask manufactured based on the first gate contact pattern CBa of FIG. 13.

A gate hole CBaH may be formed by sequentially patterning the second mask layer 150, the first mask layer 140, and the second interlayer insulating layer 120 using the third photoresist pattern 155 as an etch mask.

The gate hole CBaH may be formed to completely penetrate the second interlayer insulating layer 120. In addition, the gate hole CBaH may be formed to penetrate an upper portion of the first interlayer insulating layer 110. In other words, the gate hole CBaH may be formed to expose the top surface of the gate electrode GE.

In exemplary embodiments of the present inventive concept, referring back to FIG. 18C, if there is a misalignment in a process of forming the gate hole CBaH or if the gate hole CBaH is formed to have an increased width in the second direction D2, a vertically-extended hole may be formed on a region that is overlapped with both of the gate hole CBaH and the connection hole M0$a$H. In a subsequent step, the vertically-extended hole may be used to form a second vertically-extended portion VP2, as shown in FIG. 18C.

Referring to FIGS. 31 and 32A to 32E, the third photoresist pattern 155, the second mask layer 150, and the first mask layer 140 may be removed. Next, conductive structures AC, GC, and CP1 may be formed by filling the connection holes M0aH, the first and second active holes CAaH and CAbH, and the gate hole CBaH with a conductive material.

For example, active contacts AC may be formed in the first active holes CAaH. A gate contact GC may be formed in the gate hole CBaH. First conductive structures CP1 may be formed in the connection holes M0aH and the second active holes CAbH, respectively. For example, the first conductive structure CP1 may be formed by filling the connection hole, which is formed by the connection hole M0aH and the second active hole CAbH, with the conductive material. In exemplary embodiments of the present inventive concept, the active contacts AC, the gate contact GC, and the first conductive structures CP1 may be formed at substantially the same time using the same process.

Barrier patterns BL may be respectively formed between the second interlayer insulating layer 120 and the active contacts AC, between the second interlayer insulating layer 120 and the gate contact GC, and between the second interlayer insulating layer 120 and the first conductive structures CP1.

For example, the formation of the conductive structures AC, GC, and CP1 and the barrier patterns BL may include conformally forming a barrier layer to cover the connection holes M0aH, the first and second active holes CAaH and CAbH, and the gate hole CBaH, forming a conductive layer to completely fill the connection holes M0aH, the first and second active holes CAaH and CAbH, and the gate hole CBaH, and performing a planarization process on the conductive layer and the barrier layer to expose the second interlayer insulating layer 120. The conductive layer may include conductive metal nitrides or metals, and the barrier layer may include metal nitrides capable of preventing diffusion of metallic elements.

Referring back to FIGS. 16 and 17A to 17E, a third interlayer insulating layer 130 may be formed on the second interlayer insulating layer 120. The third interlayer insulating layer 130 may be formed of or include a silicon oxide layer or a silicon oxynitride layer. First and second power interconnection lines PL1 and PL2 and first and second interconnection lines ML1 and ML2 may be formed in the third interlayer insulating layer 130. The first and second power interconnection lines PL1 and PL2 and the first and second interconnection lines ML1 and ML2 may be formed using a method that is similar to that for forming the conductive structures AC, GC, and CP1.

Figure 33:
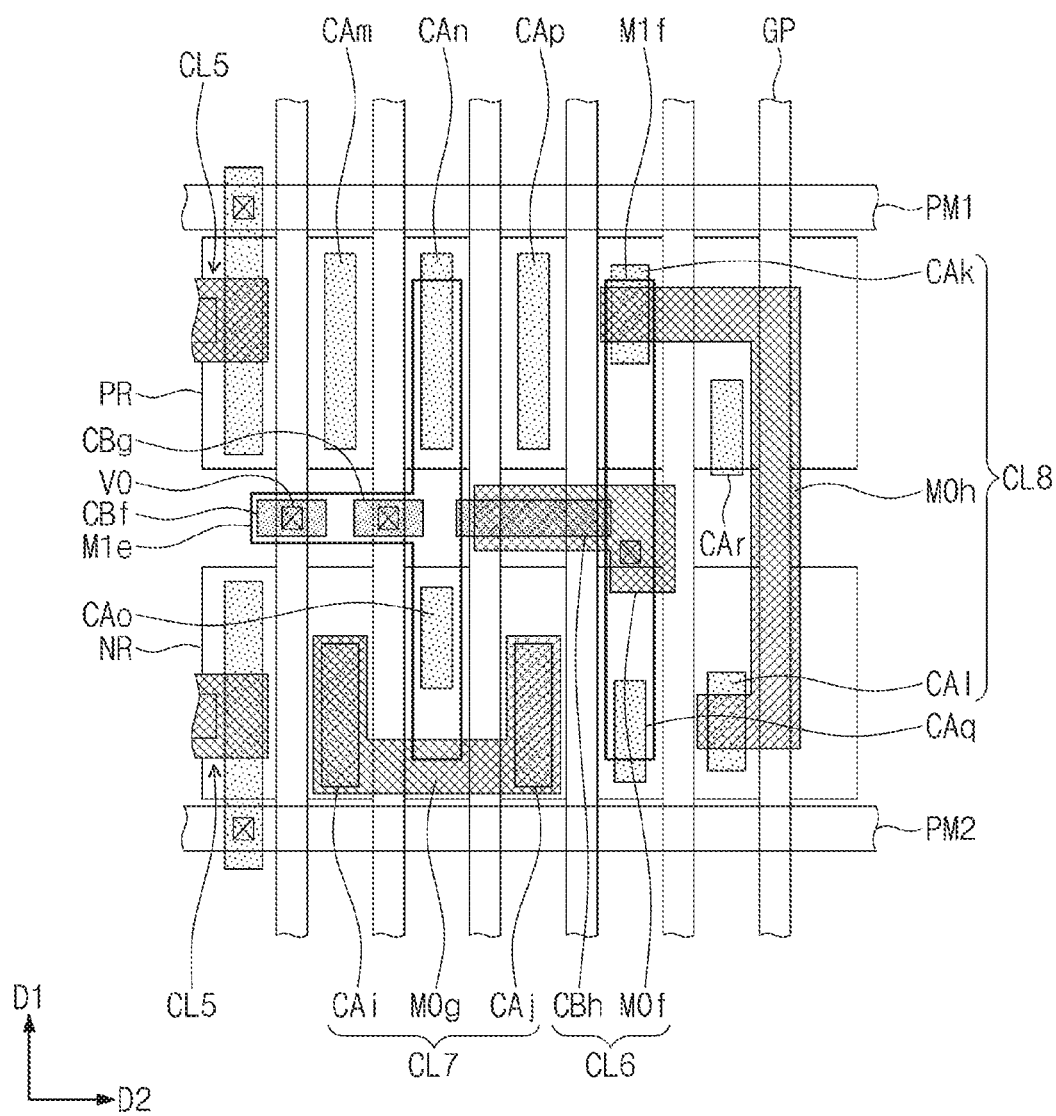
FIG. 33 is a plan view illustrating a semiconductor device that is fabricated based on standard cell layouts according to an exemplary embodiment of the present inventive concept.

FIG. 33 is a plan view illustrating a semiconductor device that is fabricated based on standard cell layouts according to an exemplary embodiment of the present inventive concept. In the present embodiment, the third standard cell layout STD3 of FIG. 13 is exemplarily illustrated, but the present inventive concept may not be limited thereto. In the following description of the present embodiment, an element previously described with reference to FIG. 13 may not be described in much further detail for the sake of brevity.

Referring to FIG. 33, the lower conductive patterns LP may not be included, unlike the previous embodiment of FIG. 13. Thirteenth to eighteenth active contact patterns CAm, CAn, CAo, CAp, CAq, and CAr may be additionally disposed in place of the lower conductive patterns. Each of the thirteenth to eighteenth active contact patterns CAm, CAn, CAo, CAp, CAq, and CAr may be overlapped with or connected to one of the PMOSFET region PR or the NMOSFET region NR.

The fifteenth active contact pattern CAo may be spaced apart from (e.g., not overlapped with) the seventh connection pattern M0g. The seventeenth active contact pattern CAq may be spaced apart from (e.g., not overlapped with) the sixth connection pattern M0f. The eighteenth active contact pattern CAr may be spaced apart from (e.g., not overlapped with) the eighth connection pattern M0h.

Figure 34:
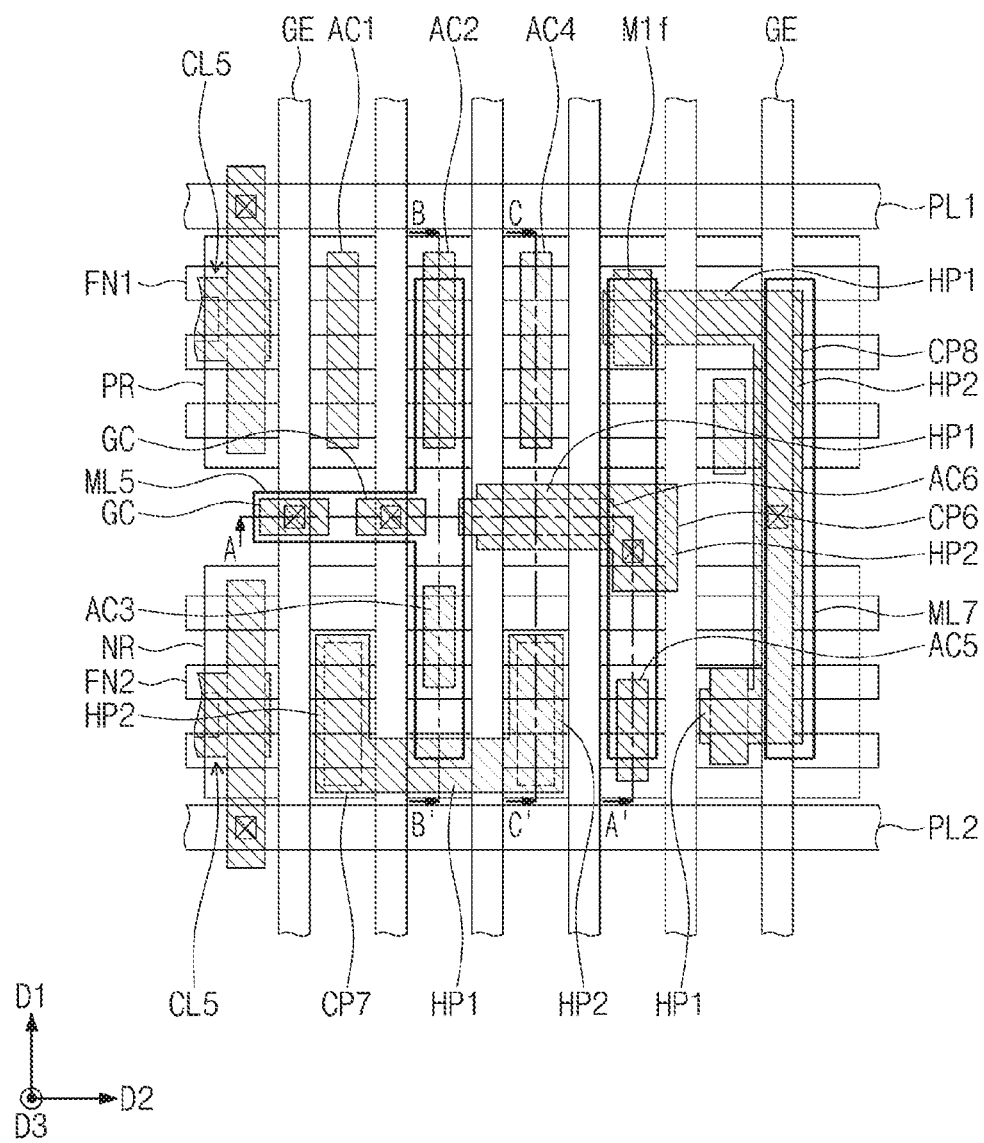
FIG. 34 is a plan view illustrating a semiconductor device according to exemplary embodiments of the present inventive concept.
Figure 35A:
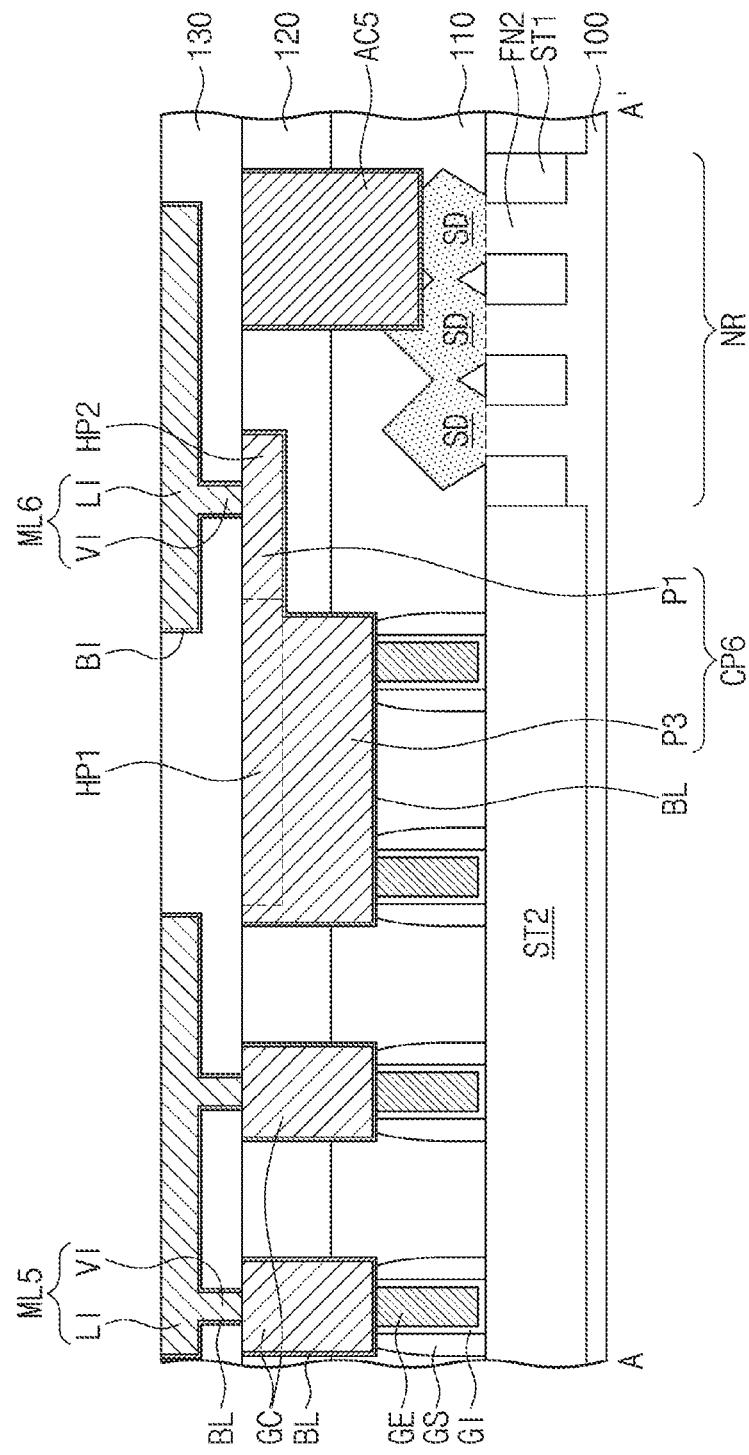
FIGS. 35A through 35C are sectional views taken along lines A-A', B-B', and C-C' of FIG. 34, respectively, according to exemplary embodiments of the preset inventive concept.
Figure 35B:
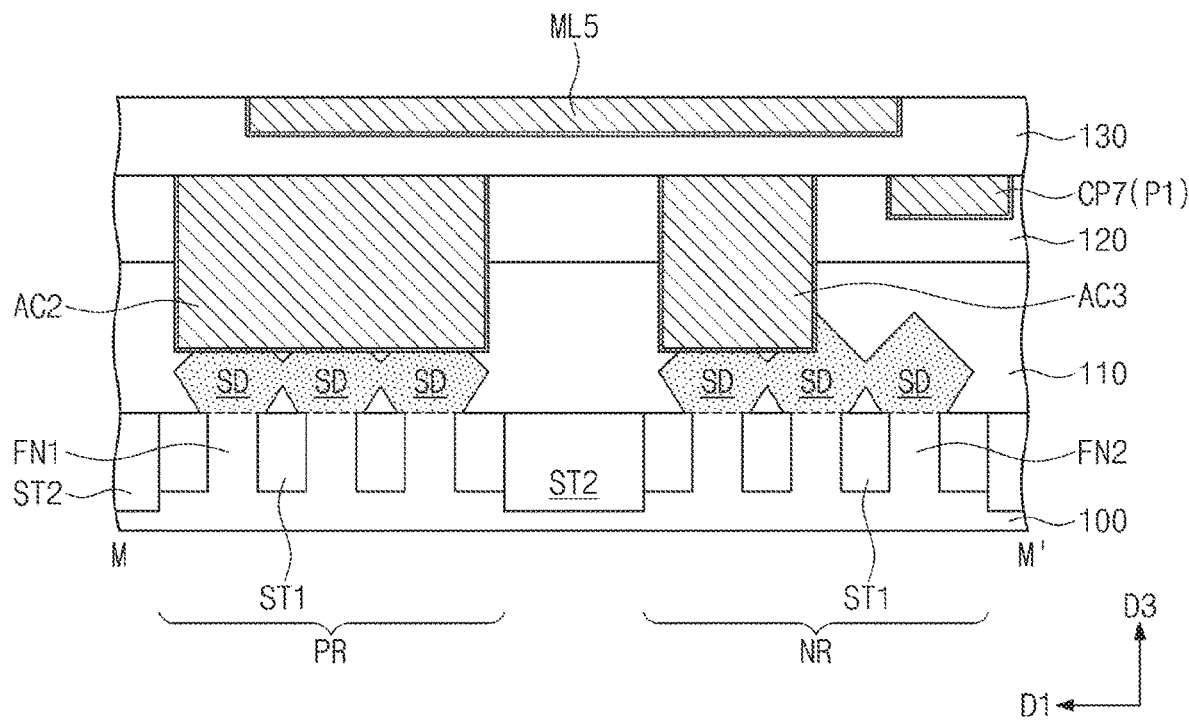
Figure 35C:
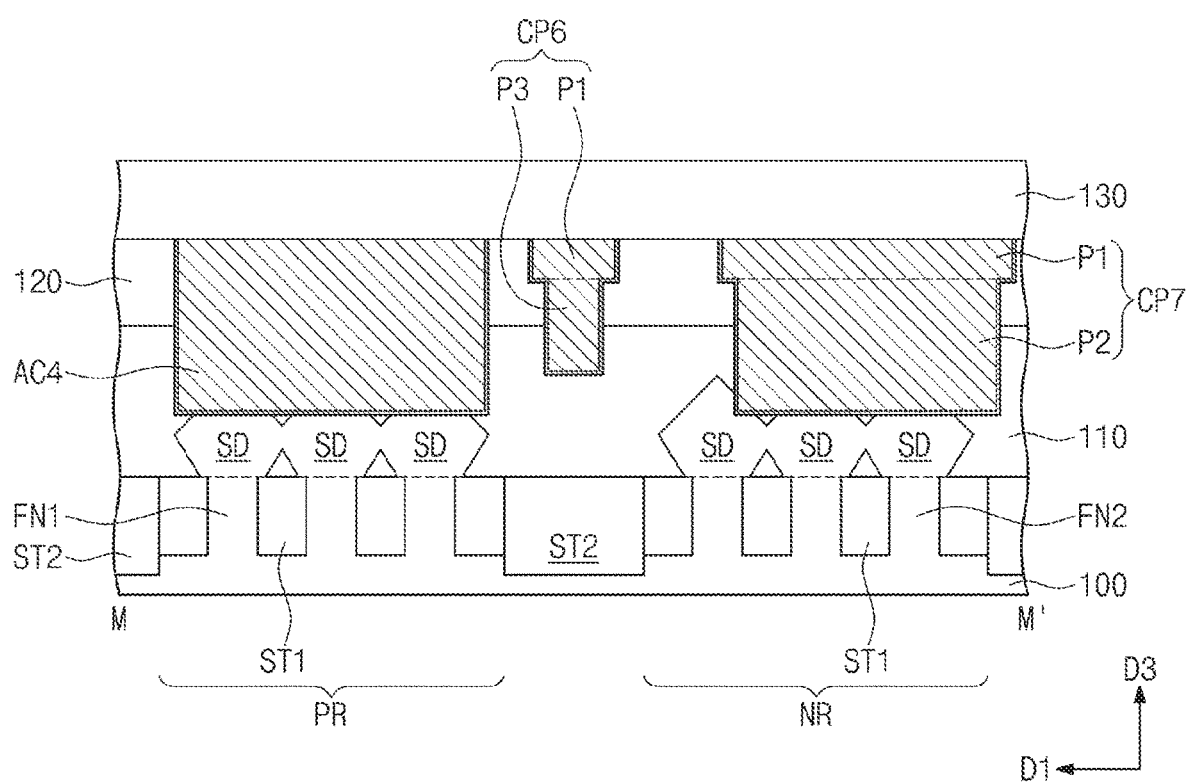

FIG. 34 is a plan view illustrating a semiconductor device according to exemplary embodiments of the present inventive concept. FIGS. 35A through 35C are sectional views taken along lines A-A', B-B', and C-C', respectively, of FIG. 34. For example, FIG. 34 and FIGS. 35A through 35C show an example of a semiconductor device to be fabricated based on the standard cell layouts of FIG. 33. In the following description of the present embodiment, an element previously described with reference to FIGS. 16 and 17A to 17R may not be described in much further detail for the sake of brevity.

Referring to FIGS. 34 and 35A to 35C, the lower conductive structures TS may not be included, unlike the previous embodiments of FIGS. 16 and 17A to 17R. First to sixth active contacts AC1-AC6 may be additionally disposed in place of the lower conductive structures. The first to sixth active contacts AC1-AC6 may be structures that are defined by the thirteenth to eighteenth active contact patterns CAm, CAn, CAo, CAp, CAq, and CAr, respectively, of FIG. 33.

The source/drain regions SD adjacent to each other may be merged to constitute a single body. Each of the first to sixth active contacts AC1-AC6 may be in contact with at least a portion of the merged source/drain regions SD. Since the merged source/drain regions SD are connected to constitute the single body, it is unnecessary for each of the first to sixth active contacts AC1-AC6 to completely cover the merged source/drain regions SD. In addition, the second portion P2 of each of the fifth, seventh, and eighth conductive structures CP5, CP7, and CP8 may also be in contact with the merged source/drain regions SD, similar to the previous embodiments of FIG. 4.

As an example, referring to FIG. 35B, the third active contact AC3 may be in contact with a portion of the merged source/drain regions SD. Accordingly, the first portion P1 of the seventh conductive structure CP7 may be disposed to cross the merged source/drain regions SD, without short circuiting the third active contact AC3.

The first to sixth active contacts AC1-AC6 may have bottom surfaces, which are lower than those of the gate contacts GC and that of the third portion P3 of the sixth conductive structure CP6. Bottom surfaces of the second portions P2 of the fifth, seventh and eighth conductive structures CP5, CP7, and CP8 may be lower than those of the gate contacts GC and that of the third portion P3 of the sixth conductive structure CP6.

According to exemplary embodiments of the present inventive concept, a semiconductor device may include a conductive structure that is electrically connected to impurity regions or gate electrodes. The conductive structure may include a horizontally extending portion, and thus, it is possible to freely dispose interconnection lines on the conductive structure. This makes it possible to realize a semiconductor device with reliable operation characteristics.

While the present inventive concept has been particularly shown and described with reference to exemplary embodiments thereof, it will be understood by one of ordinary skill in the art that variations in form and detail may be made thereto without departing from the spirit and scope of the present inventive concept as defined by the attached claims.

What is claimed is:

1. A semiconductor device, comprising:
a gate electrode disposed on a substrate;
a first contact disposed on the gate electrode;
a conductive structure disposed on the substrate and spaced apart from the gate electrode;
a second contact disposed on the conductive structure; and
a third contact directly disposed on the first and second contacts and connecting the first and second contacts to each other,
wherein a first portion of the first contact is disposed in a first insulating layer, and a top surface of the conductive structure is coplanar with a top surface of the first insulating layer,
wherein a second portion of the first contact is disposed in a second insulating layer, and the second and third contacts are disposed in the second insulating layer,
wherein a gap is formed between the second portion of the first contact and the second contact, the gap being filled with the second insulating layer, and the third contact extends across the gap to connect with the second portion of the first contact and the second contact.

2. The semiconductor device of claim 1, further comprising a conductor disposed on the substrate, wherein the conductive structure is disposed between the gate electrode and the conductor.

3. The semiconductor device of claim 1, further comprising:
a via disposed on the third contact; and
a metal line disposed on the via.

4. The semiconductor device of claim 3, wherein a bottom surface of the third contact is coplanar with an upper surface of each of the first and second contacts.

5. The semiconductor device of claim 1, wherein the gate electrode is a dummy gate electrode, the conductive structure is disposed on a source or drain, and each of the first, second and third contacts is conductive.

6. The semiconductor device of claim 1, wherein the first to third contacts are disposed between a first cell and a second cell.

7. The semiconductor device of claim 6, wherein the first cell or the second cell is a static random access memory (SRAM) cell.

8. The semiconductor device of claim 1, wherein the first contact is disposed on an upper surface and a side surface of the gate electrode.

9. The semiconductor device of claim 1, wherein the second contact is disposed on the top surface and a side surface of the conductive structure.

10. The semiconductor device of claim 1, wherein the top surface of the conductive structure is disposed above an upper surface of the gate electrode.

11. A semiconductor device, comprising:
a gate electrode disposed on a substrate;
a first contact disposed on the gate electrode;
a conductive structure disposed on the substrate and spaced apart from the gate electrode, wherein the gate electrode, the conductive structure and a first portion of the first contact are disposed in a first insulating layer;
a second contact disposed on the conductive structure;
a third contact directly disposed on the first and second contacts and connecting the first and second contacts to each other, wherein the second contact, the third contact and a second portion of the first contact are disposed in a second insulating layer; and
a third insulating layer disposed on the second insulating layer,
wherein a gap is formed between the second portion of the first contact and the second contact, the gap being filled with the second insulating layer.

12. The semiconductor device of claim 11, wherein a bottom surface of the second contact is disposed on an upper surface of the conductive structure.

13. A semiconductor device, comprising:
a gate electrode disposed on a substrate, a longitudinal direction of the gate electrode being parallel to a first direction;
a first contact disposed on the gate electrode;
a lower conductive structure disposed on the substrate and spaced apart from the gate electrode;
a second contact disposed on the lower conductive structure, the second contact being spaced apart from the first contact in a second direction intersecting the first direction in a first insulating layer;
a third contact directly disposed on the first and second contacts and extending in the second direction, thereby connecting the first and second contacts to each other, the first, second and third contacts constituting an upper conductive structure, and the first, second and third contacts are disposed in the first insulating layer; and
a barrier pattern covering a bottom surface and side surfaces of the upper conductive structure, except a top surface of the upper conductive structure,
wherein a width of the third contact in the first direction is greater than a width of the first contact in the first direction.

14. The semiconductor device of claim 13, further comprising a conductor disposed on the substrate, wherein the conductive structure is disposed between the gate electrode and the conductor.

15. The semiconductor device of claim 13, further comprising:
a via disposed on the third contact; and
a metal line disposed on the via.

* * * * *